(12) United States Patent
Kimura et al.

(10) Patent No.: US 11,027,643 B2
(45) Date of Patent: *Jun. 8, 2021

(54) MOBILE UNIT AND SYSTEM FOR MOBILE UNIT

(71) Applicant: Semiconductor Energy Laboratory Co., Ltd., Atsugi (JP)

(72) Inventors: Hajime Kimura, Atsugi (JP); Kentaro Hayashi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/816,885

(22) Filed: Mar. 12, 2020

(65) Prior Publication Data

US 2020/0215964 A1 Jul. 9, 2020

Related U.S. Application Data

(63) Continuation of application No. 16/081,238, filed as application No. PCT/IB2017/051702 on Mar. 24, 2017, now Pat. No. 10,589,660.

(30) Foreign Application Priority Data

Apr. 1, 2016 (JP) ................................. 2016-073895

(51) Int. Cl.
*B60Q 1/08* (2006.01)
*H01L 27/146* (2006.01)
(Continued)

(52) U.S. Cl.
CPC ............... *B60Q 1/085* (2013.01); *B60J 3/04* (2013.01); *B60Q 1/076* (2013.01); *G06F 3/013* (2013.01);
(Continued)

(58) Field of Classification Search
CPC .. B60Q 1/085; B60Q 1/076; B60Q 2300/056; G06K 9/00825; G06K 9/00986;
(Continued)

(56) References Cited

U.S. PATENT DOCUMENTS 5,305,012 A ‡ 4/1994 Faris ....................... A61F 9/023
345/7
7,134,707 B2 ‡ 11/2006 Isaac .......................... B60J 3/04
296/97.6

(Continued)

FOREIGN PATENT DOCUMENTS

EP 1683668 A ‡ 7/2006
JP 2000-108660 A ‡ 4/2000
(Continued)

OTHER PUBLICATIONS

Written Opinion (Application No. PCT/IB2017/051702) dated Jun. 27, 2017.‡

(Continued)

*Primary Examiner* — Joseph L Williams
*Assistant Examiner* — Jose M Diaz
(74) *Attorney, Agent, or Firm* — Robinson Intellectual Property Law Office; Eric J. Robinson

(57) ABSTRACT

A mobile unit and a system for a mobile unit which can judge whether an oncoming car is emitting a high beam are provided. A mobile unit and a system for a mobile unit which include a first and a second sensors, a memory circuit, an arithmetic circuit, and a window portion. The first sensor is configured to sense the position of the eyes of a driver who is riding in the mobile unit. The second sensor is configured to sense whether an oncoming car is existing, whether the oncoming car is emitting a high beam, and a region that is to be irradiated with the high beam. The memory circuit is configured to store an irradiation distance of a high beam (Continued)

and a decrease rate of light transmittance of the window portion. The arithmetic circuit is configured to output, to the window portion, data on a region of the window portion in which the light transmittance is to be changed, on the basis of data sensed by the first sensor and the second sensor and data stored in the memory circuit. The window portion is configured to locally decrease the light transmittance on the basis of the data output from the arithmetic circuit.

8 Claims, 41 Drawing Sheets

(51) Int. Cl.
    *G08G 1/16*         (2006.01)
    *G06K 9/00*         (2006.01)
    *B60J 3/04*         (2006.01)
    *H01L 27/12*         (2006.01)
    *B60Q 1/076*         (2006.01)
    *G06F 3/01*         (2006.01)
    *G02F 1/13*         (2006.01)
(52) U.S. Cl.
    CPC ..... *G06K 9/00825* (2013.01); *G06K 9/00986* (2013.01); *G08G 1/166* (2013.01); *H01L 27/1225* (2013.01); *H01L 27/1464* (2013.01); *H01L 27/14616* (2013.01); *H01L 27/14623* (2013.01); *H01L 27/14634* (2013.01); *H01L 27/14689* (2013.01); *B60Q 2300/056* (2013.01); *G02F 1/1313* (2013.01); *H01L 27/14621* (2013.01); *H01L 27/14643* (2013.01)
(58) Field of Classification Search
    CPC . G06F 3/013; G02F 1/1313; H01L 27/14643; H01L 27/1462; H01L 27/1225; H01L 27/14689; H01L 27/14634; H01L 27/1464; H01L 27/14623; H01L 27/14616; G08G 1/166; B60J 3/04
    See application file for complete search history.

(56) References Cited

U.S. PATENT DOCUMENTS

| | | | | |
|---|---|---|---|---|
| 7,675,432 | B2 ‡ | 3/2010 | Leicht | B60N 2/0244 |
| | | | | 340/903 |
| 8,140,219 | B2 ‡ | 3/2012 | Cernasov | G02C 7/101 |
| | | | | 315/77 |
| 8,143,563 | B2 ‡ | 3/2012 | Broude | B60J 3/04 |
| | | | | 250/203.4 |
| 9,630,477 | B2 ‡ | 4/2017 | Ro | B60J 3/04 |
| 10,106,018 | B2 ‡ | 10/2018 | Martens | B60J 3/04 |
| 10,377,212 | B2 ‡ | 8/2019 | Glatfelter | B60J 3/04 |
| 10,589,660 | B2 * | 3/2020 | Kimura | H01L 27/14634 |
| 2003/0169213 | A1 ‡ | 9/2003 | Spero | G02B 5/20 |
| | | | | 345/7 |
| 2006/0158715 | A1 ‡ | 7/2006 | Furusawa | B60J 3/04 |
| | | | | 359/26 |
| 2015/0279884 | A1 ‡ | 10/2015 | Kusumoto | H01L 27/1207 |
| | | | | 257/43 |
| 2016/0216536 | A1 ‡ | 7/2016 | Hue | G02F 1/0121 |

FOREIGN PATENT DOCUMENTS

| | | | |
|---|---|---|---|
| JP | 2004-182006 A | ‡ | 7/2004 |
| JP | 2006-199104 A | ‡ | 8/2006 |
| JP | 2007-076452 A | ‡ | 3/2007 |
| JP | 2008-126804 A | ‡ | 6/2008 |
| JP | 2008-126905 A | ‡ | 6/2008 |
| JP | 2010-018164 A | ‡ | 1/2010 |
| JP | 2013-035462 A | | 2/2013 |
| JP | 20113-035462 A | ‡ | 2/2013 |
| JP | 2014-008788 A | ‡ | 1/2014 |
| JP | 2014-133441 A | ‡ | 7/2014 |
| JP | 2015-160534 A | ‡ | 9/2015 |
| JP | 2015-195378 A | ‡ | 11/2015 |
| WO | WO-2013/021795 | ‡ | 2/2013 |
| WO | WO-2013/108748 | ‡ | 7/2013 |
| WO | WO-2015/145306 | ‡ | 10/2015 |
| WO | WO-2017/145015 | ‡ | 8/2017 |

OTHER PUBLICATIONS

International Search Report (Application No. PCT/I82017/051702) dated Jun. 27, 2017.‡
International Search Report (Application No. PCT/IB2017/051702) dated Jun. 27, 2017.
Written Opinion (Application No. PCT/IB2017/051702) dated Jun. 27, 2017.

\* cited by examiner
‡ imported from a related application

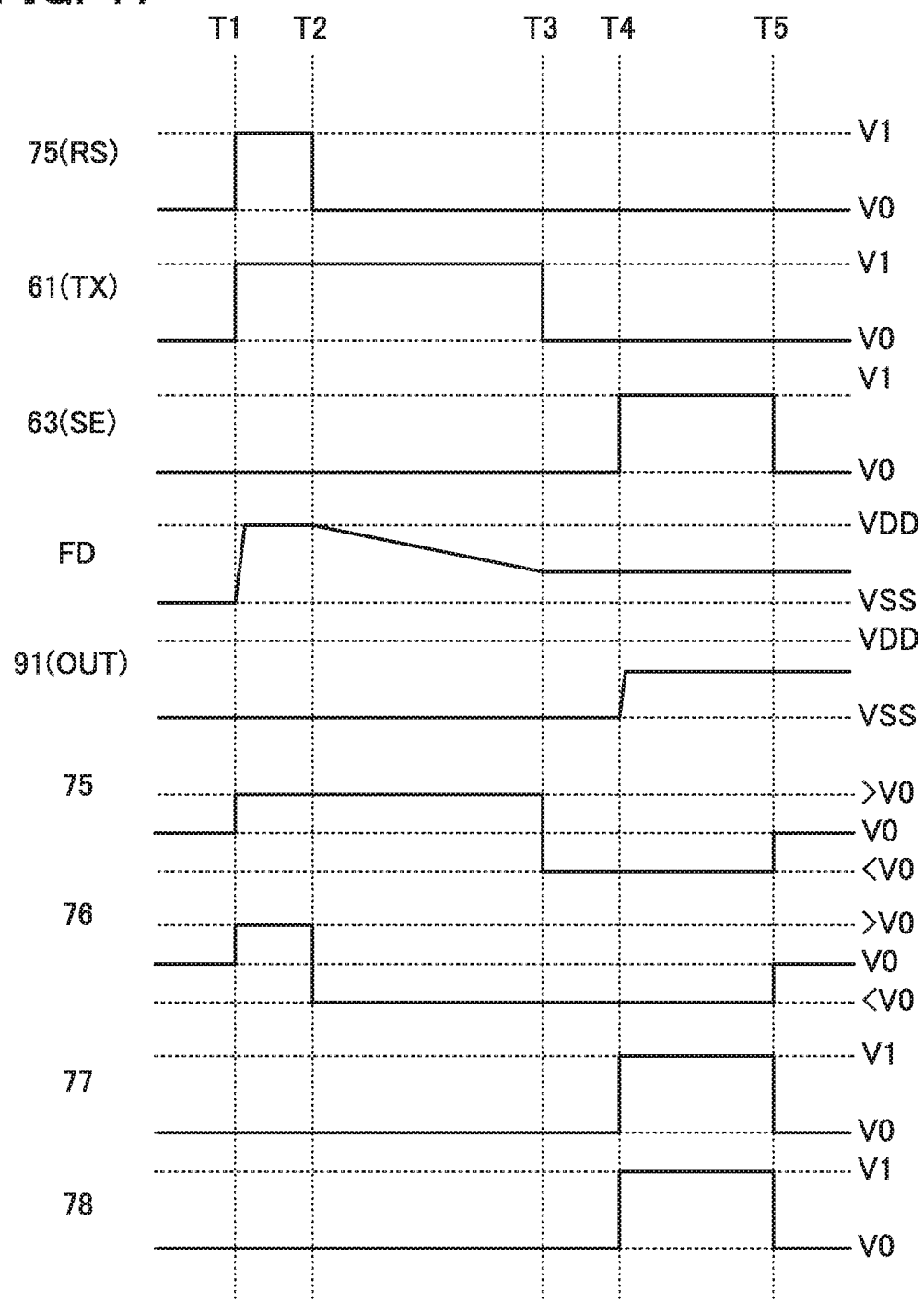

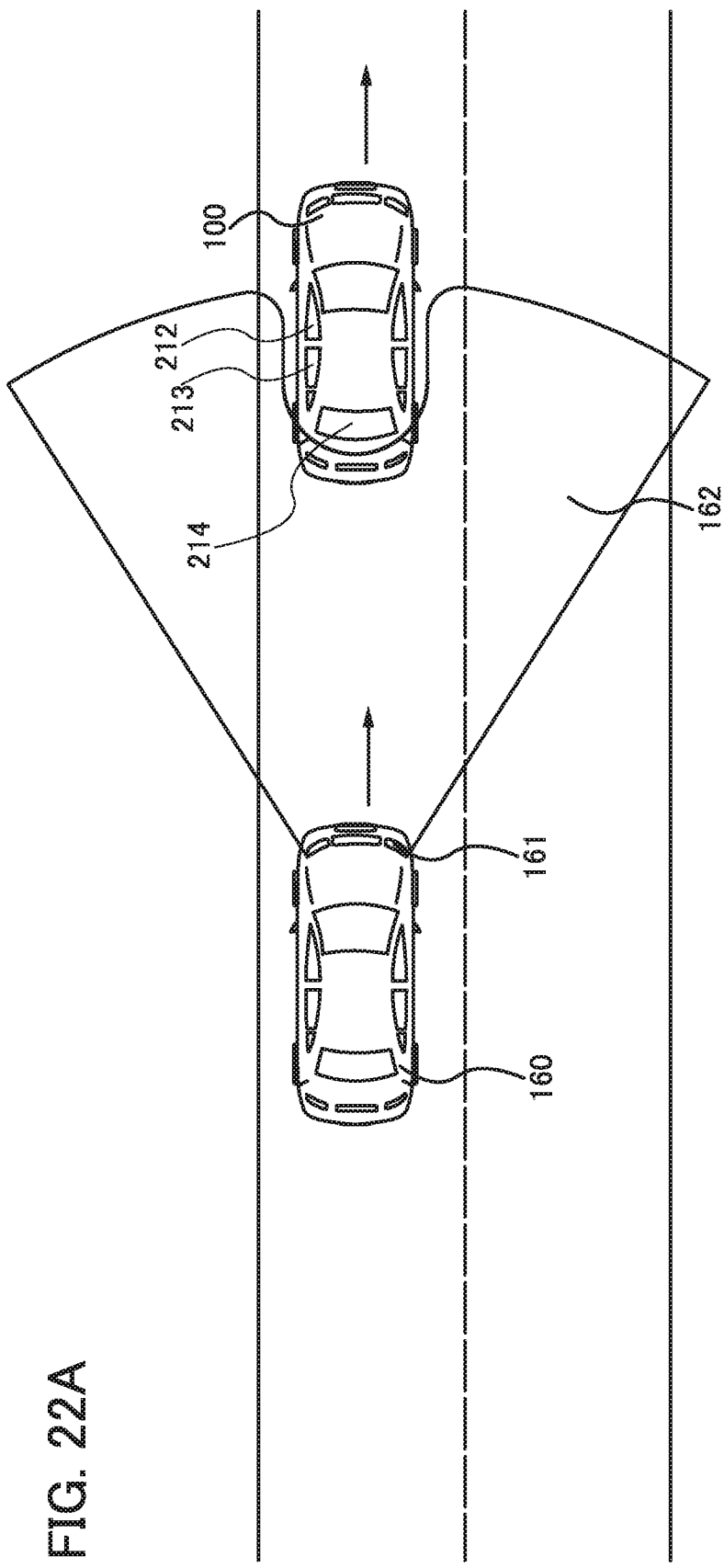
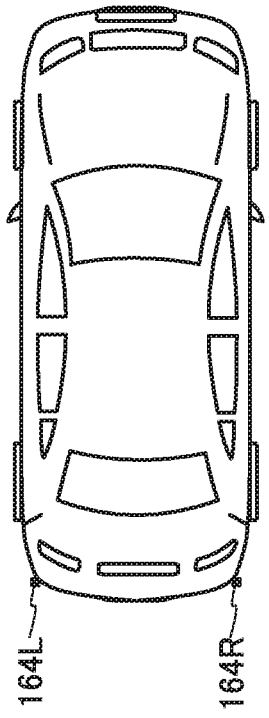
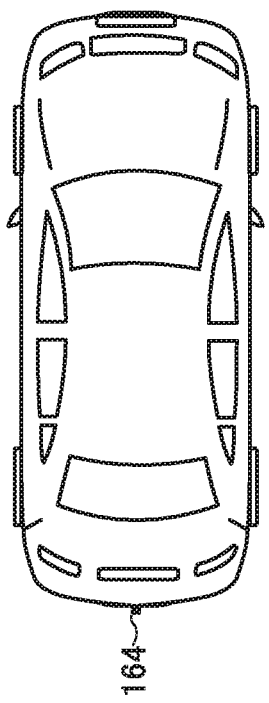

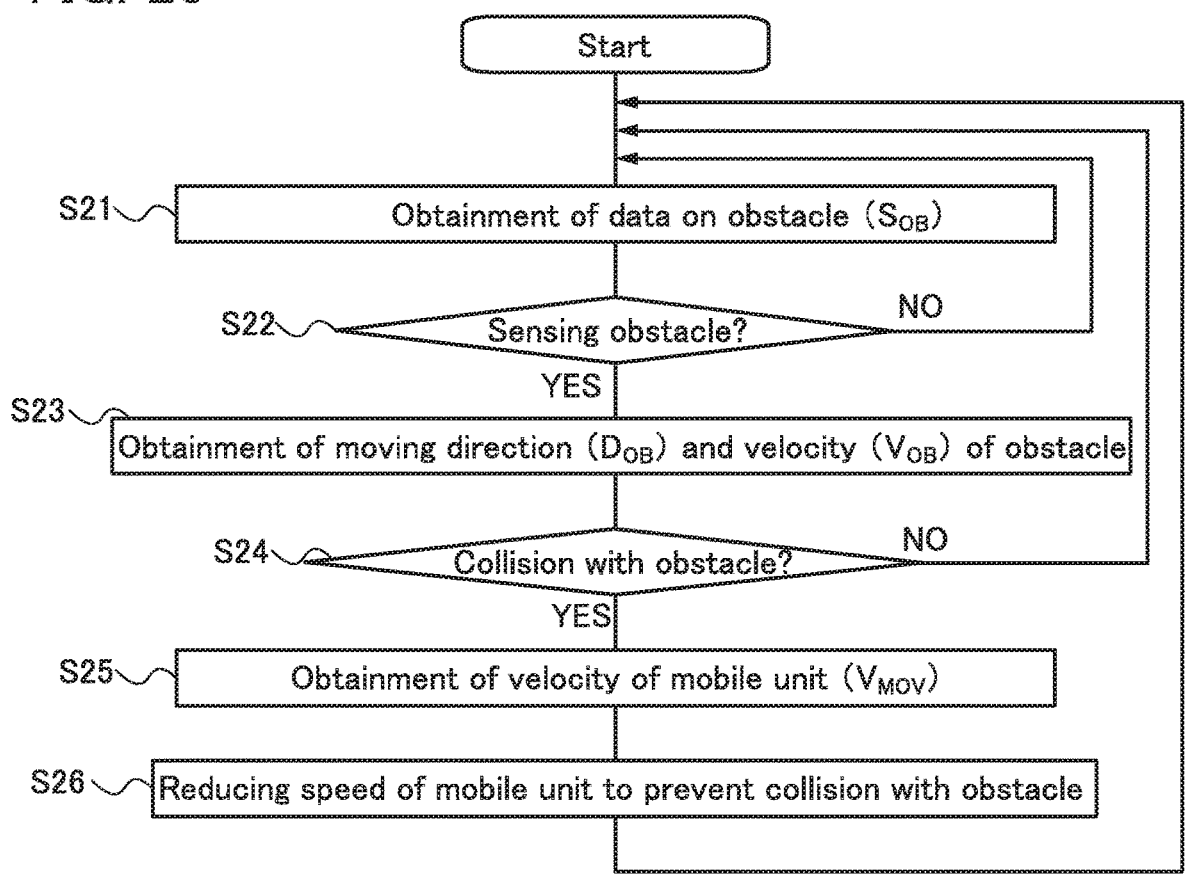

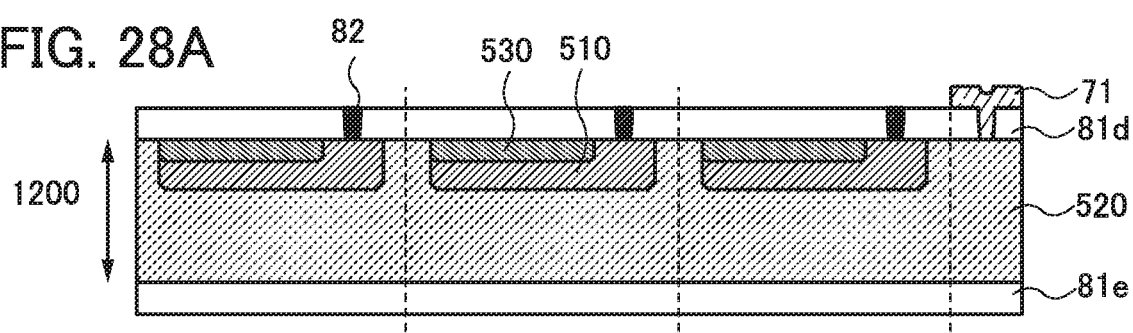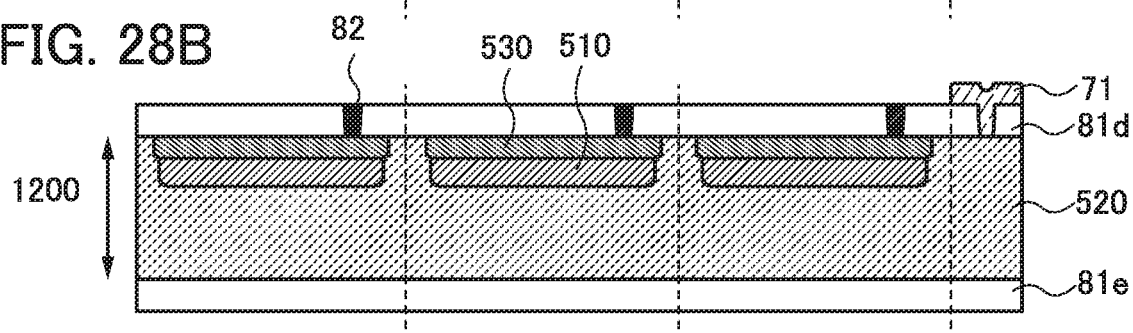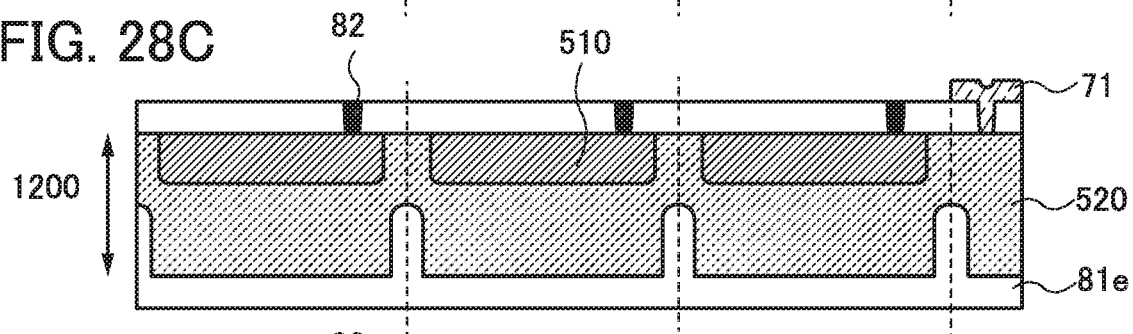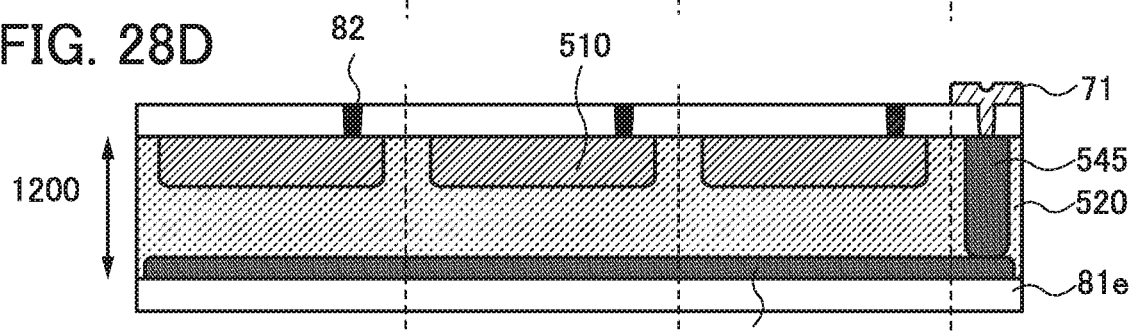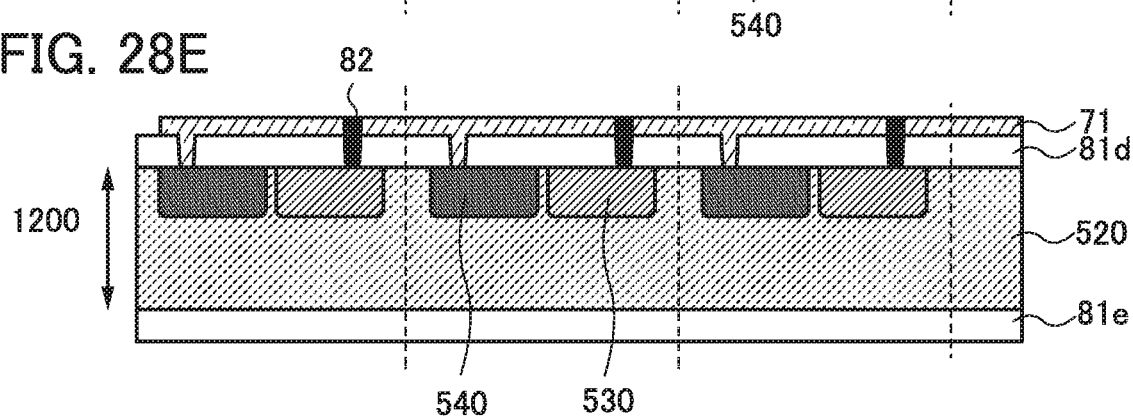

330

330a  330b
330

373  320  330c  370
360

340  330b
345

371  372
370

340
$W_{SD}$    $W_{OS}$
330

340
$W_{SD}$    $W_{OS}$
330

Crystal structure of InMZnO$_4$

601

611

602

611

603

611

604

611

MOBILE UNIT AND SYSTEM FOR MOBILE UNIT

TECHNICAL FIELD

One embodiment of the present invention relates to a mobile unit and a system for a mobile unit.

Note that one embodiment of the present invention is not limited to the above technical field. The technical field of the invention disclosed in this specification and the like relates to an object, a method, or a manufacturing method. Furthermore, one embodiment of the present invention relates to a process, a machine, manufacture, or a composition of matter. Therefore, specifically, a semiconductor device, a display device, a light-emitting device, a power storage device, an imaging device, a memory device, a method for driving them, or a method for manufacturing them can be given as examples of the technical field of one embodiment of the present invention disclosed in this specification and the like.

BACKGROUND ART

A research on a system that assists driving of a car or the like is active.

For example, Patent Document 1 discloses a method and a device which reduces the glare perceived by an occupant, by appropriately controlling an antiglare device in accordance with the positional relationship between a vehicle and a light source.

Specifically, an image of a region where the face of an occupant is positioned is captured and the captured image is subjected to image processing, so that a state in which the occupant perceives glare is sensed. The antiglare device incorporated in the vehicle is controlled so as to reduce the glare perceived by an occupant when the occupant is in the state of perceiving glare.

REFERENCE

Patent Document

[Patent Document 1] PCT International Publication No. 2013/108748

SUMMARY OF THE INVENTION

Problems to be Solved by the Invention

When driving at night, in the case where an oncoming car is emitting high beams, a driver may perceive glare owing to irradiation of the driver's eyes with light with a high illumination. As a method for reducing glare in the case where an oncoming car is emitting high beams, a method of reducing light transmittance of a windshield or the like can be given. However, when the light transmittance of an entire windshield is decreased for example, the light transmittance of an area which is not irradiated with high beams is also decreased, which may lower the front visibility.

An object of one embodiment of the present invention is to provide a mobile unit which can judge whether an oncoming car is emitting high beams. Another object of one embodiment of the present invention is to provide a mobile unit including a window portion in which light transmittance can be locally controlled. Another object of one embodiment of the present invention is to provide a mobile unit which can reduce glare that a driver perceives from high beams emitted by an oncoming car. Another object of one embodiment of the present invention is to provide a mobile unit which can prevent a reduction of visibility even in the case where an oncoming car is emitting high beams. Another object of one embodiment of the present invention is to provide a mobile unit which can prevent drowsy driving. Another object of one embodiment of the present invention is to provide a mobile unit which can prevent collision with an obstacle. Another object of one embodiment of the present invention is to provide a low-cost mobile unit. Another object of one embodiment of the present invention is to provide a mobile unit including a small sensor. Another object of one embodiment of the present invention is to provide a mobile unit including a transistor whose change in electrical characteristics has low temperature dependence.

Another object of one embodiment of the present invention is to provide a novel mobile unit, a novel system for the mobile unit, or the like.

Note that the objects of one embodiment of the present invention are not limited to the above-listed objects. The objects listed above do not preclude the existence of other objects. The other objects are the ones that are not described above and will be described below. The objects that are not described above will be derived from and can be appropriately extracted from the description of the specification, the drawings, and the like by those skilled in the art. One embodiment of the present invention solves at least one of the above-listed objects and/or the other objects.

Means for Solving the Problems

One embodiment of the present invention is a mobile unit including a first sensor, a second sensor, a first circuit, an arithmetic circuit, and a window portion. The first sensor is configured to sense a position of eyes of a driver who is riding in the mobile unit, the second sensor is configured to sense whether an oncoming car is existing, the second sensor is configured to sense whether the oncoming car is emitting a high beam, the second sensor is configured to sense a region that is to be irradiated with the high beam emitted by the oncoming car, the first circuit is configured to store an irradiation distance of a high beam, the first circuit is configured to store a decrease rate of light transmittance of the window portion in the case where the light transmittance is decreased, the arithmetic circuit is configured to output, to the window portion, data on a region of the window portion in which the light transmittance is to be changed, on the basis of data sensed by the first sensor and the second sensor and data stored in the first circuit, and the window portion is configured to locally decrease the light transmittance on the basis of the data, which is output from the arithmetic circuit, on a region of the window portion in which the light transmittance is to be changed.

One embodiment of the present invention is a mobile unit including a first sensor, a second sensor, a first circuit, an arithmetic circuit, and a window portion. The first sensor is configured to output a first signal to the arithmetic circuit, the second sensor is configured to output a second signal to the arithmetic circuit, the second sensor is configured to output a third signal to the arithmetic circuit, the second sensor is configured to output a fourth signal to the arithmetic circuit, the first circuit is configured to output a fifth signal to the arithmetic circuit, the first circuit is configured to output a sixth signal to the arithmetic circuit, the arithmetic circuit is configured to output a seventh signal to the window portion in accordance with the first to sixth signals, and the window portion is configured to locally decrease light transmittance in accordance with the seventh signal.

The first signal comprises data on a position of eyes of a driver who is riding in the mobile unit, the second signal comprises data on whether an oncoming car is existing, the third signal comprises data on whether the oncoming car is emitting a high beam, the fourth signal comprises data on a region that is to be irradiated with the high beam emitted by the oncoming car, the fifth signal comprises data on an irradiation distance of a high beam, the sixth signal comprises data on a decrease rate of the light transmittance in the case where the light transmittance is decreased, and the seventh signal comprises data on a region of the window portion in which the light transmittance is to be changed.

Furthermore, the first sensor may be provided inside the mobile unit, and the second sensor may be provided outside the mobile unit.

Furthermore, a dynamic range of the second sensor may be higher than a dynamic range of the first sensor, and a frame frequency of the second sensor may be higher than a frame frequency of the first sensor.

The first sensor may include a first imaging element, the second sensor may include a second imaging element, the first imaging element may be configured to operate by a rolling shutter method, and the second imaging element may be configured to operate by a global shutter method.

The second sensor may include a pixel, the pixel may include a photoelectric conversion element and first to fourth transistors, one terminal of the photoelectric conversion element may be electrically connected to one of a source and a drain of the first transistor, the other of the source and the drain of the first transistor may be electrically connected to one of a source and a drain of the second transistor, the one of the source and the drain of the second transistor may be electrically connected to a gate of the third transistor, one of a source and a drain of the third transistor may be electrically connected to one of a source and a drain of the fourth transistor, the first transistor and the second transistor may include an oxide semiconductor in their channel formation regions, and the oxide semiconductor may include In, Zn, and M (M is Al, Ga, Y, or Sn).

Effect of the Invention

One embodiment of the present invention can provide a mobile unit which can judge whether an oncoming car is emitting high beams. One embodiment of the present invention can provide a mobile unit including a window portion in which light transmittance can be locally controlled. One embodiment of the present invention can provide a mobile unit which can reduce glare that a driver perceives from high beams emitted by an oncoming car. One embodiment of the present invention can provide a mobile unit which can prevent a reduction of visibility even in the case where an oncoming car is emitting high beams. One embodiment of the present invention can provide a mobile unit which can prevent drowsy driving. One embodiment of the present invention can provide a mobile unit which can prevent collision with an obstacle. One embodiment of the present invention can provide a low-cost mobile unit. One embodiment of the present invention can provide a mobile unit including a small sensor. One embodiment of the present invention can provide a mobile unit including a transistor whose change in electrical characteristics has low temperature dependence.

One embodiment of the present invention can provide a novel mobile unit, a novel system for the mobile unit, or the like.

Note that the effects of one embodiment of the present invention are not limited to the above-listed effects. The effects listed above do not preclude the existence of other effects. The other effects are the ones that are not described above and will be described below. The effects that are not described above will be derived from and can be appropriately extracted from the description of the specification, the drawings, and the like by those skilled in the art. One embodiment of the present invention has at least one of the above-listed effects and/or the other effects. Therefore, one embodiment of the present invention does not have the above-described effects in some cases.

BRIEF DESCRIPTION OF DRAWINGS

FIG. 17 A view illustrating an operation of a pixel circuit.

FIGS. 22A-22C A view for illustrating an example of operation and views for illustrating examples of a sensor installation position.

FIG. 26 A flowchart illustrating an example of operation.

FIGS. 28A-28E Views illustrating structures of a photoelectric conversion element.

MODE FOR CARRYING OUT THE INVENTION

Figure 1A:
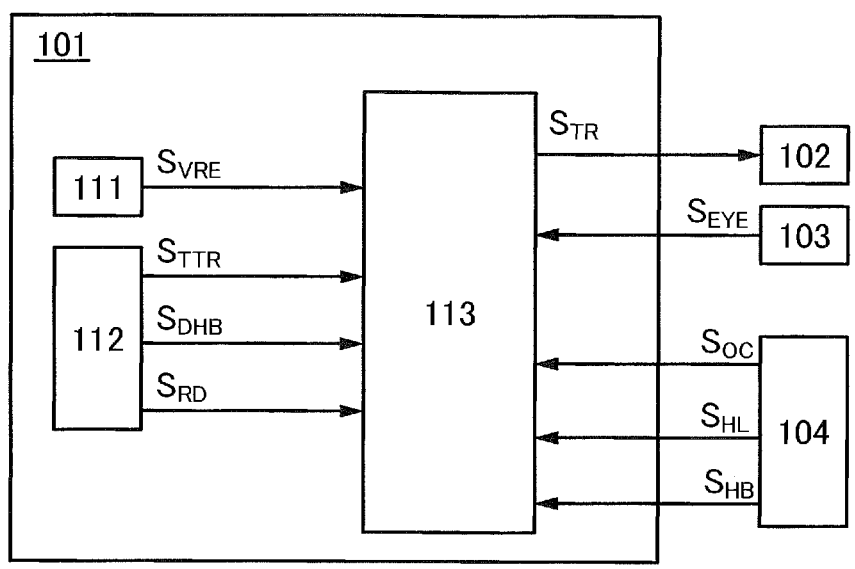
FIGS. 1A-1B Block diagrams illustrating structure examples of a mobile unit.

Hereinafter, one embodiment of the present invention will be described with reference to drawings. However, one embodiment of the present invention can be implemented in many different modes, and it will be readily appreciated by those skilled in the art that modes and details can be changed in various ways without departing from the spirit and scope of the present invention. Thus, the present invention should not be interpreted as being limited to the following description.

In this specification and the like, ordinal numbers such as "first", "second", and "third" are used in order to avoid confusion among components. Thus, the terms do not limit the number of components. Furthermore, the terms do not limit the order of components.

The same elements or elements having similar functions, elements formed using the same material, elements formed at the same time, or the like in the drawings are denoted by the same reference numerals, and the description thereof is not repeated in some cases.

In this specification and the like, terms for explaining arrangement, such as "over" and "under", are used for convenience to describe the positional relation between components with reference to drawings. The positional relation between components is changed as appropriate in accordance with a direction in which the components are described. Therefore, the terms for explaining arrangement are not limited to those used in this specification and may be changed to other terms as appropriate depending on the situation.

The term "over" or "below" does not necessarily show that a component is placed directly on or directly below and directly in contact with another component. For example, the expression "electrode B over insulating layer A" does not necessarily mean that the electrode B is on and in direct contact with the insulating layer A and does not exclude the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there can be a case in which one circuit is concerned with a plurality of functions or a case in which a plurality of circuits are concerned with one function. Therefore, blocks in a block diagram do not necessarily show components described in the specification and can show components expressed with another term as appropriate depending on the situation.

In drawings, the size, the layer thickness, or the region is determined arbitrarily for description convenience. Therefore, it is not limited to the illustrated scale. Note that the drawings are schematically shown for clarity, and shapes, values, or the like are not limited to those shown in the drawings. For example, the following can be included: a variation in signal, voltage, or current due to noise, a variation in signal, voltage, or current due to a difference in timing, or the like.

In drawings such as top views (also referred to as plan views or layout views), perspective views, some of components might not be illustrated for clarity of the drawings.

In this specification and the like, the terms "one of a source and a drain" (or a first electrode or a first terminal) is used to denote one of a source and a drain, and the term "the other of the source and the drain" (or a second electrode or a second terminal) is used to denote the other of the source and the drain in describing the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit a function of the component. For example, an "electrode" is used as part of a "wiring" in some cases, and vice versa. Further, the term "electrode" or "wiring" can also mean a combination of a plurality of "electrodes" and "wirings" formed in an integrated manner.

In this specification and the like, voltage and potential can be replaced with each other as appropriate. Voltage refers to a potential difference from a reference potential. When the reference potential is a ground voltage, for example, voltage can be replaced with potential. The ground potential does not necessarily mean 0 V. Potentials are relative values, and the potential applied to a wiring or the like is changed depending on the reference potential, in some cases.

In this specification and the like, the terms such as "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification and the like, a switch is something that becomes in a conducting state (on state) or a non-conducting state (off state) and has a function of determining whether a current flows therethrough or not. Moreover, a switch is something that has a function of selecting and changing a current path.

For example, an electrical switch, a mechanical switch, or the like can be used. That is, any element can be used as a switch as long as it can control a current, without limitation to a certain element.

Examples of the electrical switch are a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), a logic circuit in which such elements are combined, and the like.

In the case of using a transistor as a switch, a "conducting state" of the transistor refers to a state in which a source and a drain of the transistor are electrically short-circuited. Furthermore, a "non-conducting state" of the transistor refers to a state in which the source and the drain of the transistor are electrically disconnected. In the case where a transistor operates just as a switch, the polarity (conductivity type) of the transistor is not particularly limited to a certain type.

An example of a mechanical switch is a switch formed using a MEMS (micro electro mechanical system) technology, such as a digital micromirror device (DMD). Such a switch includes an electrode which can be moved mechanically, and the movement of the electrode controls conduction and non-conduction in operation.

In this specification and the like, the channel length refers to, for example, a distance between a source and a drain in a region where a semiconductor (or a portion where a current flows in a semiconductor when a transistor is on) and a gate overlap with each other or a region where a channel is formed in a top view of the transistor.

In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

In this specification and the like, the channel width refers to, for example, the length of a portion where a source and a drain face each other in a region where a semiconductor (or a portion where a current flows in a semiconductor when a transistor is on) and a gate electrode overlap with each other or a region where a channel is formed.

In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

In this specification and the like, a pixel refers to one element whose brightness can be controlled, for example. Therefore, for example, one pixel expresses one color element by which brightness is expressed. Accordingly, in the case of a color display device formed of color elements of R (red), G (green), and B (blue), the smallest unit of an image is formed of three pixels of an R pixel, a G pixel, and a B pixel.

Note that the number of color elements is not limited to three, and more color elements may be used. For example, RGBW (W: white), RGB added with yellow, cyan, or magenta, and the like may be employed.

In this specification and the like, when it is described that A and B are connected to each other, the case where A and B are electrically connected to each other is included in addition to the case where A and B are directly connected to each other. Here, when it is described that A and B are electrically connected to each other, it refers to the case where electric signals can be transmitted and received between A and B when an object having any electric action exists between A and B.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

Examples of the expressions include "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected to each other in this order." Examples of the expressions include "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order." Examples of the expressions include "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path through the transistor which is between the source (or the first terminal or the like) of the transistor and a drain (or a second terminal or the like) of the transistor, the first connection path is a path through Z1, the drain (or the second terminal or the like) of the transistor is electrically connected to Y through at least a third connection path, the third connection path does not include the second connection path, and the third connection path is a path through Z2." Another example of the expressions is "a source (or a first terminal or the like) of a transistor is electrically connected to X at least with a first connection path through Z1, the first connection path does not include a second connection path, the second connection path includes a connection path through the transistor, a drain (or a second terminal or the like) of the transistor is electrically connected to Y at least with a third connection path through Z2, and the third connection path does not include the second connection path." Still another example of the expressions is "a source (or a first terminal or the like) of a transistor is electrically connected to X at least with a first electrical path through Z1, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y at least with a third electrical path through Z2, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expression. Here, X, Y, Z1, and Z2 each denote an object (e.g., a device, an element, a circuit, a wiring, an electrode, a terminal, a conductive film, and a layer).

Embodiment 1

In this embodiment, a mobile unit and a system for the mobile unit of one embodiment of the present invention will be described with reference to drawings.

FIG. 1(A) is a block diagram illustrating a structure example of the mobile unit and the system for the mobile unit of one embodiment of the present invention. A mobile unit 100 includes a control circuit 101, a window portion 102, a sensor 103, and a sensor 104. The control circuit 101 includes a sensor circuit 111, a memory circuit 112, and an arithmetic circuit 113.

The mobile unit 100 corresponds to a vehicle running at nighttime, for example. Examples of the mobile unit are an automobile, a bus, a train, and the like. Unless otherwise noted below, the description is given on the assumption that the mobile unit is an automobile.

The window portion 102 has a function of locally controlling the transmittance of light which passes through the window portion 102. For example, the window portion 102 has a function of decreasing the light transmittance of only a region between a region that is being irradiated with light with more than or equal to a certain illumination and the eyes of a driver who is riding in the mobile unit 100. Note that a windshield can be used as the window portion 102, for example. Furthermore, the light with a certain illumination can be light with an illumination from which a person perceives glare when the eyes of the person are irradiated with the light, for example.

The control circuit 101 has a function of outputting a signal $S_{TR}$ that is for changing the light transmittance in the window portion 102. The signal $S_{TR}$ includes data on a region of the window portion 102 in which the light transmittance is to be changed.

The window portion 102 is provided with an element having a function of changing the light transmittance in response to the signal $S_{TR}$. For example, the window portion 102 can have a structure including glass provided with a liquid crystal. Alternatively, the window portion 102 can have a structure in which glass provided with a liquid crystal is attached to a window pane. The window portion 102 has a function of changing the light transmittance by the control of the alignment state of the liquid crystal.

The sensor 103 has a function of sensing an object and outputting a signal to the arithmetic circuit 113. For example, the sensor 103 has a function of sensing the position of the eyes of the driver who is riding in the mobile unit 100 and outputting a signal $S_{EYE}$ including data on the position to the arithmetic circuit 113.

The sensor 104 has a function of sensing an object and outputting a signal to the arithmetic circuit 113. Furthermore, the sensor 104 has a function of sensing the illumination of light and outputting a signal to the arithmetic circuit 113. For example, the sensor 104 has a function of sensing an oncoming car and outputting a signal $S_{OC}$ including data on the oncoming car to the arithmetic circuit 113. Note that the signal $S_{OC}$ includes data on whether an oncoming car is existing, data on the distance between the mobile unit 100 and the oncoming car, and the like, for example.

Furthermore, for example, the sensor 104 has a function of sensing the state of light emitted by an oncoming car and outputting a signal $S_{HL}$ to the arithmetic circuit 113. Here, sensing the state of light emitted by an oncoming car means sensing whether the oncoming car is emitting is emitting high beams, for example.

Moreover, for example, the sensor 104 has a function of sensing a region that is to be irradiated with high beams emitted by an oncoming car and outputting a signal $S_{HB}$ including data on the region to the arithmetic circuit 113. Note that the region that is to be irradiated with the high beams can be determined from the position or the like of headlights of the oncoming car, which is sensed by the sensor 104, for example.

In this specification and the like, irradiation with high beams means irradiation with light derived from high beams with more than or equal to a certain illumination. Here, the certain illumination can be an illumination from which a person perceives glare when the eyes of the person are irradiated, for example.

Figure 1B:
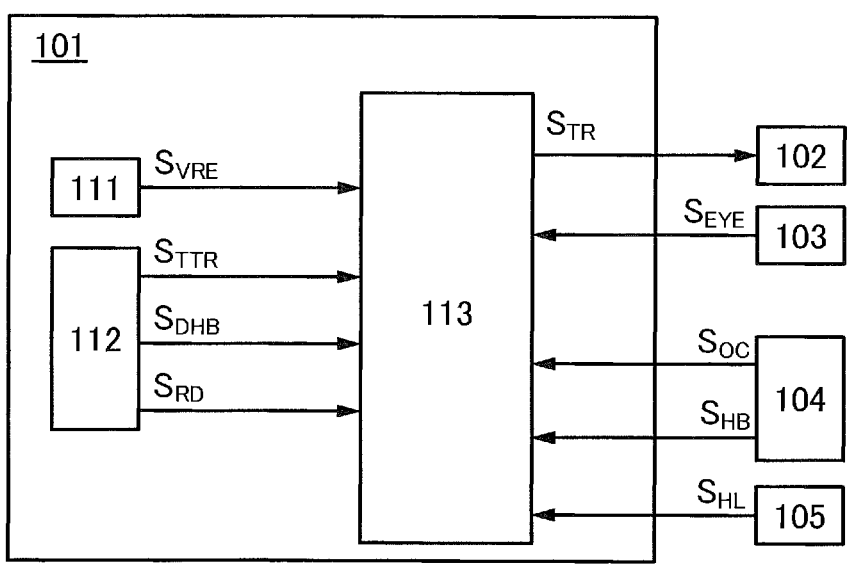

Although the signal $S_{OC}$, the signal $S_{HL}$, and the signal $S_{HB}$ are all output from the sensor 104 in FIG. 1(A), the signal $S_{OC}$ and the signal $S_{HB}$ may be output from the sensor 104, and the signal $S_{HL}$ may be output from a sensor 105 as illustrated in FIG. 1(B), for example. In this case, the region that is to be irradiated with high beams emitted by an oncoming car can be, for example, determined from the position of headlights of the oncoming car, which is sensed by the sensor 104, as described above, so that the sensor 104 can be a sensor which senses only an object. Furthermore, the sensor 105 can be a sensor which senses only the illumination of light.

Figure 2A:
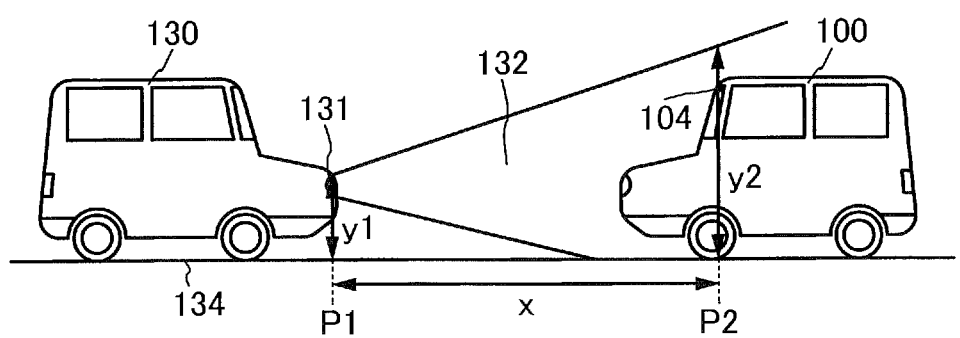
FIGS. 2A-2B Views illustrating a high beam and a low beam.
Figure 2B:
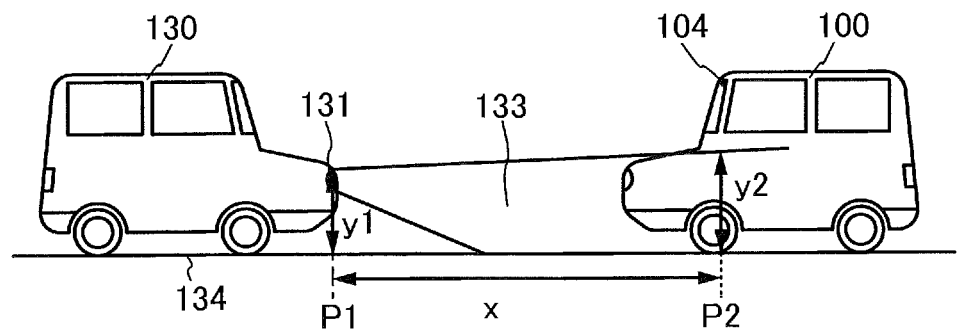

A method for sensing whether an oncoming car is emitting high beams will be described. FIG. 2(A) illustrates a situation in which a headlight 131 of an oncoming car 130 is emitting a high beam 132. FIG. 2(B) illustrates a situation in which the headlight 131 of the oncoming car 130 is emitting a low beam 133. Note that the high beam 132 and the low beam 133 illustrated in FIGS. 2(A), (B) or the like represent a region with more than or equal to a certain illumination, e.g., a region that is being irradiated with light with an illumination from which a person perceives glare when the eyes of the person are irradiated with the light.

In FIGS. 2(A), (B), a position P1 represents the position of the headlight 131, and a position P2 represents a location that is a certain distance x away from the position P1. In addition, a height y1 represents a height from a road surface 134 on which the oncoming car 130 is running to the headlight 131 at the position P1. A height y2 represents a height from the road surface 134 to the high beam 132 or the low beam 133 at the position P2. Note that specifically, the height y2 can be a height from the road surface 134 to a point at which the illumination of light becomes a certain illumination or lower at the position P2. In this case, at the position P2, places at and above the height y2 are being irradiated with light with an illumination from which a person does not perceive glare, and places below the height y2 are being irradiated with light with an illumination from which a person perceives glare.

As illustrated in FIGS. 2(A), (B), irradiation with the high beam 132 is directed more upward than the irradiation with the low beam 133. Accordingly, the height y1 and the height y2 are measured with the sensor 104, the sensor 105, or the like. In the case where the value obtained by subtracting the height y1 from the height y2 is more than or equal to a previously designated prescribed value, the headlight 131 of the oncoming car 130 can be judged as emitting the high beam 132. Furthermore, in the case where the value obtained by subtracting the height y1 from the height y2 is less than the previously designated prescribed value or is a negative value, the headlight 131 of the oncoming car 130 can be judged as emitting the low beam 133.

Note that a value obtained by dividing the difference between the height y2 and the height y1 by the distance x, that is, (y2−y1)/x, may be used for judging whether light that is being emitted by the headlight 131 of the oncoming car 130 is the high beam 132. Specifically, in the case where (y2−y1)/x is more than or equal to a previously designated prescribed value, the headlight 131 of the oncoming car 130 can be judged as emitting the high beam 132. Furthermore, in the case where (y2−y1)/x is less than the previously designated prescribed value or is a negative value, the headlight 131 of the oncoming car 130 can be judged as emitting the low beam 133. By the above-described method, whether light that is being emitted by the headlight 131 of the oncoming car 130 is the high beam 132 can be judged correctly.

The sensor circuit 111 has a function of outputting a signal $S_{VRE}$ including data on a relative velocity $V_{RE}$ between the mobile unit 100 and an oncoming car ahead of the mobile unit 100 to the arithmetic circuit 113. Note that when the velocity of the mobile unit 100 is V and the velocity of the oncoming car is V' for example, the relative velocity $V_{RE}$ is represented by V+V'.

For example, the sensor circuit 111 can calculate an average of the recent relative velocities $V_{RE}$ and output the average as the signal $S_{VRE}$ to the arithmetic circuit 113.

The memory circuit 112 has a function of storing a time $T_{TR}$ spent in changing the light transmittance of the window portion 102 and outputting a signal $S_{TTR}$ including data on the stored $T_{TR}$ to the arithmetic circuit 113. The time $T_{TR}$ can be, for example, a time necessary for a driver to adapt to a change in the light transmittance of the window portion 102. The time $T_{TR}$ can be, for example, a time necessary for preventing a driver from perceiving a sudden darkness of the outside scenery.

Furthermore, the time $T_{TR}$ may be 0. In this case, the light transmittance of the window portion 102 can be kept high until just before the eyes of a driver are irradiated with high beams emitted by an oncoming car. After the oncoming car has passed and the irradiation of the eyes of the driver with the high beams has stopped, the light transmittance of the window portion 102 can be increased to an original value immediately. Note that the time required to decrease the light transmittance of the window portion 102 and the time for returning the decreased transmittance may be different from each other. For example, the light transmittance of the window portion 102 may be decreased slowly, and the decreased transmittance may be returned quickly.

Note that in the case where the time $T_{TR}$ is 0, the relative velocity $V_{RE}$ is not necessarily sensed. In this case, the control circuit 101 can have a structure not including the sensor circuit 111. Moreover, in the case where the time $T_{TR}$ is 0 for example, the memory circuit 112 does not necessarily have a function of outputting the signal $S_{TTR}$.

In this specification and the like, irradiating the eyes of a driver with high beams means irradiating the eyes of the driver with light derived from high beams with more than or equal to a certain illumination. Here, the certain illumination can be an illumination from which a driver perceives glare when the eyes of the driver are irradiated, for example.

Furthermore, the memory circuit 112 has a function of storing an irradiation distance $D_{HB}$ of high beams and outputting a signal $S_{DHB}$ including data on the irradiation distance $D_{HB}$ to the arithmetic circuit 113. Note that the irradiation distance $D_{HB}$ can be, for example, 100 m.

Furthermore, the memory circuit 112 has a function of storing a decrease rate $R_D$ of transmittance in the case of decreasing the light transmittance of the window portion 102, and outputting a signal $S_{RD}$ including data on the decrease rate $R_D$ to the arithmetic circuit 113. The decrease rate $R_D$ is preferably set so that a driver riding in the mobile unit 100 will not perceive glare of high beams. In addition, in order to suppress the decrease in visibility as much as possible, the decrease rate $R_D$ is preferably set as small as possible so that a driver will not perceive glare of high beams.

Note that the time $T_{TR}$, the irradiation distance $D_{HB}$, and the decrease rate $R_D$ may be predetermined values, or may be decreased on the basis of signals or the like output from the sensor 103, the sensor 104, the sensor 105, and the sensor circuit 111. In the case where the time $T_{TR}$, the irradiation distance $D_{HB}$, and the decrease rate $R_D$ are predetermined, a rewritable storage medium is preferably used as the memory circuit 112. For example, as the memory circuit 112, a rewritable nonvolatile memory such as a hard disk or a flash memory can be used.

The arithmetic circuit 113 has a function of outputting the signal $S_{TR}$ to the window portion 102 in accordance with the signal $S_{EYE}$, the signal $S_{OC}$, the signal $S_{HL}$, the signal $S_{HB}$, the signal $S_{VRE}$, the signal $S_{TTR}$, the signal $S_{DHB}$, the signal $S_{RD}$, and the like described above. Since the arithmetic circuit 113 obtains the signal $S_{TR}$ on the basis of the plurality of signals, it is preferably a signal processing circuit such as a microcomputer.

As described above, the signal $S_{TR}$ includes data on a region of the window portion 102 in which light transmittance is to be changed. For example, from the signal $S_{HB}$ and the signal $S_{EYE}$, the arithmetic circuit 113 calculates a region between a region that is being irradiated with high beams emitted by an oncoming car at the time of obtaining the signal $S_{HB}$ and the eyes of the driver who is riding in the mobile unit 100. In addition, from the signal $S_{HB}$, the relative velocity $V_{RE}$, and the like, a region which is irradiated with high beams emitted by the oncoming car at the time when time $T_R$ has passed since the obtainment of the signal $S_{HB}$ is calculated. Furthermore, from this region and the signal $S_{EYE}$, a region between the region which is irradiated with high beams emitted by the oncoming car and the eyes of the driver who is riding in the mobile unit 100 at the time when the time $T_R$ has passed since the obtainment of the signal $S_{HB}$ is calculated. Then, the signal $S_{TR}$ including data on the above-described two regions can be output to the window portion 102. This can make it possible to decrease the transmittance of the window portion 102 in only a region between the region irradiated with high beams emitted by the oncoming car and the eyes of the driver who is riding in the mobile unit 100. Accordingly, the glare perceived by the driver riding in the mobile unit 100 can be reduced, and in addition, a reduction in visibility can be suppressed more than the case of decreasing the transmittance over the entire window portion 102.

Note that the mobile unit 100 may have a function of allowing a driver to arbitrarily adjust the region of the window portion 102 in which light transmittance is decreased.

Moreover, the signal $S_{TR}$ can be a signal which gradually changes the light transmittance of the window portion 102 over the time $T_{TR}$. Specifically, in the case where the light transmittance of the window portion 102 is gradually decreased from 100% to 50%, the transmittance can be controlled so as to continuously change, in such a manner that it changes to 99%, then to 98%.

The mobile unit and the system for the mobile unit of one embodiment of the present invention can be configured to decrease the light transmittance of the window portion 102 in the case where an oncoming car is emitting high beams for example, and not to decrease the light transmittance of the window portion 102 in the case where an oncoming car is emitting low beams for example. Furthermore, even in the case where an oncoming car is emitting high beams, for example, the light transmittance of the window portion 102 can be decreased only in the region between the region irradiated with high beams and the eyes of the driver who is riding in the mobile unit 100. In the case where the light that is being emitted by the oncoming car is the low beam 133 for example, the driver riding in the mobile unit 100 perceives glare less than the case where the light is a high beam. Accordingly, with the mobile unit and the system for the mobile unit of one embodiment of the present invention, the glare a driver riding in the mobile unit 100 perceives from high beams can be reduced, and in addition, a reduction in visibility in the case where high beams are not being emitted can be suppressed, for example. Moreover, even in the case where high beams are being emitted, a reduction in visibility can be suppressed more than the case of decreasing the transmittance over the entire window portion 102.

Next, an operation example of the mobile unit 100 having the structure illustrated in FIG. 1(A) will be described with reference to a flowchart illustrated in FIG. 3.

In Step S01, the arithmetic circuit 113 obtains data on an oncoming car from the sensor 104. This data is output from the sensor 104 to the arithmetic circuit 113 as the signal $S_{OC}$ as described above. Note that the signal $S_{OC}$ includes, as described above, data as to whether an oncoming car is existing, data on the distance between the mobile unit 100 and an oncoming car, and the like.

In Step S02, the arithmetic circuit 113 judges whether an oncoming car is sensed on the basis of the signal $S_{OC}$. In the case where an oncoming car has not been sensed, a return to Step S01 is made and the arithmetic circuit 113 obtains data on an oncoming car from the sensor 104 again. In the case where an oncoming car has been sensed, go to Step S03.

In Step S03, the arithmetic circuit 113 obtains data on the state of light that is being emitted by the oncoming car from the sensor 104. The data is output to the arithmetic circuit 113 as the signal $S_{HL}$ as described above. Thus, whether the oncoming car is emitting high beams can be judged.

In Step S04, the arithmetic circuit 113 judges whether the oncoming car is emitting high beams on the basis of the signal $S_{HL}$. In the case where the oncoming car is not emitting high beams, a return to Step S01 is made. In the case where the oncoming car is emitting high beams, go to Step S05.

In Step S05, the arithmetic circuit 113 obtains data on the time $T_{TR}$ spent in decreasing the transmittance of the window portion 102 and the irradiation distance $D_{HB}$ of the high beams, from the memory circuit 112. As described above, the data on the time $T_{TR}$ is output to the arithmetic circuit 113 as the signal $S_{TTR}$, and the data on the irradiation distance $D_{HB}$ is output to the arithmetic circuit 113 as the signal $S_{DHB}$.

In Step S06, the arithmetic circuit 113 obtains data on the relative velocity $V_{RE}$ of the oncoming car seen from the mobile unit 100, from the sensor circuit 111. As described above, the data is output to the arithmetic circuit 113 as the signal $S_{VRE}$.

In Step S07, the arithmetic circuit 113 calculates time $T_{FLAG}$ which is taken until high beams emitted by the oncoming car reaches the eyes of the driver who is riding in the mobile unit 100, from the irradiation distance $D_{HB}$, the relative velocity $V_{RE}$, data on the distance between the mobile unit 100 and the oncoming car included in the signal $S_{OC}$, and the like.

In Step S08, the time $T_{FLAG}$ calculated in Step S07 and the time $T_{TR}$ obtained in Step S05 are compared. In the case where the time $T_{FLAG}$ is longer than the time $T_{TR}$, a return to Step S06 is made to obtain data on the relative velocity $V_{RE}$ of the oncoming car seen from the mobile unit 100 again. In this case, the sensor 104 may obtain the signal $S_{OC}$ again and output the signal to the arithmetic circuit 113. Accordingly, the distance between the mobile unit 100 and the oncoming car can be measured again. This allows a more precise calculation of the time $T_{FLAG}$.

In the case where $T_{FLAG}$ is shorter than or equal to $T_{TR}$, go to Step S09. In Step S09, the arithmetic circuit 113 obtains data on the decrease rate $R_D$ of transmittance of the window portion 102. The data is output to the arithmetic circuit 113 as the signal $S_{RD}$ as described above.

In Step S10, the sensor 103 senses the eyes of the driver who is riding in the mobile unit 100. Then, the arithmetic circuit 113 obtains data on the position of the eyes of the driver who is riding in the mobile unit 100, from the sensor 103. The data is output to the arithmetic circuit 113 as the signal $S_{EYE}$ as described above. Furthermore, the arithmetic circuit 113 obtains data on a region that is to be irradiated with high beams emitted by the oncoming car, from the sensor 104. The data is output to the arithmetic circuit 113 as the signal $S_{HB}$ as described above. Note that as described above, for example, headlights of the oncoming car are sensed by the sensor 104, and from the position of the headlights, data on the region that is to be irradiated with high beams emitted by the oncoming car can be obtained.

In Step S11, the arithmetic circuit 113 calculates a region of the window portion 102 in which light transmittance is to be decreased, from the relative velocity $V_{RE}$, the signal $S_{EYE}$ and the signal $S_{HB}$ obtained in Step S10, and the like. The data on the region is output to the window portion 102 as the signal $S_{TR}$ as described above. The region of the window portion 102 in which light transmittance is to be decreased can be, for example, a region between the region irradiated with high beams emitted by the oncoming car and the eyes of the driver who is riding in the mobile unit 100 at any of the times from the time of obtaining the signal $S_{HB}$ to the time when the time $T_R$ has passed from the obtainment of the signal $S_{HB}$. Furthermore, a region in the vicinity of the above-described region can also be included in the region of the window portion 102 in which light transmittance is to be decreased.

In Step S12, the light transmittance of the window portion 102 in the region calculated in Step S11 is decreased by the decrease rate $R_D$ obtained in Step S09. Moreover, in the case where the region other than the region calculated in Step S11 in the window portion 102 has a decreased light transmittance, the light transmittance of the window portion 102 in that region is returned to the original light transmittance.

In Step S13, the arithmetic circuit 113 obtains data on the oncoming car from the sensor 104 in a manner similar to that of Step S01. The data is output to the arithmetic circuit 113 as the signal $S_{OC}$ as described above.

In Step S14, the arithmetic circuit 113 judges whether the oncoming car has been sensed on the basis of the signal $S_{OC}$ in a manner similar to that of Step S02. Thus, whether the oncoming car sensed in Step S01 has passed by the mobile unit 100 can be judged. In the case where the oncoming car has been sensed, go to Step S15.

In Step S15, the arithmetic circuit 113 obtains data on the state of light that is being emitted by the oncoming car from the sensor 104 in a manner similar to that of Step S03. The data is output to the arithmetic circuit 113 as the signal $S_{HL}$ as described above. Thus, whether the oncoming car is emitting high beams can be judged.

In Step S16, the arithmetic circuit 113 judges whether the oncoming car is emitting high beams, on the basis of the signal $S_{HL}$ in a manner similar to that of Step S04. Thus, whether the oncoming car has switched from high beams to low beams or the like, for example, can be judged. In the case where the oncoming car is continuously emitting high beams, after the data on the relative velocity $V_{RE}$ of the oncoming car seen from the mobile unit 100 is obtained in Step S17, a return to Step S10 is made and data on the position of the eyes of the driver who is riding in the mobile unit 100 and data on the region irradiated with high beams are obtained again.

Note that Step S17 may be omitted. In this case, the relative velocity $V_{RE}$ can be regarded as not having been changed, for example. Furthermore, the data on the position of the eyes of the driver is not necessarily obtained. In this case, the position of the eyes of the driver can be regarded as being similar to the position of the eyes sensed in Step S10 carried out right after the finish of Step S09, for example.

In the case where it is judged in Step S14 that an oncoming car has not been sensed or it is judged in Step S16 that the oncoming car is not emitting high beams, go to Step S18. In Step S18, the light transmittance of the window portion 102, which is decreased in Step S12, is returned to the original transmittance.

After Step S18 is finished, a return to Step S01 is made. Note that Step S18 may be omitted. In this case, in the case where it is judged in Step S14 that an oncoming car has not been sensed or it is judged in Step S16 that the oncoming car is not emitting high beams, a return to Step S01 is made. This is an operation example of the mobile unit and the system for the mobile unit of one embodiment of the present invention.

Figure 3:
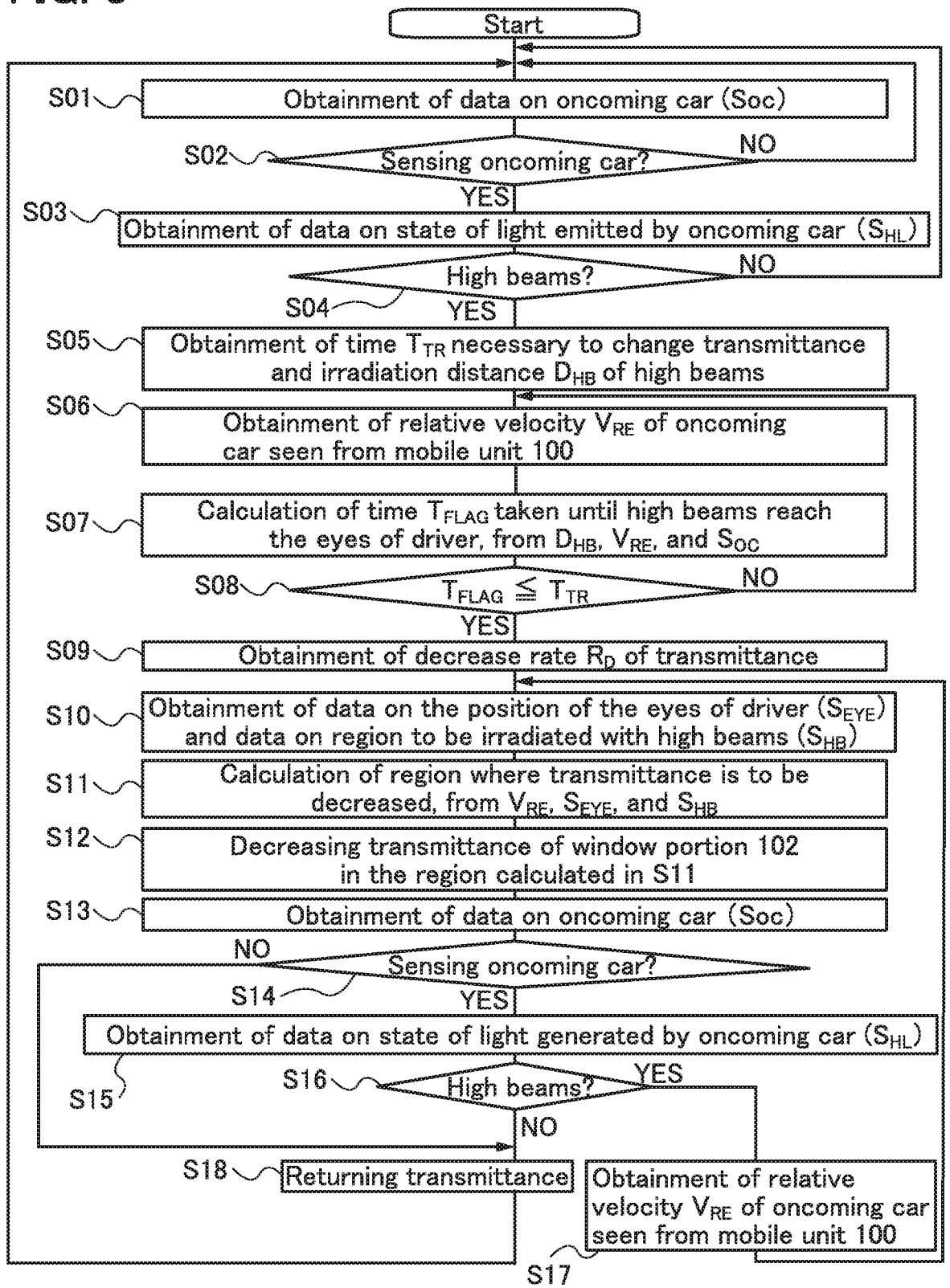
FIG. 3 A flowchart illustrating an example of operation.

Note that the operation procedure shown in FIG. 3 is only an example, and any operation procedure can be employed as long as one embodiment of the present invention can be achieved.

The mobile unit and the system for the mobile unit of one embodiment of the present invention will be described by showing a specific application example. FIG. 4, FIG. 5, FIG. 7, and FIG. 8 illustrate the mobile unit 100 running at a constant velocity V and an oncoming car running at a constant velocity V'. The headlight 131 of the oncoming car 130 is emitting the high beam 132. Note that a position $P_{FLAG}$ represents a location that is the irradiation distance $D_{HB}$ of the high beam 132 away from the oncoming car 130. When the mobile unit 100 reaches the position $P_{FLAG}$, the eyes of the driver who is riding in the mobile unit 100 are irradiated with the high beam 132. That is, the time $T_{FLAG}$ represents the time necessary for the mobile unit 100 to reach the position $P_{FLAG}$.

Figure 4:
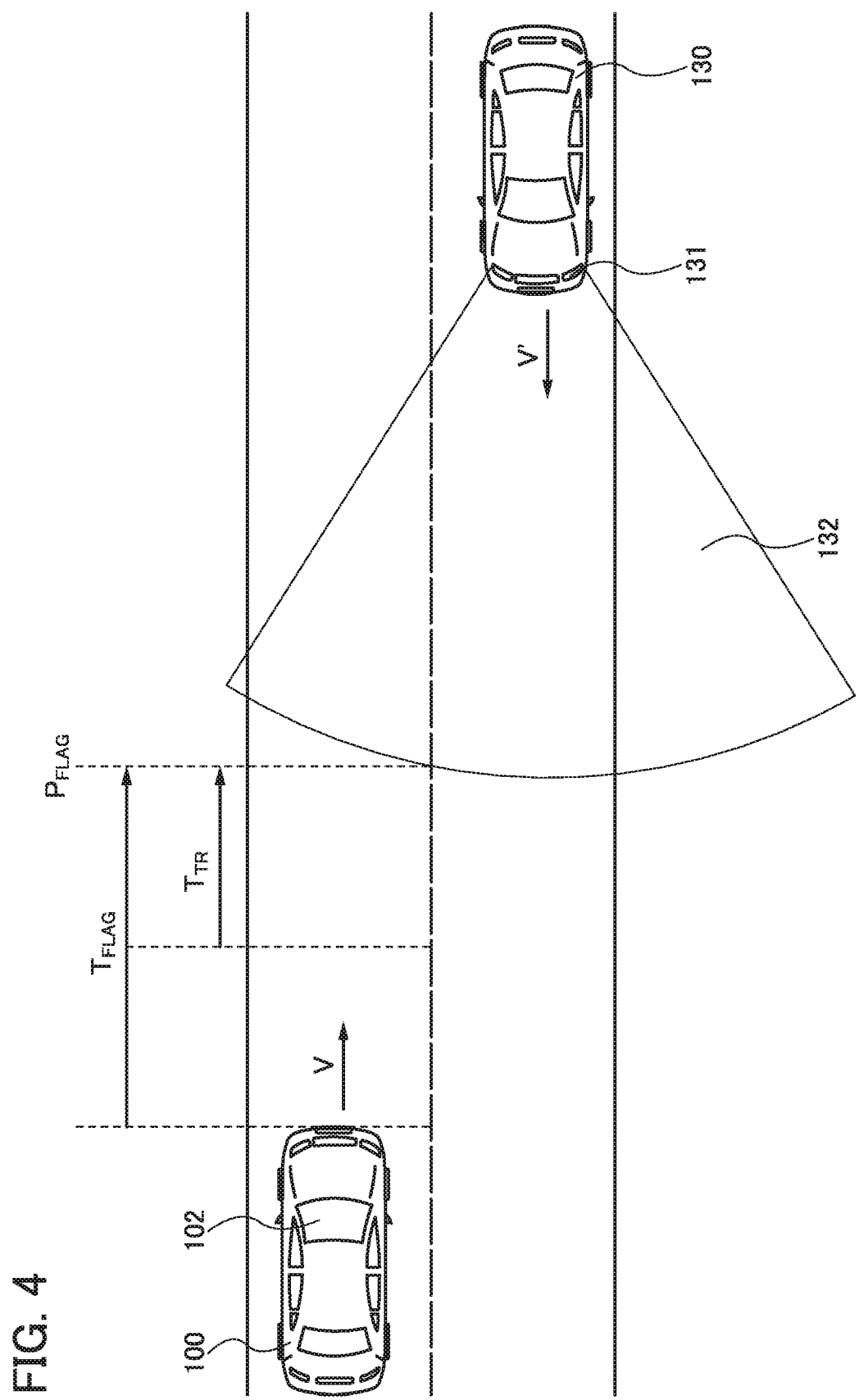
FIG. 4 A view for illustrating an example of operation.

FIG. 4 illustrates a case in which the eyes of the driver who is riding in the mobile unit 100 are not being irradiated with the high beam 132, and in addition, the time $T_{FLAG}$ is longer than the time $T_{TR}$ spent in changing the light transmittance of the window portion 102. In this case, the driver does not perceive glare even if the window portion 102 is in a state of having a high light transmittance.

Figure 5:
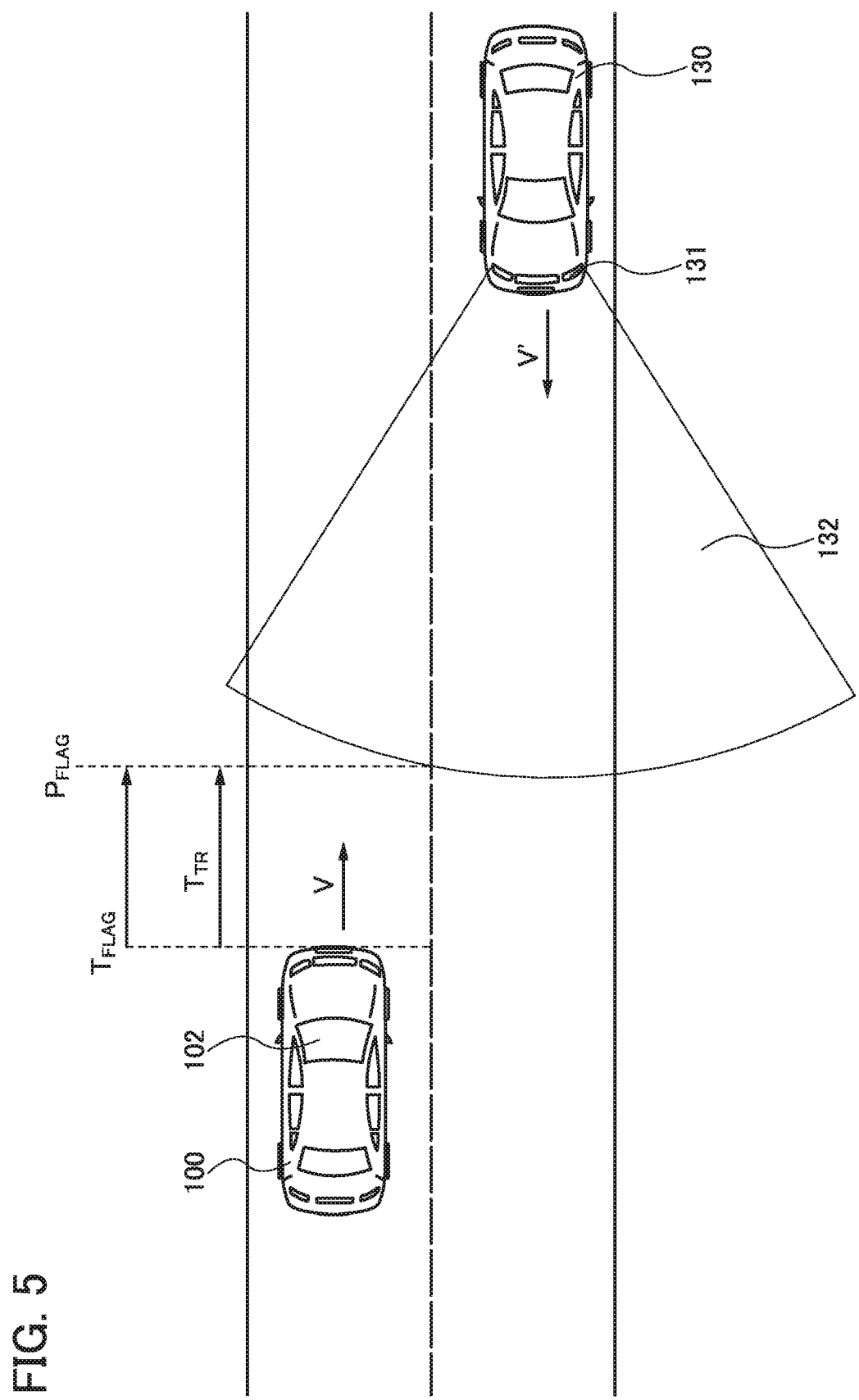
FIG. 5 A view for illustrating an example of operation.
Figure 6:
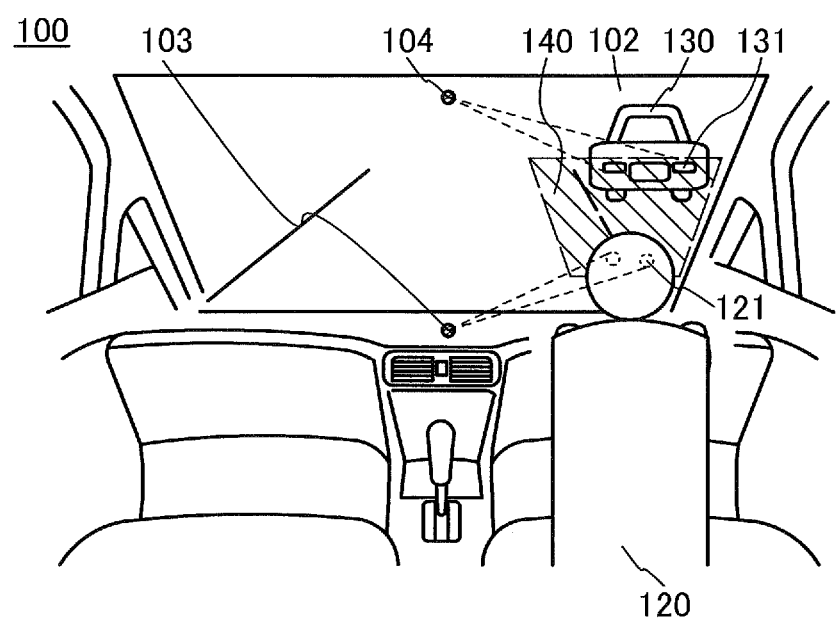
FIG. 6 A view for illustrating an example of operation.

After time has passed from the state of FIG. 4, a state of FIG. 5 is made. FIG. 5 illustrates a case in which the mobile unit 100 becomes closer to the oncoming car 130 than the state of FIG. 4 and the time $T_{FLAG}$ is equal to the time $T_{TR}$. In addition, the inside of the mobile unit 100 in that case is illustrated in FIG. 6. Note that in FIG. 6, the high beam 132 is not illustrated.

In the case where the state of FIG. 5 is made, the position of eyes 121 of a driver 120 riding in the mobile unit 100 is sensed by the sensor 103 illustrated in FIG. 6. Moreover, a region that is to be irradiated with the high beam 132 emitted by the headlight 131 of the oncoming car 130 is sensed by the sensor 104 illustrated in FIG. 6. Then, a region 140 of the window portion 102 in which light transmittance is to be changed is calculated from the position of the eyes 121, the position of the high beam 132, and the like, which have been sensed, and the transmittance of the region 140 is changed. Accordingly, the glare perceived by the driver 120 can be reduced, and in addition, a reduction in visibility can be suppressed more than the case of changing the transmittance over the entire window portion 102.

Figure 7:
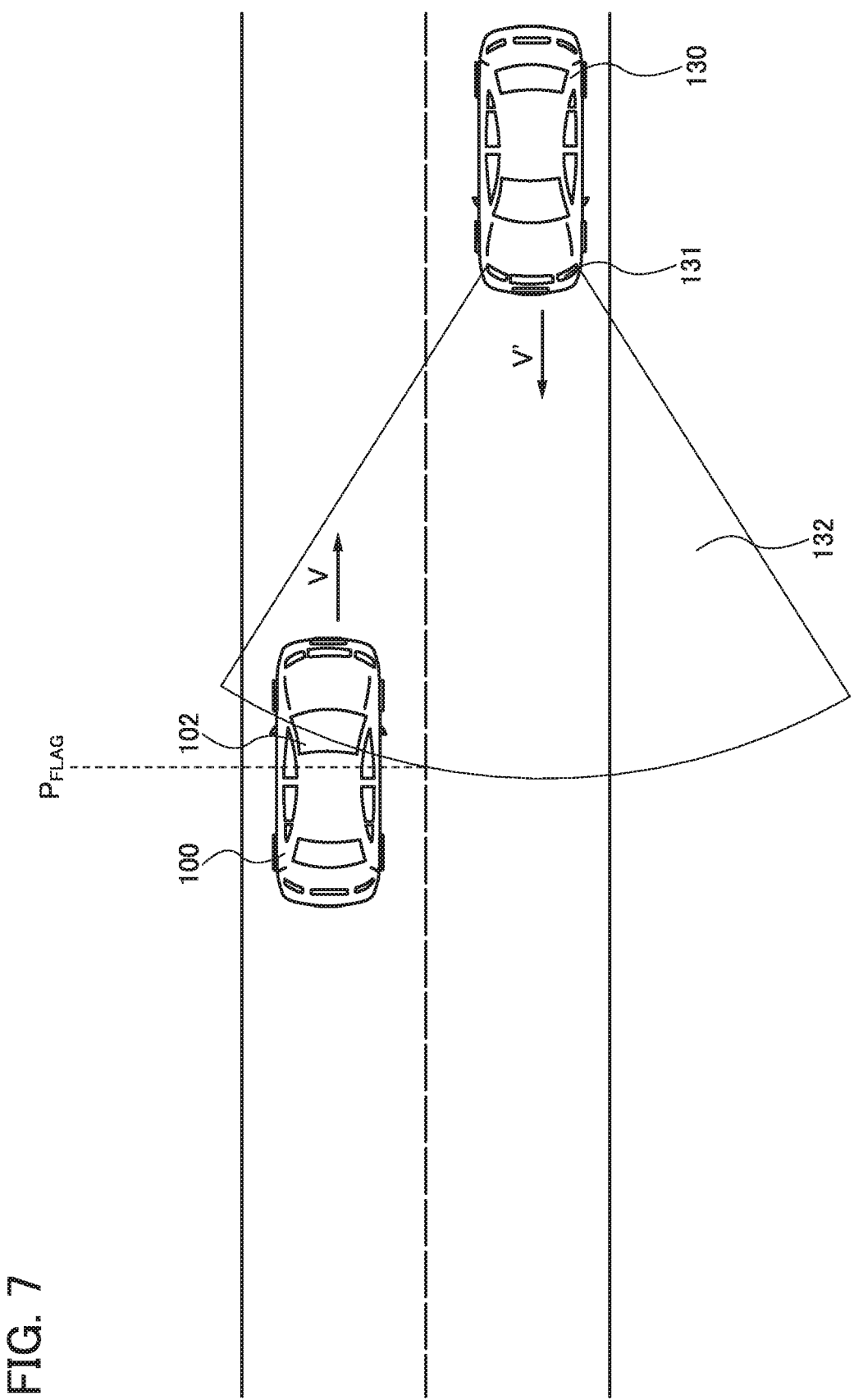
FIG. 7 A view for illustrating an example of operation.

After time has passed from the state of FIG. 5, a state of FIG. 7 is made. FIG. 7 illustrates a case in which the mobile unit 100 has become closer to the oncoming car 130 than the state of FIG. 5 and passed the position $P_{FLAG}$ but the eyes 121 illustrated in FIG. 6 are continuously being irradiated with the high beam 132. In this case also, the position of the high beam 132 keeps being sensed and the position of the region 140 is changed in accordance with changes in the position of the high beam 132. In addition, the light transmittance of the window portion 102 in the region 140 is decreased. In the case where the window portion 102 in the region other than the region 140 has a decreased light transmittance, the light transmittance of the window portion 102 in that region is returned to the original light transmittance.

Note that as described above, the region 140 can be, for example, a region between the region irradiated with the high beam 132 and the eyes 121 at any of the times from the time of obtaining the signal $S_{HB}$ to the time when the time $T_R$ has passed from the obtainment of the signal $S_{HB}$. Furthermore, a region in the vicinity of the above-described region can also be included in the region 140.

Figure 8:
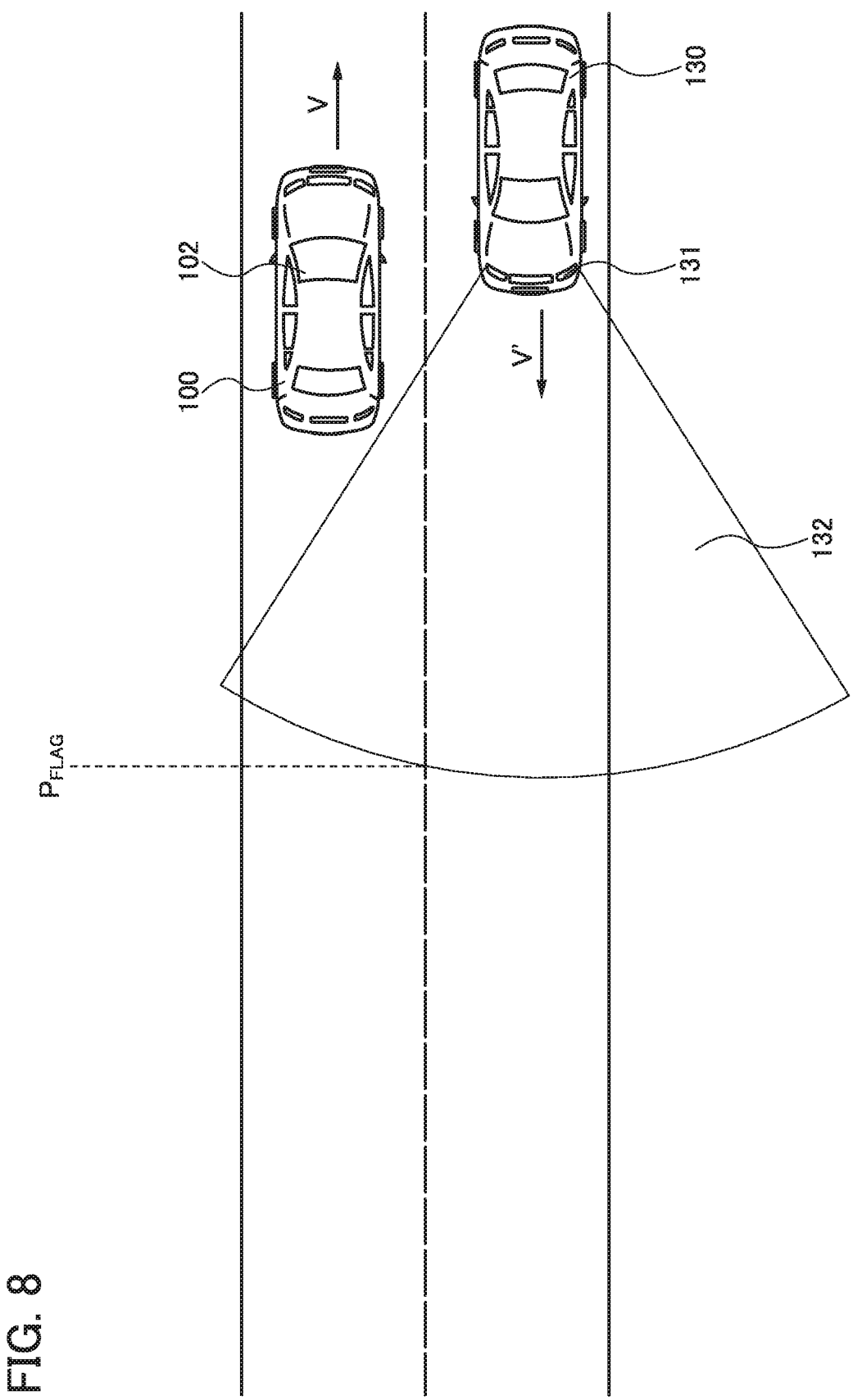
FIG. 8 A block diagram of an imaging element.

After time has passed from the state of FIG. 7, a state of FIG. 8 is made. FIG. 7 illustrates a case in which the eyes 121 illustrated in FIG. 6 are not irradiated with the high beam 132 anymore. In the case where this state is made, the decreased transmittance in all the region in the window portion 102 is returned to the original transmittance.

Note that in the states of from FIG. 5 to FIG. 7, in the case where the headlight 131 of the oncoming car 130 has ceased emitting the high beam 132, for example in the case where a switch from the high beam 132 to the low beam 133 is conducted, the decreased transmittance is returned to the original transmittance in all the region in the window portion 102.

The application example illustrated in FIG. 4 to FIG. 8 is merely an example, and the application is possible in an arbitrary situation as long as one embodiment of the present invention can be achieved.

Figure 9A:
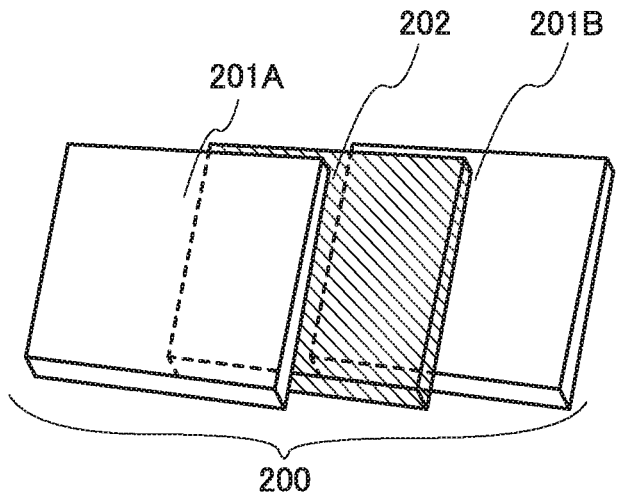
FIGS. 9A-9C Views for illustrating structure examples of a liquid crystal panel.

Next, a structure that can be applied to the window portion 102 will be described. FIG. 9(A) illustrates a liquid crystal panel 200 that can be used in the window portion 102.

The liquid crystal panel 200 of FIG. 9(A) includes a substrate 201A, a substrate 201B, and a liquid crystal 202. The substrate 201A and the substrate 201B include electrodes, so that an electric field applied to a liquid crystal can be controlled and the light transmittance can be controlled.

Examples of a method for driving the liquid crystal include a TW (Twisted Nematic) mode, a STN (Super Twisted Nematic) mode, a VA mode, an ASM (Axially Symmetric Aligned Micro-cell) mode, an OCB (Optically Compensated Birefringence) mode, a FLC (Ferroelectric Liquid Crystal) mode, an AFLC (AntiFerroelectric Liquid Crystal) mode, an MVA mode, a PVA (Patterned Vertical Alignment) mode, an IPS mode, an FFS mode, a TBA (Transverse Bend Alignment) mode, and the like. Other than the above-described driving methods, there are an ECB (Electrically Controlled Birefringence) mode, a PDLC (Polymer Dispersed Liquid Crystal) mode, a PNLC (Polymer Network Liquid Crystal) mode, and a guest-host mode as the method for driving the liquid crystal.

The liquid crystal has a normally black mode where light transmittance is low when the voltage is 0 and a normally white mode where light transmittance is high when the voltage is 0. In the case where a normally black mode liquid crystal panel is formed, a VA mode or IPS mode liquid crystal is used. In the case where a normally white mode liquid crystal panel is formed, a TN mode or OCB mode liquid crystal is used.

As the liquid crystal, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, a liquid crystal exhibiting a blue phase for which an alignment film is not used may be used. The blue phase is one of liquid crystal phases, which is generated just before a cholesteric phase changes into an isotropic phase when the temperature of a cholesteric liquid crystal is increased. Since the blue phase appears only in a narrow temperature range, a liquid crystal composition in which 5 weight percent or more of a chiral material is mixed is used for the liquid crystal layer in order to improve the temperature range. The liquid crystal composition that includes the liquid crystal exhibiting a blue phase and a chiral material has a short response time of 1 msec or less and has optical isotropy, which makes the alignment process unnecessary and the viewing angle dependence small. In addition, since an alignment film does not need to be provided and rubbing treatment is unnecessary, electrostatic discharge caused by the rubbing treatment can be prevented.

Figure 9B:
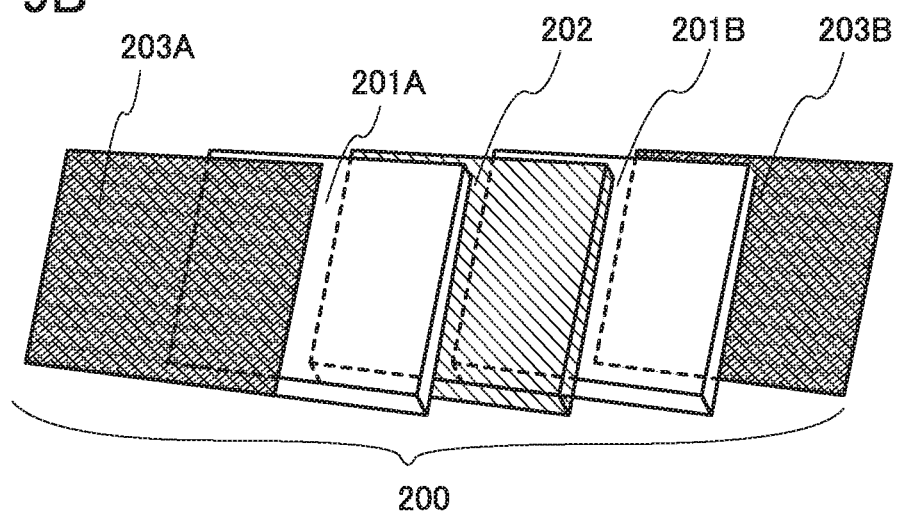

The liquid crystal panel 200 of FIG. 9(B) includes a polarizing plate 203A and a polarizing plate 203B in addition to the substrate 201A, the substrate 201B, and the liquid crystal 202.

Figure 9C:
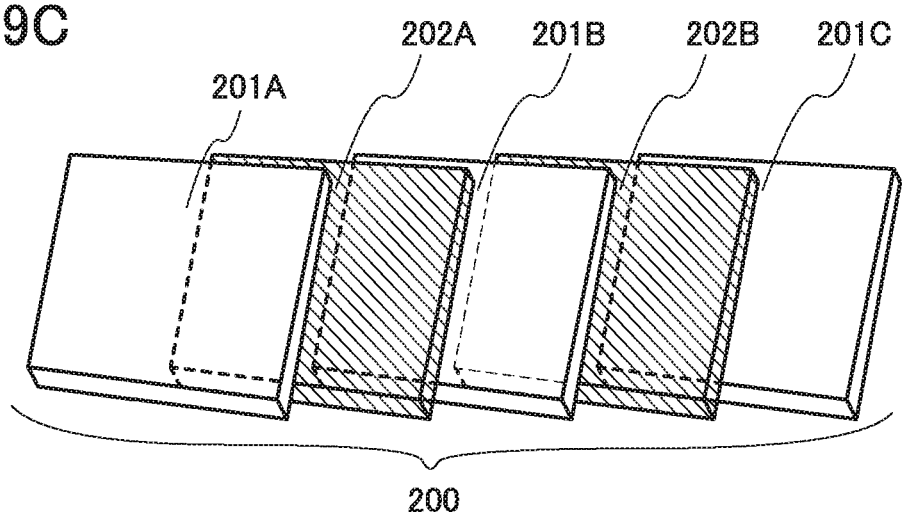

The liquid crystal panel may have a structure including a liquid crystal in a plurality of layers. The liquid crystal panel 200 of FIG. 9(C) includes a substrate 201C, a liquid crystal 202A, and a liquid crystal 202B in addition to the substrate 201A and the substrate 201B. With this structure, the individual layers including the liquid crystal can be controlled separately, and a complex control of light transmittance can be achieved.

Figure 10A:
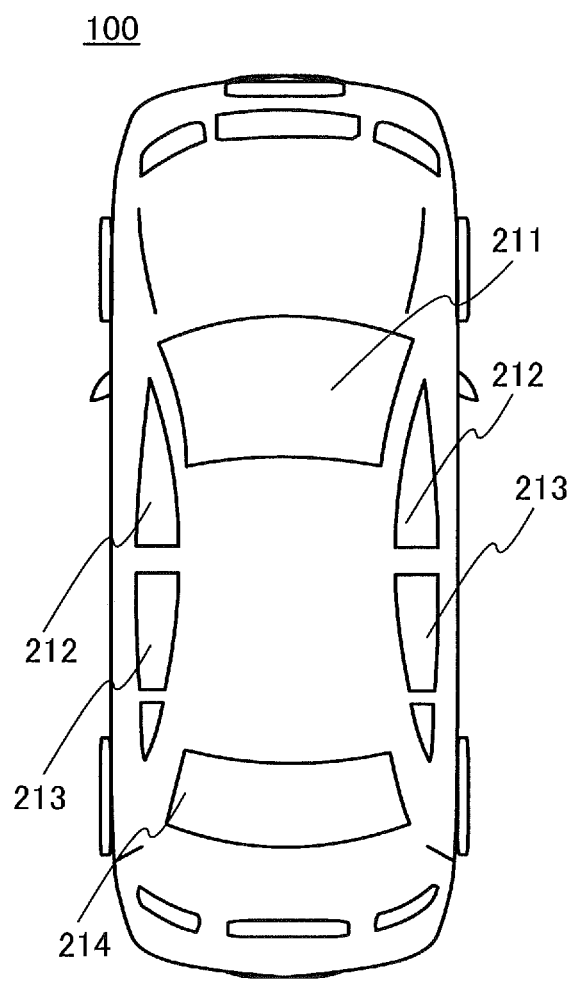
FIGS. 10A-10B Views for illustrating usage examples of a liquid crystal panel.

FIG. 10(A) illustrates a view of the mobile unit 100 seen from the above. FIG. 10(A) illustrates a windshield 211, a front door glass 212, a rear door glass 213, and a back glass 214 as the window portion of the mobile unit 100. The liquid crystal panel 200 described with FIGS. 9(A), (B) can be used in at least the windshield 211. Furthermore, one embodiment of the present invention may be used in a sun visor or the like as well as in the window portion.

Figure 10B:
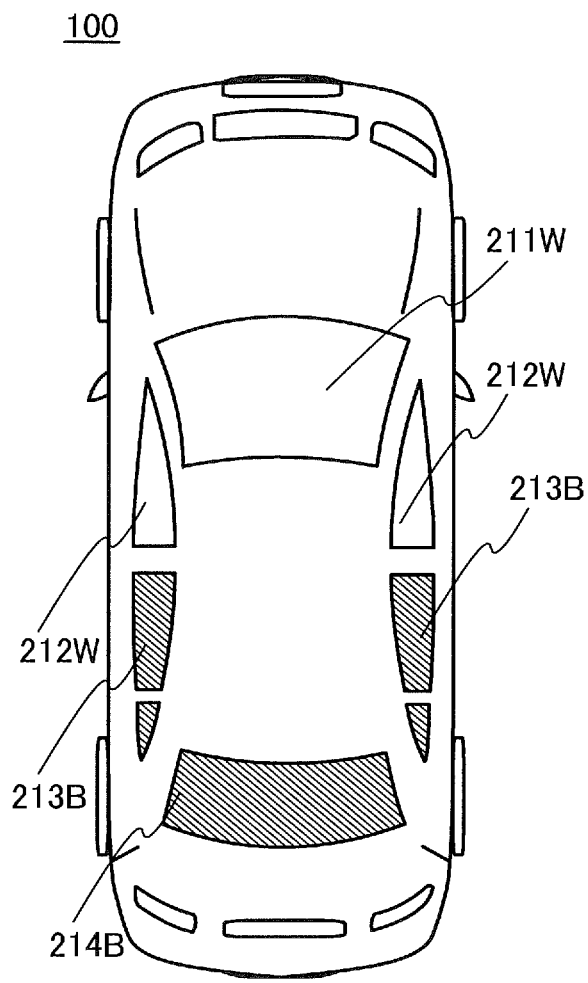

Like FIG. 10(A), FIG. 10(B) illustrates a view of the mobile unit 100 seen from the above. As describe above, a normally white mode liquid crystal or a normally black mode liquid crystal can be used as the liquid crystal of the liquid crystal panel 200. In FIG. 10(B), an example in which a liquid crystal panel including a normally white mode liquid crystal is used as a windshield 211W and a front door glass 212W and a liquid crystal panel including a normally black mode liquid crystal is used as a rear door glass 213B and a back glass 214B is illustrated.

With the structure of FIG. 10(B), no transmission of light can be allowed in the window portion near the rear seats in the state without a voltage application; accordingly, privacy of the occupant can be assured. Furthermore, with the structure of FIG. 10(B), transmission of light can be allowed in the window portion near the front seats; thus, transmission of light can be ensured even in the situation where electrical control is difficult.

Figure 11:
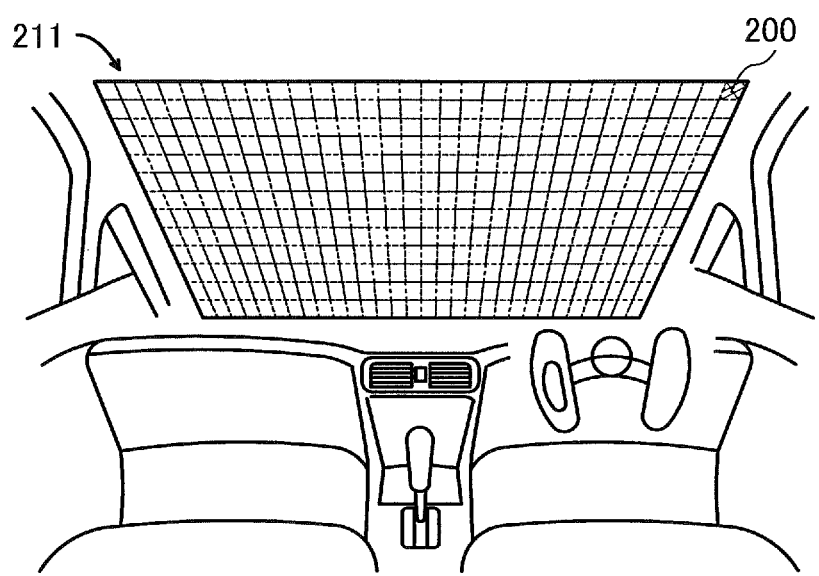
FIG. 11 A view for illustrating a usage example of a liquid crystal panel.

FIG. 11 illustrates a schematic view in which the liquid crystal panel 200 described with reference to FIGS. 9(A), (B) is used in the windshield 211 in the panel shape. As illustrated in FIG. 11, the windshield 211 is filled with the liquid crystal panels 200. With this structure, the individual liquid crystal panels can be controlled to have different light transmittances. With this structure, the light transmittance of only the liquid crystal panel between the region irradiated with high beams emitted by the oncoming car and the eyes of the driver who is riding in the mobile unit 100 can be controlled, for example. Moreover, the light transmittance of only the liquid crystal panel between the region irradiated with high beams emitted by the oncoming car and the eyes of the driver who is riding in the mobile unit 100 and the liquid crystal panel provided in the vicinity of the liquid crystal panel can be controlled, for example. Note that a material that does not transmit infrared rays and/or ultraviolet rays or the like may be used as the windshield 211 in the structure illustrated in FIG. 11.

Next, the sensors included in the mobile unit 100 will be described. The sensor 103 and the sensor 104 may have the same performance or difference performances. For example, as the sensor 104, a sensor with a high light-dark dynamic range is preferably used so that the oncoming car and whether light emitted by the oncoming car is high beam is correctly sensed. Furthermore, for example, as the sensor 104, a sensor with a high frame frequency is preferably used so that the region irradiated with high beams emitted by the oncoming car can be correctly sensed even when the oncoming car is moving at high speed. Moreover, a sensor having a lower performance than the sensor 104 may be used as the sensor 103. In other words, the sensor 103 may have a lower light-dark dynamic range than the sensor 104 and a lower frame frequency than the sensor 104. By using a sensor with lower performance than the sensor 104 as the sensor 103, a mobile unit of one embodiment of the present invention can be manufactured at low cost.

Note that in the case where the mobile unit 100 includes the sensor 105 in addition to the sensor 103 and the sensor 104 as illustrated in FIG. 1(B), the sensor 104 and the sensor 105 preferably have higher performance than the sensor 103. In other words, the sensor 104 and the sensor 105 preferably have a higher light-dark dynamic range than the sensor 103 and in addition a higher frame frequency than the sensor 103.

Figure 12:
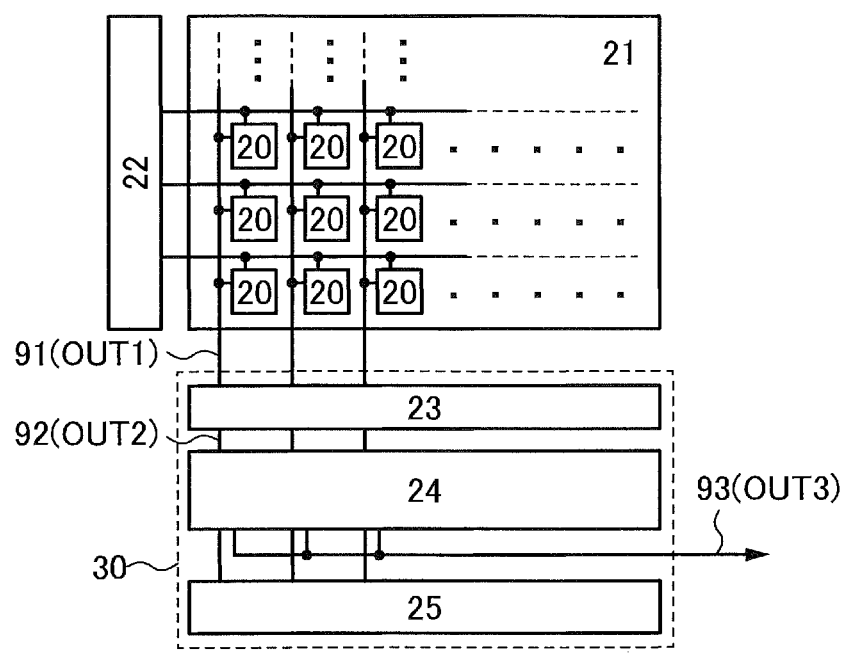
FIG. 12 A block diagram illustrating a structure example of an imaging device.

FIG. 12 is a block diagram illustrating a circuit configuration of an imaging device, such as a sensor, included in a mobile unit of one embodiment of the present invention. The imaging device includes a pixel array 21 including the pixels 20 arranged in a matrix, a circuit 22 (row driver) having a function of selecting a row of the pixel array 21, a circuit 23 (CDS circuit) for performing a CDS operation on an output signal of the pixel 20, a circuit 24 (A/D converter circuit or the like) having a function of converting analog data output from the circuit 23 to digital data, and a circuit 25 (column driver) having a function of selecting and reading data converted in the circuit 24. Note that a configuration not provided with the circuit 23 can also be employed. Furthermore, the circuits 22 to 25 are collectively referred to as a circuit 30.

Figure 13A:
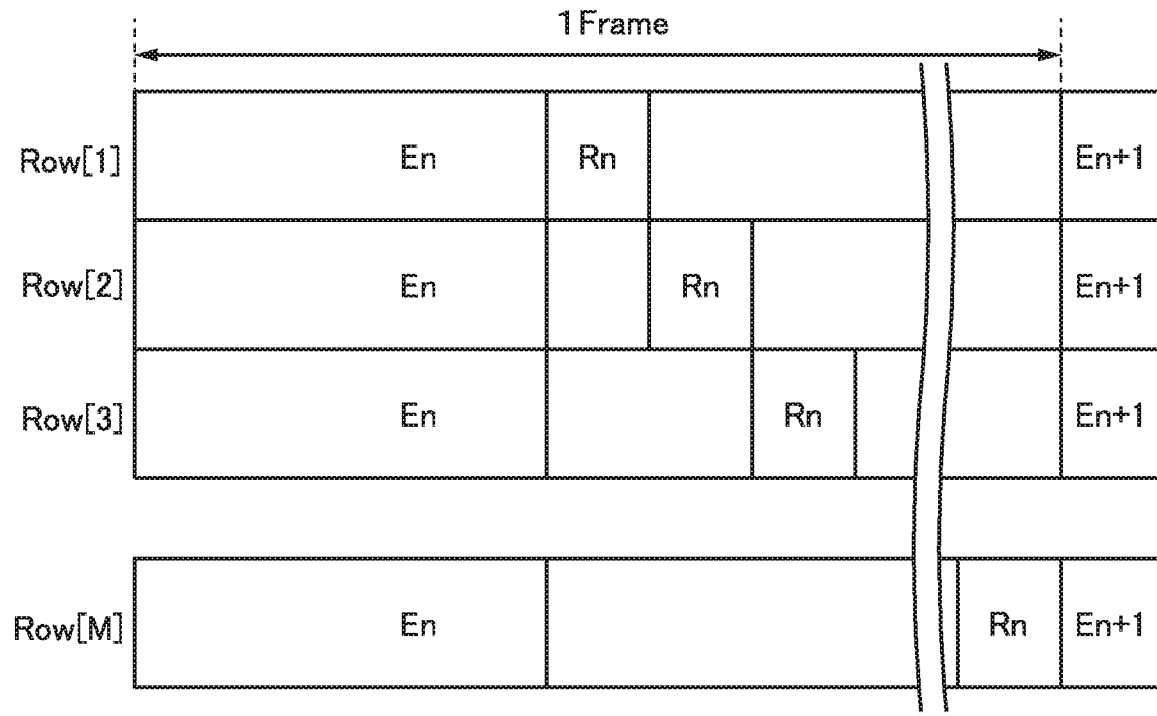
FIGS. 13A-13B Views for illustrating a global shutter and a rolling shutter operation.
Figure 13B:
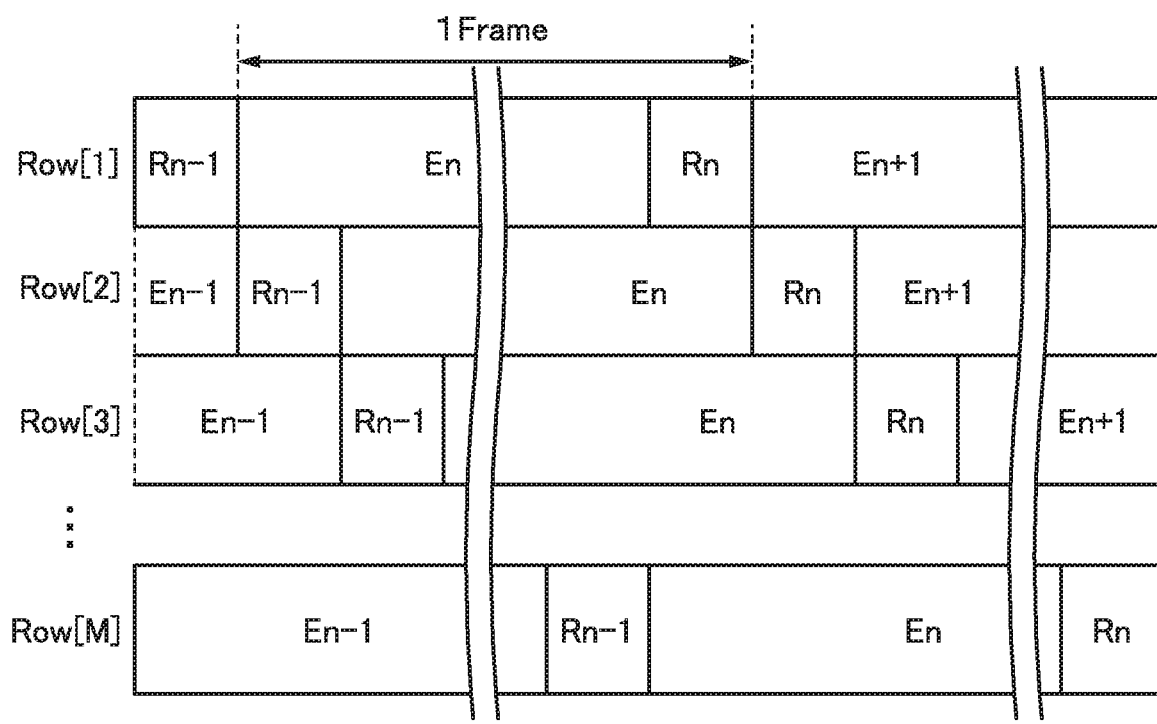

An imaging element 11 can operate by a global shutter method and a rolling shutter method. FIG. 13(A) is a schematic view of an operation method with a global shutter method, and FIG. 13(B) is a schematic view of an operation method with a rolling shutter method. In FIGS. 13(A), (B), "E" represents a period in which a light exposure operation can be performed, and "R" represents a period in which a reading operation can be performed. Moreover, n represents a given n-th frame (n is a natural number of 2 or more); n−1 represents a frame previous to the n-th frame; and n+1 represents a frame following the n-th frame. Pixels are assumed to be arranged in a matrix as illustrated in FIG. 12. Furthermore, Row[1] represents a pixel in a first row, and Row[M] represents a pixel in an M-th row (last row).

FIG. 13(A) is a schematic view of the operation method with the global shutter method. The global shutter method is an operation method in which light exposure is simultaneously performed on all pixels and then data reading is performed row by row. Thus, an image without distortion can be obtained even when a moving object is captured. That is, the sensor 104 and the sensor 105 preferably include the imaging element 11 which operates by the global shutter method.

FIG. 13(B) is a schematic view of the operation method with the rolling shutter method. The rolling shutter method is an operation method in which light exposure and data reading are sequentially performed row by row. Since imaging cannot be simultaneously performed on all pixels, distortion is caused in a captured image of a moving object. Although the details are described later, however, in the case where some transistors are shared by a plurality of pixels, the pixel 20 included in the imaging element 11 which operates by the rolling shutter method can reduce the number of transistors included in one pixel 20 more than the pixel 20 included in the imaging element 11 which operates by the global shutter method. Accordingly, the imaging element 11 can be reduced in size. Thus, it is preferable that the sensor 103 include the imaging element 11 which operates by the rolling shutter method because the sensor 103 can be reduced in size.

Figure 14:
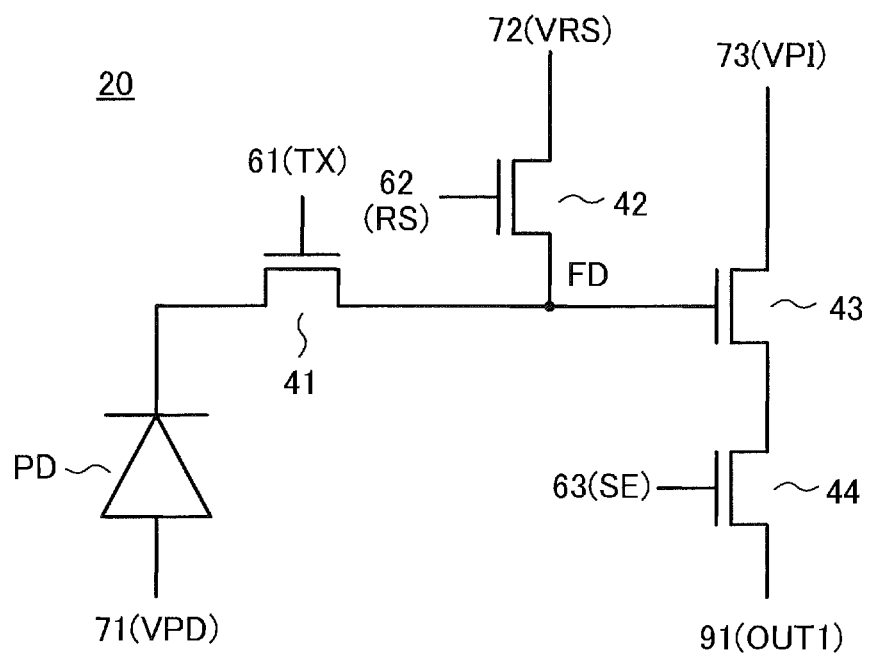
FIG. 14 A view illustrating a pixel circuit.

FIG. 14 is a circuit diagram of the pixel 20. Note that an example in which transistors are n-channel transistors is shown in the description below; however, without limitation to this, some transistors may be replaced with p-channel transistors.

The pixel 20 includes a photoelectric conversion element PD and transistors 41 to 44. In addition, one electrode of the photoelectric conversion element PD is electrically connected to one of a source and a drain of the transistor 41. The other of the source and the drain of the transistor 41 is electrically connected to one of a source and a drain of a transistor 42. The other of the source and the drain of the transistor 41 is electrically connected to a gate of a transistor 43. One of a source and a drain of the transistor 43 is electrically connected to one of a source and a drain of a transistor 44.

Here, a node FD to which the other of the source and the drain of the transistor 41, the one of the source and the drain of the transistor 42, and the gate of the transistor 43 are connected is a charge accumulation portion.

The other electrode of the photoelectric conversion element PD is electrically connected to a wiring 71 (VPD). The other of the source and the drain of the transistor 42 is electrically connected to a wiring 72 (VRS). The other of the source and the drain of the transistor 43 is electrically connected to a wiring 73 (VPI). The other of the source and the drain of the transistor 44 is electrically connected to a wiring 91 (OUT1).

Note that the way of connection between a component such as a transistor or a photoelectric conversion element and a wiring is an example. Components might be electrically connected to different wirings, or a plurality of components might be electrically connected to the same wiring.

The wiring 71 (VPD), the wiring 72 (VRS), and the wiring 73 (VPI) function as power supply lines. For example, the wiring 71 (VPD) can function as a low-potential power supply line. The wiring 72 (VRS) and the wiring 73 (VPI) can function as high-potential power supply lines.

A gate of the transistor 41 is electrically connected to a wiring 61 (TX). A gate of the transistor 42 is electrically connected to a wiring 62 (RS). A gate of the transistor 44 is electrically connected to a wiring 63 (SE).

The wiring 61 (TX), the wiring 62 (RS), and the wiring 63 (SE) can each function as a signal line for controlling the conduction of the transistor to which the wiring is connected.

The transistor 41 can function as a transistor for transferring the potential of the cathode of the photoelectric conversion element PD to the node FD. The transistor 42 can function as a transistor for resetting the potential of the node FD. The transistor 43 can function as a transistor for performing the output in accordance with the potential of the node FD. The transistor 44 can function as a transistor for selecting the pixel 20.

Note that the above structure of the pixel 20 is just an example, and some of the circuits, the transistors, the capacitor, the wirings, or the like are not included in some cases. Alternatively, a circuit, a transistor, a capacitor, a wiring, or the like that is not included in the above structure may be included; or the way of connecting some wirings may be different from that described above.

Transistors that use an oxide semiconductor in their channel formation regions (hereinafter, OS transistors) can be used as the transistor 41 and the transistor 42. An OS transistor has a lower off-state current than a transistor that uses silicon in its channel formation region (hereinafter, a Si transistor). That is, when OS transistors are used as the transistor 41 and the transistor 42, charge accumulated in the node FD can be retained for a long period. Thus, a global shutter method in which a charge accumulation operation is performed in all the pixels at the same time can be used without a complicated circuit configuration or a complicated operation method. For this reason, OS transistors are preferably used as the transistor 41 and the transistor 42 included in the sensor 104 and the sensor 105. Note that OS transistors may be used as the transistor 43 and the transistor 44.

The OS transistor has lower temperature dependence of change in electrical characteristics than the Si transistor, and thus can be used in an extremely wide range of temperatures. Therefore, OS transistors are preferably used for a semiconductor device such as a sensor mounted in automobiles and the like.

Figure 15A:
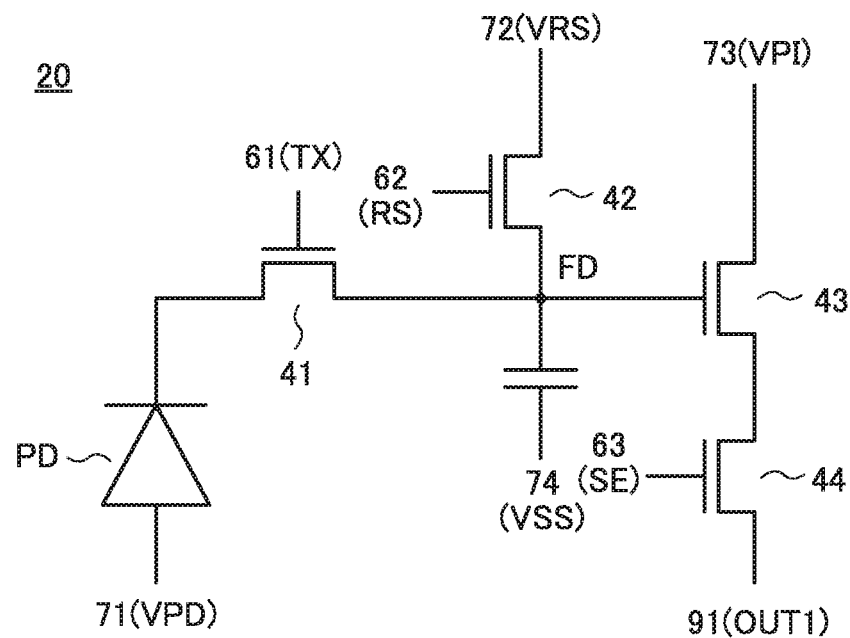
FIGS. 15A-15B Views illustrating pixel circuits.
Figure 15B:
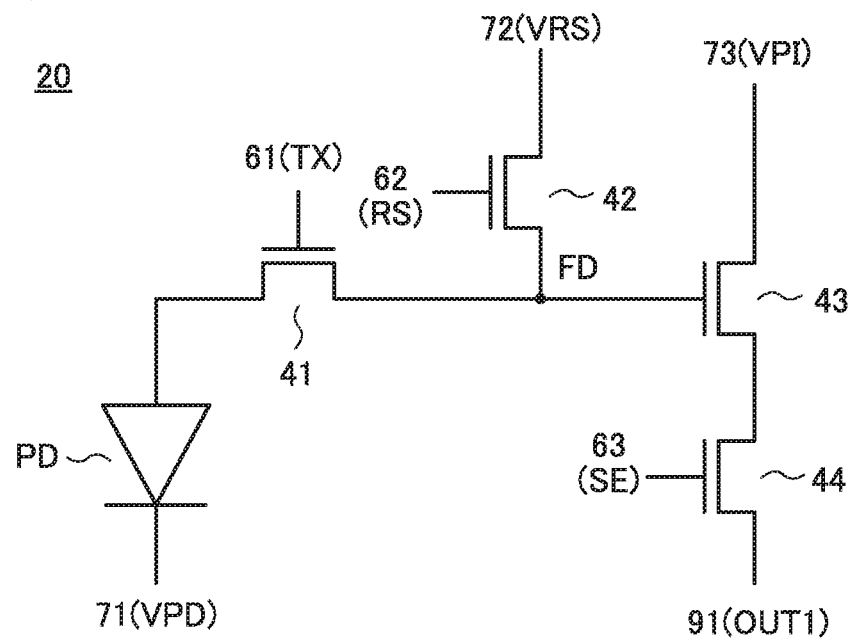

Note that the pixel 20 may have a configuration in which a capacitor is connected to the node FD as illustrated in FIG. 15(A). Furthermore, as illustrated in FIG. 15(B), the direction of the photoelectric conversion element PD in the pixel 20 may be opposite to that in FIG. 14.

Figure 16A:
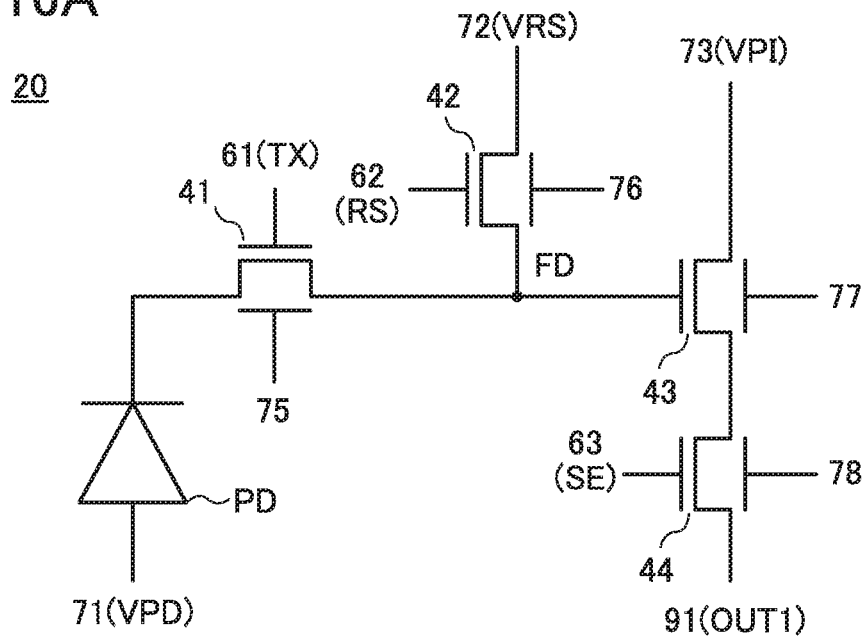
FIGS. 16A-16C Views illustrating pixel circuits.

The transistors used in the pixel 20 may have a circuit configuration as illustrated in FIG. 16(A) in which backgates are provided in the transistor 41 to the transistor 44. FIG. 16(A) illustrates a structure where a constant potential is applied to the backgates, which enables control of the threshold voltages.

Figure 16B:
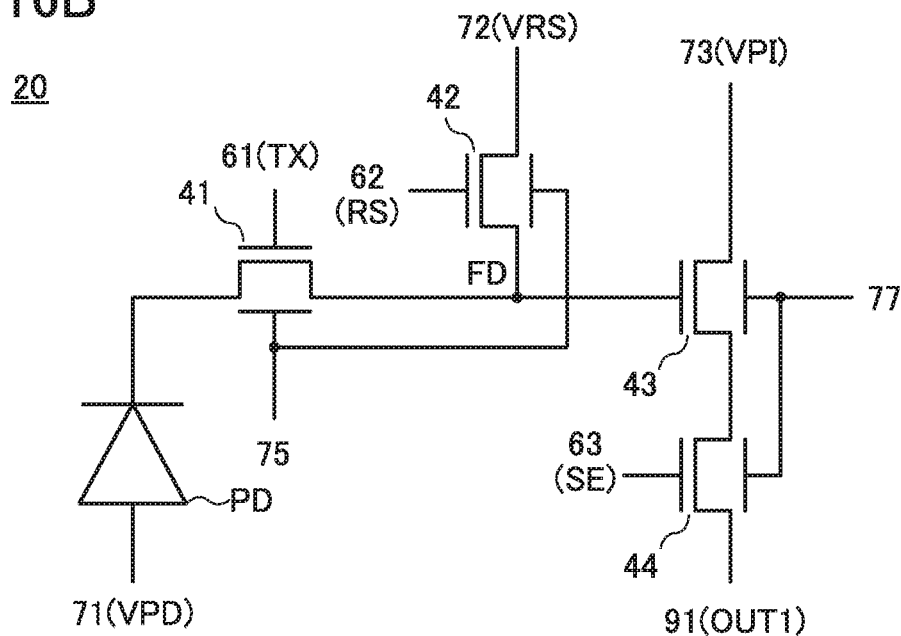

A wiring 75 to a wiring 78 connected to the respective backgates can be supplied with a different potential separately. Alternatively, as illustrated in FIG. 16(B), the wirings connected to the backgates of the transistor 41 and the transistor 42 may be electrically connected to each other, and the wirings connected to the backgates of the transistor 43 and the transistor 44 may be electrically connected to each other.

In an n-channel transistor, the threshold voltage is shifted in the positive direction when a potential lower than a source potential is applied to the backgate. In contrast, the threshold voltage is shifted in the negative direction when a potential higher than a source potential is applied to the backgate. Accordingly, in the case where the on/off of each transistor is controlled with a predetermined gate voltage, the off-state current can be reduced when a potential lower than a source potential is supplied to a backgate, and the on-state current can be increased when a potential higher than a source potential is supplied to the backgate.

As described above, transistors with a high on-state current are preferably used as the transistor 43 and the transistor 44. The on-state current can be increased when a potential higher than a source potential is applied to the backgates of the transistor 43 and the transistor 44. Therefore, a reading potential output to the wiring 91 (OUT1) can be determined immediately, that is, an operation at high frequency is possible.

Figure 16C:
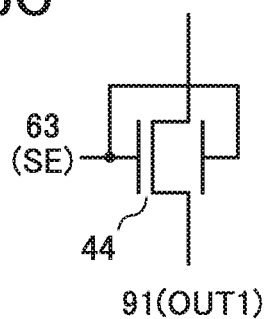

Note that as illustrated in FIG. 16(C), the same potential as that applied to a front gate may be applied to the backgate of the transistor 44.

Besides power supply potentials, a plurality of potentials such as a signal potential and a potential applied to the backgate are used inside an imaging device. Supply of a plurality of potentials from the outside of an imaging device increases the number of terminals and the like; thus, an imaging device preferably has a power supply circuit that generates a plurality of potentials inside the imaging device.

The operation of the pixel circuit in FIG. 16(A) is described using a timing chart illustrated in FIG. 17. In the timing chart, V1 can be a potential higher than a reference potential and can be, for example, a high power supply potential (VDD). V0 can be a reference potential, that is, a source potential and can be, for example, 0 V, a GND potential, and a low power supply potential (VSS).

First, at Time T1, the transistor 41 and the transistor 42 are brought into conduction and the node FD is reset to a reset potential (e.g., VDD) when the potentials of the wiring 75 (RS) and the wiring 61 (TX) are set to V1 (a reset operation). At this time, the on-state currents of the transistor 41 and the transistor 42 are increased when the potentials of the wiring 75 and the wiring 76 are set to potentials higher than V0 (>V0), so that the reset operation can be performed immediately.

At Time T2 when the potential of the wiring 75 (RS) is set to V0, the transistor 42 is brought into non-conduction and the reset operation is terminated to start an accumulation operation. At this time, by setting the potential of the wiring 76 to a potential lower than V0, the off-state current of the transistor 42 can be reduced and the supply of charge to the node FD by a leakage current can be prevented. At Time T2, the potential of the wiring 75 may be set to V0.

At Time T3 when the potential of the wiring 61 (TX) is set to V0, the transistor 41 is brought into non-conduction and the potential of the node FD is defined and held (a holding operation). At this time, by setting the potential of the wiring 75 to a potential lower than V0 (<V0), the off-state current of the transistor 41 can be reduced and leakage of charge from the node FD by a leakage current can be prevented.

At Time T4 when the potential of the wiring 63 (SE) is set to V1, the transistor 44 is brought into conduction and the potential of the wiring 91 (OUT1) changes in accordance with a current flowing through the transistor 43 (a reading operation). At this time, by setting the potentials of the wiring 77 and the wiring 78 to potentials higher than V0 (>V0), the on-state currents of the transistor 43 and the transistor 44 are increased and the potential of the wiring 91 (OUT1) can be defined immediately.

At Time T5 when the potential of the wiring 63 (SE) is set to V0, the transistor 44 is brought into non-conduction, so that the reading operation is completed. Note that the potentials of the wiring 75 and the wiring 76 are preferably held lower than V0 (<V0) so that the potential of the node FD does not change until the reading operation is completed. The potentials of the wiring 75 and the wiring 76 may be changed with the same timing in the above description.

In the above manner, a signal determined in accordance with the potential of the node FD can be read. Note that the pixel 20 in FIG. 14 may be operated without controlling the wirings 75 to 78 in the timing chart illustrated in FIG. 17. The pixel 20 in FIG. 16(B) may be operated without controlling the wiring 76 and the wiring 78 in the timing chart illustrated in FIG. 17.

Figure 18A:
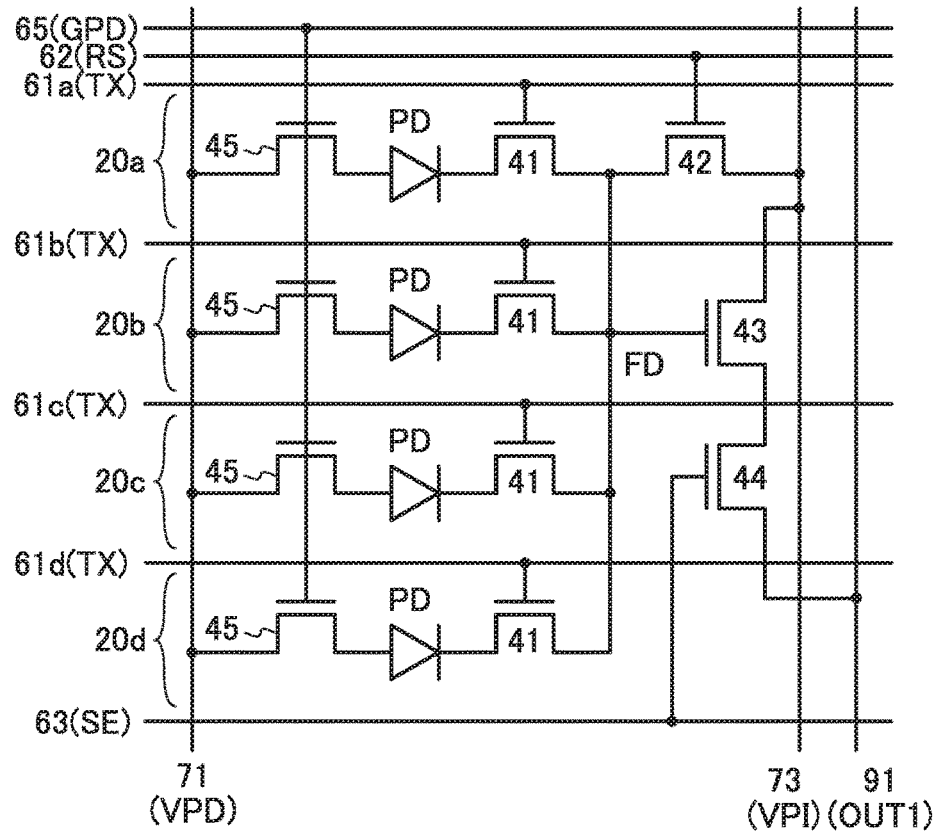
FIGS. 18A-18B Views illustrating pixel circuits.

In a pixel circuit of one embodiment of the present invention, transistors may be shared among a plurality of pixels as illustrated in FIGS. 18(A), (B).

A pixel 20a to a pixel 20d illustrated in FIG. 18(A) in which transistors are shared have a structure in which the pixels each individually include the photoelectric conversion element PD, the transistor 41, and the transistor 45 and share the transistor 42 to the transistor 44. The operations of the transistors 41 included in the pixel 20a to the pixel 20d are controlled by corresponding wirings 61a to 61d. A potential can be held in the cathode of the photoelectric conversion element PD by providing the transistor 45, whose operation is controlled by the potential of a wiring 65 (GPD), between the photoelectric conversion element PD and the wiring 71 (VPD). Thus, this structure is suitable for imaging using a global shutter method, in which a reset operation, an accumulation operation, and a holding operation are performed in all the pixels at the same time and a reading operation is performed pixel by pixel. For this reason, the pixel 20 of the imaging element 11 included in the sensor 104 and the sensor 105 preferably has the circuit configuration illustrated in FIG. 18(A).

Figure 18B:
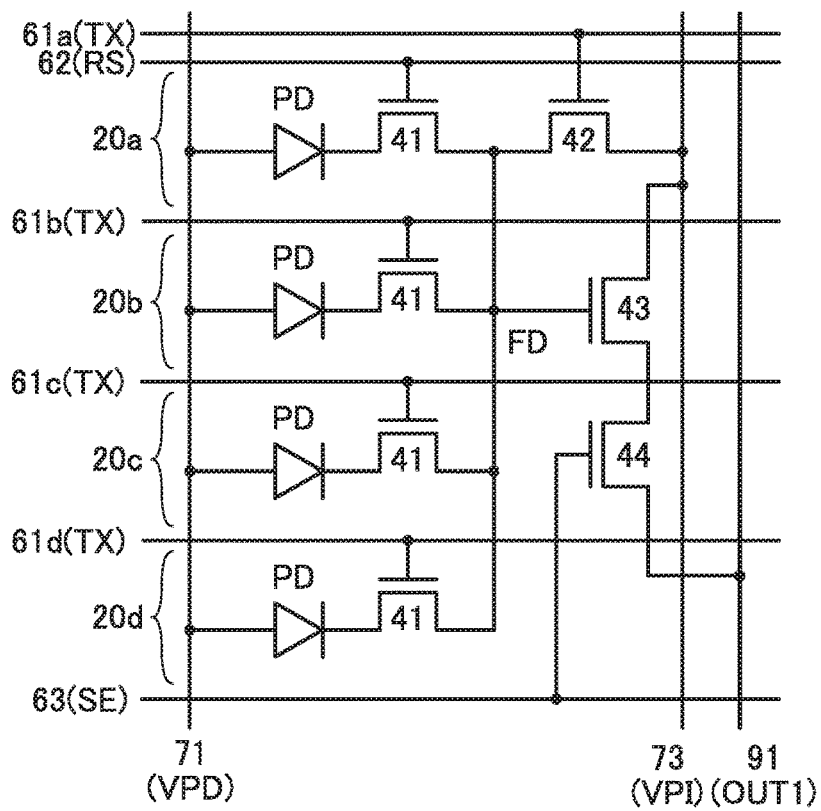

The pixel 20a to the pixel 20d illustrated in FIG. 18(B) in which transistors are shared have a structure in which the pixels each individually include the photoelectric conversion element PD and the transistor 41 and share the transistor 42 to the transistor 44. This structure allows a reset operation, an accumulation operation, a holding operation, and a reading operation to be sequentially performed pixel by pixel and is chiefly suitable for imaging using a rolling shutter method. Since the transistor 45 is not included, the number of transistors per pixel can be reduced. From the above, the pixel 20 of the imaging element 11 included in the sensor 103 preferably has the circuit configuration illustrated in FIG. 18(B).

In the pixel circuits illustrated in FIGS. 18(A), (B), the plurality of pixels (the pixel 20a, the pixel 20b, the pixel 20c, the pixel 20d) aligned in the direction in which the wiring 91 (OUT1) extends (hereinafter, referred to as a vertical direction) share the transistors; however, a plurality of pixels aligned in the direction in which the wiring 64 (SE) extends (hereinafter, referred to as a horizontal direction) may share transistors. Alternatively, a plurality of pixels aligned in the horizontal and vertical directions may share transistors.

Furthermore, the number of pixels that share transistors is not limited to four, and may be two, three, or five or more.

Although the wiring 72 (VRS) and the wiring 73 (VPI) illustrated in FIG. 14 are merged into one wiring and the wiring 72 (VRS) is omitted in the structures in FIGS. 18(A), (B), the wiring 72 (VRS) may be included.

Figure 19A:
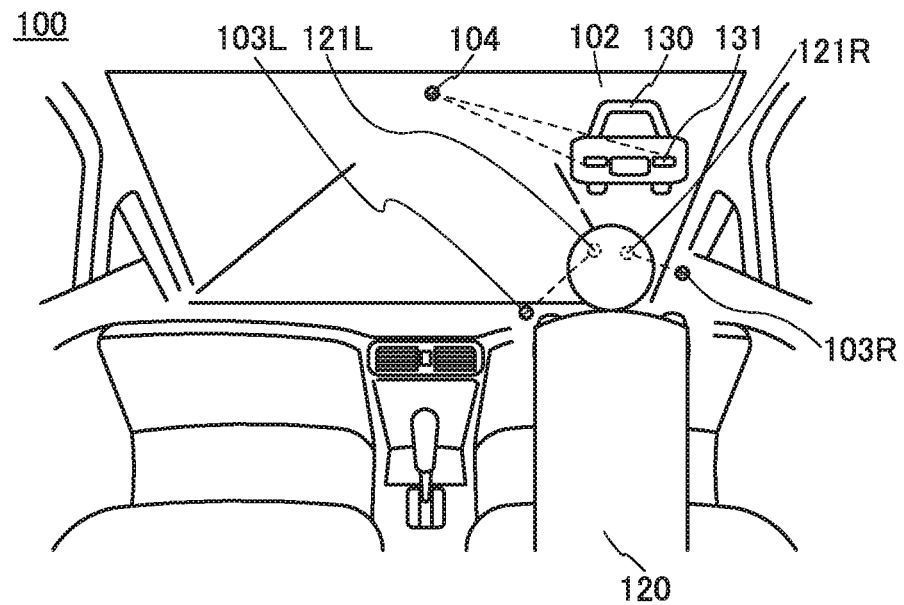
FIGS. 19A-19B Views for illustrating examples of a sensor installation position.

Although a case in which one sensor 103 is provided over a dashboard is illustrated in FIG. 6, one embodiment of the present invention is not limited to this. As illustrated in FIG. 19(A), two sensors 103L and 103R may be provided as the sensor 103, for example. In this case, for example, the position of the left eye 121L of the driver 120 can be sensed by the sensor 103L, and the position of the right eye 121R can be sensed by the sensor 103R. Accordingly, the position of the eyes 121 of the driver 120 can be sensed more precisely.

The sensor 103 can be provided in an arbitrary position other than "over the dashboard", and the sensor 103 may be provided on the window portion 102, for example. Furthermore, in the case where two sensors 103L and 103R are provided as the sensor 103, the sensor 103L and the sensor 103R can be provided in front of the face of the driver 120, for example. The sensor 103L and the sensor 103R can be provided over a dashboard, for example. The sensor 103L can be provided over a dashboard, and the sensor 103R can be provided on a pillar or a side door, for example.

Note that because the sensor 103 has a function of sensing the position of the eyes 121 of the driver 120 who is riding in the mobile unit 100 for example, the sensor 103 is preferably provided inside the mobile unit 100. However, the sensor 103 may be provided outside the mobile unit 100 as well.

One of the sensor 103L and the sensor 103R may be an infrared sensor, and the other of the sensor 103L and the sensor 103R may be a sensor that senses visible light. In this case, the position of the driver 120 can be sensed by the infrared sensor, and the eyes 121 of the driver 120 can be sensed by the sensor that senses visible light. Furthermore, three or more sensors 103 may be provided; in which case, one or more of the sensors 103 may be infrared sensors and the rest of the sensors 103 may be sensors that sense visible light.

Figure 19B:
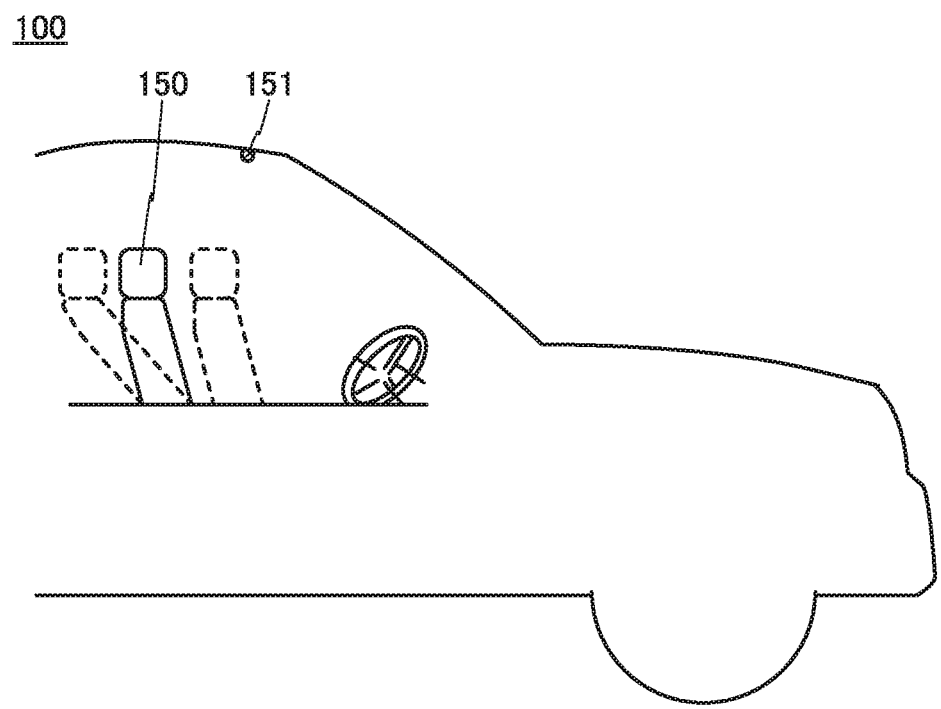

Furthermore, as illustrated in FIG. 19(B), a sensor 151 having a function of sensing the position of a seat 150 provided in a driver's seat, the angle of a backrest, and the like may be provided in the mobile unit 100. This can allow more precise sensing of the position of the eyes 121 of the driver 120. Note that although a structure in which the sensor 151 is provided on the ceiling of the mobile unit 100 is employed in FIG. 19(B), the sensor 151 can be provided in an arbitrary position. For example, the sensor 151 may be provided over a dashboard of the mobile unit 100. For example, the sensor 151 may be provided on the window portion 102 of the mobile unit 100. Furthermore, without the provision of the sensor 151, the position of the seat 150, the angle of the backrest, and the like may be sensed by the sensor 103.

Figure 20:
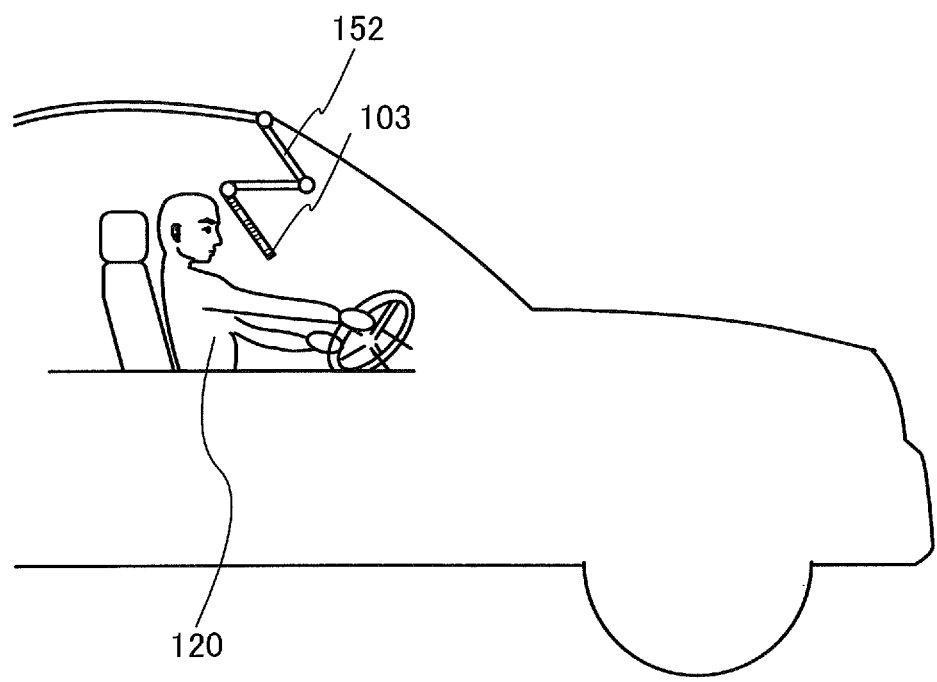
FIG. 20 A view for illustrating an example of a sensor installation position.

Note that although the light transmittance of the window portion 102 is controlled in one embodiment of the present invention, a structure in which a sun visor 152 is placed in the vicinity of the face of the driver 120 as illustrated in FIG. 20 may be employed. In this case, the light transmittance of the sun visor 152 is locally controlled. In addition, the sensor 103 can be provided on the sun visor 152.

Although a case in which one sensor 104 is provided on the window portion 102 is illustrated in FIG. 6, one embodiment of the present invention is not limited to this. As the sensor 104, two sensors 104L and 104R may be provided, for example, which is preferable because the distance between the mobile unit 100 and an oncoming car can be precisely measured, for example.

Figure 21A:
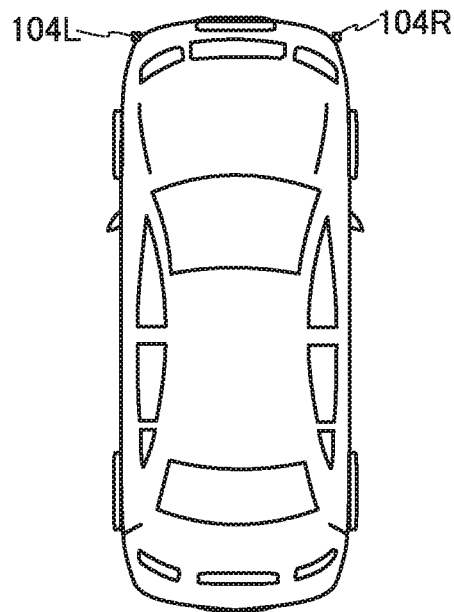
FIGS. 21A-21C Views for illustrating examples of a sensor installation position.
Figure 21B:
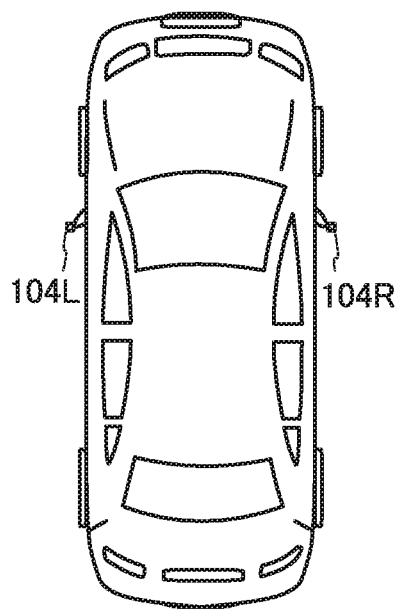
Figure 21C:
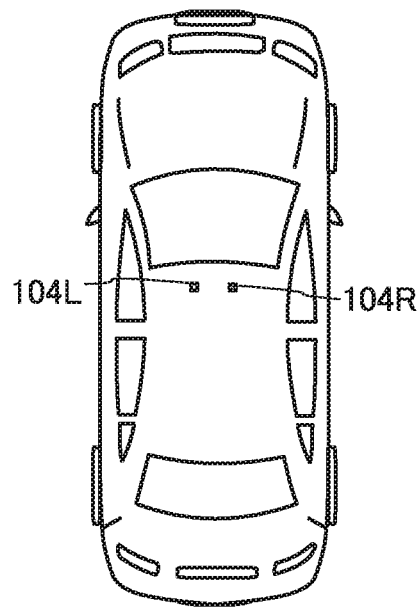

The sensor 104L and the sensor 104R can be provided on a front bumper as illustrated in FIG. 21(A), for example. Furthermore, they can be provided on side mirrors as illustrated in FIG. 21(B), for example. Moreover, they can be provided on a roof as illustrated in FIG. 21(C), for example.

Because the sensor 104 has a function of sensing an oncoming car for example, it is preferably provided outside the mobile unit 100. However, the sensor 104 may be provided inside the mobile unit 100 as well. In the case of providing the sensor 104 inside the mobile unit 100, the sensor 104 can be provided on the window portion 102 as illustrated in FIG. 6, for example. Note that in the case where the sensor 104 is provided on the window portion 102, a structure in which the light transmittance of the window portion 102 in a region in front of the sensor 104 and in the vicinity thereof does not change is preferable. Thus, a decrease in the accuracy of sensing an oncoming car or the like of the sensor 104 can be suppressed.

Note that in the case where the mobile unit 100 includes the sensor 105 as illustrated in FIG. 1(B), FIG. 6 and FIG. 21 can be referred to as appropriate for the position where the sensor 105 is provided. In other words, the sensor 105 can be provided in a position similar to that of the sensor 104. For example, the sensor 104 can be provided on a front bumper, and the sensor 105 can be provided on the window portion 102. Furthermore, for example, the sensor 104 can be provided on a roof, and the sensor 105 can be provided on a front bumper.

In the mobile unit and the system for a mobile unit of one embodiment of the present invention, the light transmittance of the front door glass 212, the rear door glass 213, the back glass 214, and the like may be controlled. For example, a liquid crystal panel is attached to the front door glass 212, the rear door glass 213, the back glass 214, and the like, so that the light transmittance can be controlled.

For example, in the case where a headlight 161 of a car 160 behind the mobile unit 100 is emitting a high beam 162 as illustrated in FIG. 22(A), the eyes of the driver who is riding in the mobile unit 100 are irradiated with the high beam 162, and the driver may perceive glare. Thus, in the case where the headlight 161 is emitting the high beam 162, the light transmittance of the front door glass 212, the rear door glass 213, the back glass 214, and the like is decreased; in this way, the glare perceived by the driver riding in the mobile unit 100 can be reduced.

The light transmittance of all the region of the front door glass 212, the rear door glass 213, the back glass 214, and the like may be controlled at the same time, or the light transmittance may be locally controlled. For example, the light transmittance of only a region between the high beam 162 and the eyes of the driver who is riding in the mobile unit 100 of the front door glass 212, the rear door glass 213, the back glass 214, and the like may be decreased. For example, the light transmittance of only a region between the high beam 162 and the eyes of the driver who is riding in the mobile unit 100 and a region in the vicinity thereof of the front door glass 212, the rear door glass 213, the back glass 214, and the like may be decreased. In the case of locally controlling the light transmittance like this, the glare perceived by the driver who is riding in the mobile unit 100 can be reduced, and in addition, a reduction in visibility can be suppressed.

Furthermore, in the mobile unit and the system for a mobile unit of one embodiment of the present invention, the reflectance of a rearview mirror of the mobile unit 100 may be controlled. For example, in the case where the headlight 161 is emitting the high beam 162, the reflectance of the rearview mirror is decreased, so that the glare perceived by the driver who is riding in the mobile unit 100 can be reduced.

Note that the sensor 104, the sensor 105, or another sensor may be used as a sensor that senses the high beam 162. In the case of using another sensor, a sensor 164 having a function of sensing the high beam 162 can be provided on a rear bumper as illustrated in FIG. 22(B), for example. Alternatively, for example, it can be provided on the roof, the side mirror, or the like.

Note that although a case in which one sensor 164 is provided is illustrated in FIG. 22(B), one embodiment of the present invention is not limited to this. As illustrated in FIG. 22(C), two sensors 164L and 164R may be provided as the sensor 164, for example.

Furthermore, the mobile unit 100 may be provided with a sensor having a function of sensing the car 160 behind. The car 160 behind may be sensed by the sensor 104, the sensor 105, the sensor 164, or a dedicated sensor.

Figure 23:
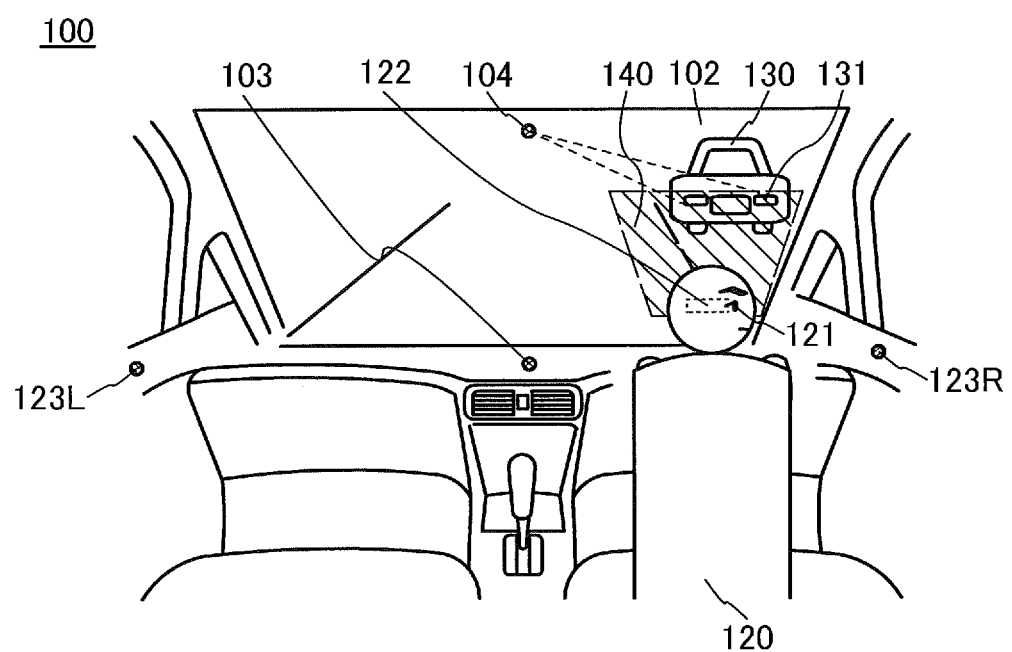
FIG. 23 A view for illustrating an example of operation.

In the mobile unit and the system for a mobile unit of one embodiment of the present invention, when the face of the driver 120 is facing aside, the position of the eyes 121 which would exist when the face of the driver 120 faces to the front may be predicted. For example, a pillar or a side door on the driver's seat side and a pillar or a side door on the passenger seat side are provided with a sensor 123R and a sensor 123L, respectively, as illustrated in FIG. 23, and whether the face of the driver 120 is facing aside is sensed by the sensor 123R or the sensor 123L. In the case where the face of the driver 120 is facing aside, the arithmetic circuit 113 illustrated in FIGS. 1(A), (B) obtains data on a region 122 where the eyes 121 would exist when the face of the driver 120 faces to the front according to the prediction, instead of data on the position of the eyes 121, for example. Then, from the region 122, the region 140 of the window portion 102 to change the light transmittance is calculated, for example.

The data on the region 122 can be stored in the memory circuit 112 illustrated in FIGS. 1(A), (B), for example. In this case, the memory circuit 112 has a function of outputting a signal having data on the region 122 to the arithmetic circuit 113. Note that the region 122 can be calculated from, for example, the position of the eyes 121 sensed by the sensor 103 when the face of the driver 120 faces to the front.

Although a case in which whether the face of the driver 120 is facing aside is sensed by the sensor 123R and the sensor 123L is illustrated in FIG. 23, one embodiment of the present invention is not limited to this. For example, whether the face of the driver 120 is facing aside may be sensed by one sensor 123, for example. In this case, the sensor 123 can be provided over a dashboard or on the window portion 102 or the like, for example. Moreover, whether the face of the driver 120 is facing aside may be sensed by the sensor 103.

The sensor 103 may have a function of sensing whether the driver 120 is dozing. For example, when an eye-closed rate of the driver 120 is calculated and the eye-closed rate is lower than or equal to a previously designated prescribed value, it is judged that the driver 120 is dozing. Note that the prescribed value of the eye-closed rate can be stored in the memory circuit 112 illustrated in FIGS. 1(A), (B), for example.

Figure 24A:
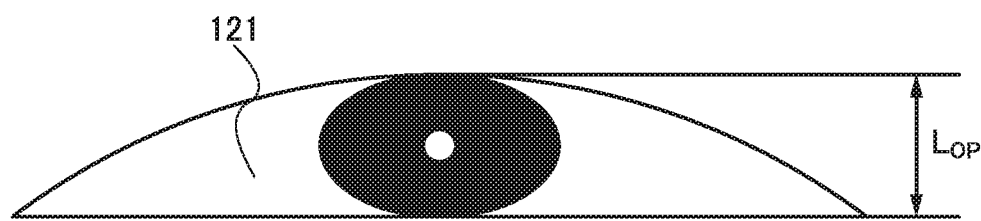
FIGS. 24A-24B Views illustrating calculation of an eye-closed rate.
Figure 24B:
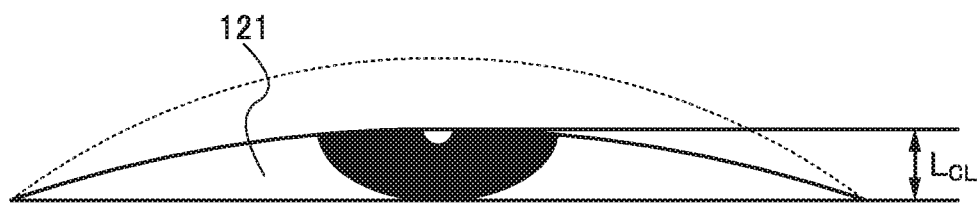

FIG. 24(A) illustrates a state of the eye 121 in the awakened state. FIG. 24(B) illustrates a state of the eye 121 in the doze state. For example, when the length from the lower eyelid to the upper eyelid of the eye 121 in the awakened state is $L_{OP}$ and the length from the lower eyelid to the upper eyelid of the eye 121 in the doze state is $L_{CL}$, the eye-closed rate can be calculated from $L_{CL}/L_{OP}$, for example.

Note that the eye-closed rate of the driver 120 can be calculated by the sensor circuit 111 illustrated in FIGS. 1(A), (B), for example. Furthermore, whether the driver 120 is dozing can be judged by the arithmetic circuit 113 illustrated in FIGS. 1(A), (B), for example. The arithmetic circuit 113 has a function of outputting a signal $S_{DOZ}$ including data on whether the driver 120 is dozing, for example.

Note that the length $L_{OP}$ from the lower eyelid to the upper eyelid of the eye 121 in the awakened state differs depending on the person. Thus, it is preferable to measure the length $L_{OP}$ of the driver in advance and store it in the memory circuit 112 or the like. Furthermore, the prescribed value of the eye-closed rate of the driver 120 used for judging whether the driver 120 is dozing may vary with drivers.

Furthermore, in the case where the driver 120 blinks, the eye-closed rate of the driver 120 is decreased. Accordingly, in the case where the eye-closed rate of the driver 120 becomes lower than or equal to the prescribed value but the eye-closed rate of the driver 120 exceeds the prescribed value within a certain time, it is preferable to judge that the driver 120 is not dozing. The certain time is 0.15 s, for example. Thus, whether the driver 120 is dozing can be correctly judged.

In one embodiment of the present invention, a light having a function of irradiating the eyes 121 with light is provided in the mobile unit 100, and the light can be made to emit light in the case where it is judged that the driver 120 is dozing, for example. Moreover, an alarm may be provided in the mobile unit 100, for example, so that the alarm can operate when it is judged that the driver 120 is dozing. Thus, a doze of the driver 120 can be suppressed. Note that the arithmetic circuit 113 can output the signal $S_{DOZ}$ to the above-described light or alarm, and the light or alarm has a function of operating in accordance with the signal $S_{DOZ}$.

Figure 25A:
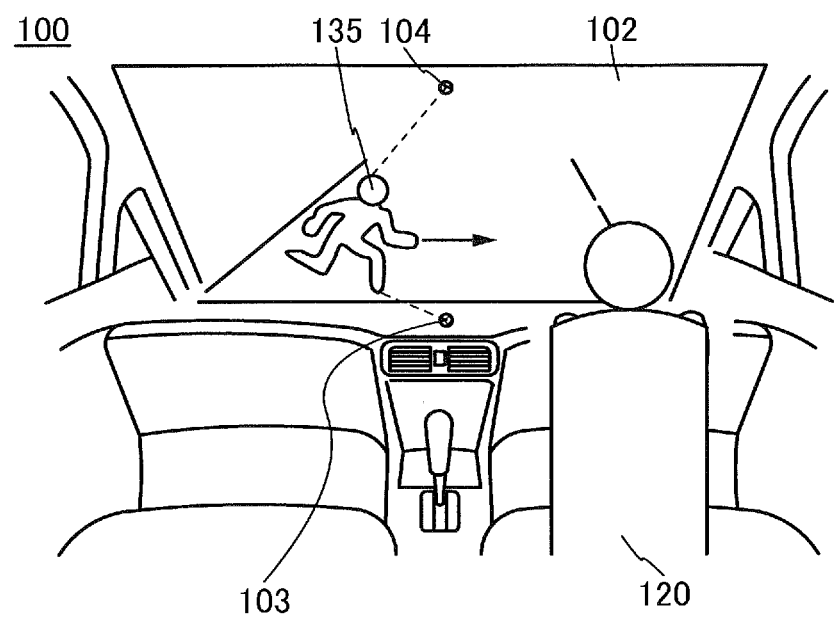
FIGS. 25A-25B A view for illustrating an example of operation and a block diagram illustrating a structure example of a mobile unit.

The sensor 103 and the sensor 104 may have a function of sensing an obstacle. For example, as illustrated in FIG. 25(A), they may have a function of sensing an obstacle such as a pedestrian 135 who is crossing ahead of the mobile unit 100. In the case where it is predicted that the mobile unit 100 will collide with an obstacle if the mobile unit 100 does not reduce the speed, the speed of the mobile unit 100 is automatically reduced to the speed that does not cause a collision. Thus, a collision of the mobile unit 100 with an obstacle can be suppressed, for example.

Figure 25B:
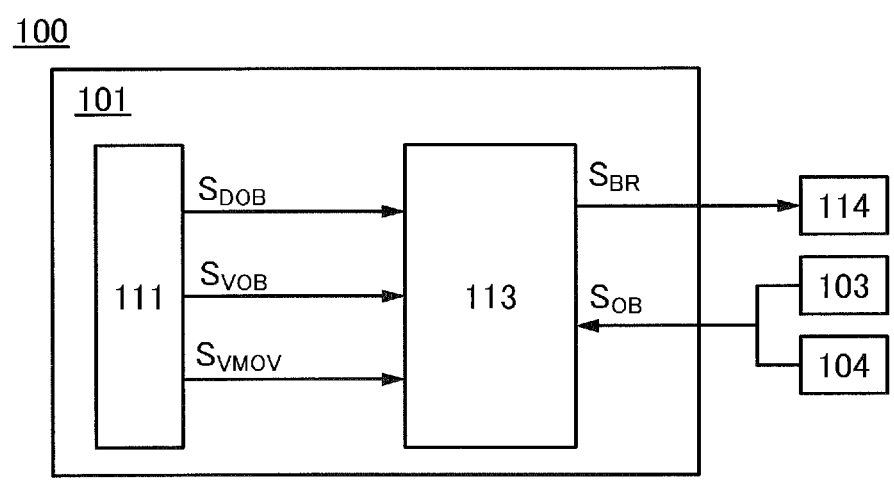

FIG. 25(B) is a block diagram illustrating a structure example of the mobile unit and the system for a mobile unit of one embodiment of the present invention in the case where the sensor 103 and the sensor 104 have a function of sensing an obstacle.

The sensor 103 and the sensor 104 have a function of sensing an obstacle and outputting a signal $S_{OB}$ including data on the obstacle to an arithmetic circuit. Note that the signal $S_{OB}$ includes data on whether an obstacle is existing ahead of the mobile unit 100, data on the distance between the mobile unit 100 and the obstacle, and the like, for example.

The sensor circuit 111 has a function of outputting a signal $S_{DOB}$ including data on the moving direction $D_{OB}$ of an obstacle to the arithmetic circuit 113. Furthermore, the sensor circuit 111 has a function of outputting a signal $S_{VOB}$ including data on the moving velocity $V_{OB}$ of an obstacle to the arithmetic circuit 113. Moreover, the sensor circuit 111 has a function of outputting a signal $S_{VMOV}$ including data on the velocity $V_{MOV}$ of the mobile unit 100 to the arithmetic circuit 113.

The arithmetic circuit 113 has a function of outputting a signal $S_{BR}$ for operating a brake 114. The signal $S_{BR}$ includes data on the deceleration of the mobile unit 100 necessary for preventing the contact between the mobile unit 100 and an obstacle.

Note that although the description of the memory circuit 112 is omitted in FIG. 25(B), the mobile unit 100 actually includes the memory circuit 112 having the functions described using FIG. 1(A). Furthermore, although the signals illustrated in FIG. 1(A) are omitted in FIG. 25(B), the sensors and circuits illustrated in FIG. 25(B) have functions of performing input and output of signals illustrated in FIG. 1(A).

Next, an operation example of the mobile unit 100 having the structure illustrated in FIG. 25(B) will be described with reference to a flowchart illustrated in FIG. 26.

In Step S21, the arithmetic circuit 113 obtains data on an obstacle from the sensor 103 and the sensor 104. The data is output to the arithmetic circuit 113 as the signal $S_{OB}$ as described above. Note that as described above, the signal $S_{OB}$ includes data on whether an obstacle is existing ahead of the mobile unit 100, data on the distance between the mobile unit 100 and the obstacle, and the like, for example.

In Step S22, the arithmetic circuit 113 judges whether an obstacle has been sensed on the basis of the signal $S_{OB}$. In the case where an obstacle has not been sensed, a return to Step S21 is made, and the arithmetic circuit 113 obtains data on an obstacle from the sensor 103 and the sensor 104 again. In the case where an obstacle has not been sensed, go to Step S23.

In Step S23, the arithmetic circuit 113 obtains data on the moving direction $D_{OB}$ of the obstacle and data on the moving velocity $V_{OB}$ of the obstacle from the sensor circuit 111. As described above, the data on the moving direction $D_{OB}$ is output to the arithmetic circuit 113 as the signal $S_{DOB}$, and the data on the moving velocity $V_{OB}$ is output to the arithmetic circuit 113 as the signal $S_{VOB}$.

In Step S24, the arithmetic circuit 113 judges whether the mobile unit 100 will collide with the obstacle if the mobile unit 100 does not reduce the speed, from the data on the moving direction $D_{OB}$ of the obstacle, the data on the moving velocity $V_{OB}$ of the obstacle, the data on the distance between the mobile unit 100 and the obstacle included in the signal $S_{OB}$, and the like. In the case where the mobile unit 100 will not collide with the obstacle even if the mobile unit 100 does not reduce the speed, a return to Step S21 is made.

In the case where the mobile unit 100 will collide with the obstacle if the mobile unit 100 does not reduce the speed, go to Step S25.

In Step S25, the arithmetic circuit 113 obtains data on the velocity $V_{MOV}$ of the mobile unit 100 from the sensor circuit 111. As described above, the data on the velocity $V_{MOV}$ is output to the arithmetic circuit 113 as the signal $S_{VMOV}$.

In Step S26, the arithmetic circuit 113 calculates the deceleration of the mobile unit 100 necessary for preventing the collision of the mobile unit 100 with the obstacle, from the data on the velocity $V_{MOV}$ of the mobile unit 100, the data on the distance between the mobile unit 100 and the obstacle included in the signal $S_{OB}$, and the like. The data on the deceleration is output to the brake 114 as the signal $S_{BR}$ as described above. The brake 114 automatically reduces the speed of the mobile unit 100 on the basis of the signal $S_{BR}$.

After Step S26 is finished, a return to Step S21 is made. The operation example of the mobile unit 100 having the structure illustrated in FIG. 25(B) is described so far.

Note that the deceleration of the mobile unit 100 is preferably set as low as possible within a range where the mobile unit 100 is not in contact with an obstacle. Thus, a possibility of collision of a car behind with the mobile unit 100 can be reduced. In addition, a shock applied to an occupant of the mobile unit 100 can be reduced.

Furthermore, the deceleration of the mobile unit 100 may be controlled so that the mobile unit 100 and the obstacle can keep a distance of more than or equal to a prescribed value, which is determined in advance, away from each other. The prescribed value can be stored in the memory circuit 112, for example. In this case, for example in Step S24, it can be judged whether the distance between the mobile unit 100 and the obstacle will be below the prescribed value if the mobile unit 100 does not reduce the speed. In the case where it is judged in Step S24 that the mobile unit 100 will not collide with the obstacle but the distance between the mobile unit 100 and the obstacle will be below the prescribed value if the mobile unit 100 does not reduce the speed, the step does not return to S21 and can proceed to Step S25. Accordingly, in the case where the moving direction $D_{OB}$ of the obstacle and the moving velocity $V_{OB}$ of the obstacle suddenly change, for example, a possibility of the collision of the mobile unit 100 with the obstacle can be reduced.

The operation procedure illustrated in FIG. 26 is only an example, and any operation procedure can be employed as long as one embodiment of the present invention can be achieved.

Next, a cross-sectional structure of the pixels 20 included in the imaging element 11 will be described. FIG. 27(A) illustrates a structure of three pixels 20 (a pixel 20e, a pixel 20f, a pixel 20g).

Figure 27:
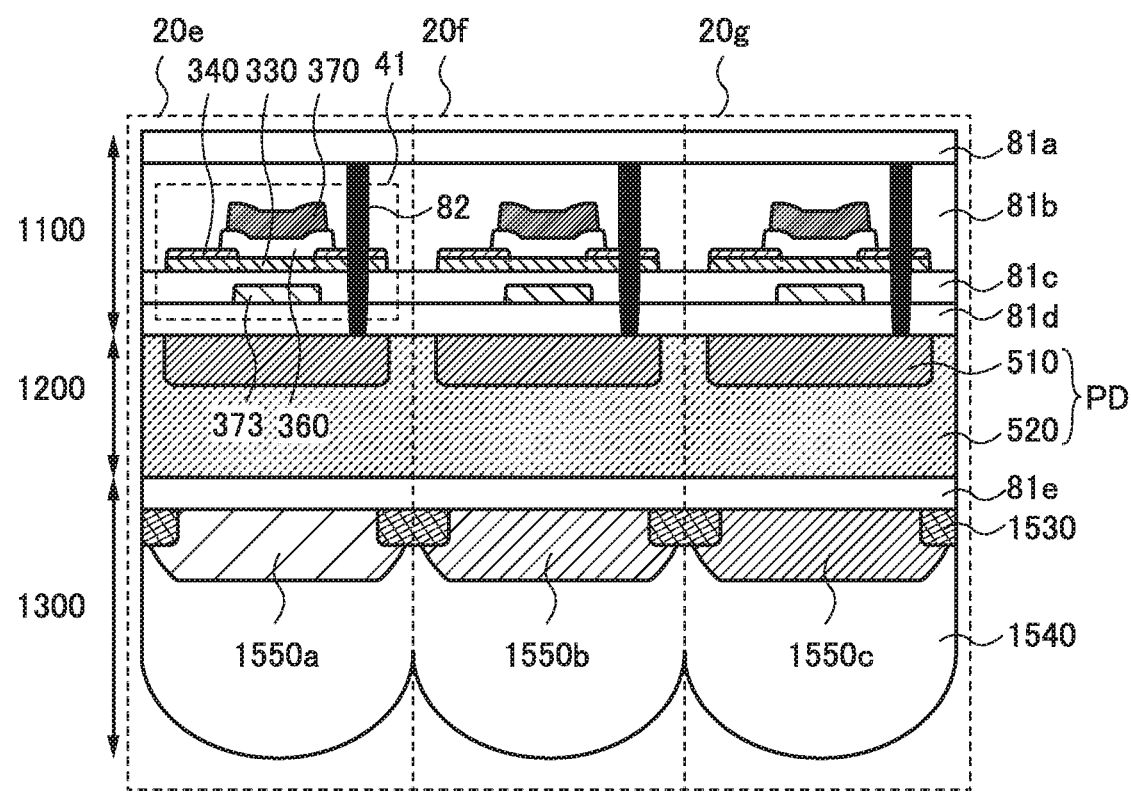
FIG. 27 A view illustrating pixels of an imaging element.

As illustrated in FIG. 27, the pixel 20 can include a layer 1100, a layer 1200, and a layer 1300. For example, the layer 1100 includes the transistor 41 to the transistor 44 and the like in a pixel circuit. The layer 1200 includes the photoelectric conversion element PD and the like. The layer 1300 includes a color filter, a microlens array, and the like. As illustrated in FIG. 27, by employing a structure of integrating the photoelectric conversion elements and the transistors three-dimensionally and performing a manufacturing process using materials suitable for each component, an image sensor with higher performance can be manufactured.

Note that in a cross-sectional view, an insulating layer 81a to an insulating layer 81e, which each function as a protective film, an interlayer insulating film, or a planarization film, and the like are provided in each layer. For example, as the insulating layer 81a to the insulating layer 81e, inorganic insulating films formed by a CVD (Chemical Vapor Deposition) method or the like, such as silicon oxide films or silicon oxynitride films, can be used. Alternatively, an organic insulating film of an acrylic resin, polyimide, or the like may be used. Top surfaces of the insulating layer 81a to the insulating layer 81e and the like are preferably subjected to planarization treatment as necessary by a CMP (Chemical Mechanical Polishing) method or the like.

FIG. 27 illustrates an example of using top-gate OS transistors, as which the transistors 41 are shown as an example. The OS transistors are provided over the insulating layer (the insulating layer 81d) formed over the layer 1200 and include an oxide semiconductor layer 330, a conductive layer 340 which functions as a source electrode or a drain electrode, an insulating layer 360 which functions as a gate insulating layer, and a conductive layer 370 which functions as a gate electrode. Note that the insulating layer 81c can also have a function of a gate insulating layer on the backgate side.

FIG. 27 shows, as an example, a structure in which the transistor 41 is provided with a conductive layer 373 functioning as a backgate electrode. The layer 1100 might be irradiated with light transmitted through the layer 1200 side. Thus, in the case where the OS transistor provided in the pixel circuit is a top-gate transistor, a structure for blocking light with the provided backgate electrode is preferable. Note that if the layer 1200 is thick enough and the light transmittance is in an allowable range, a structure not provided with the backgate electrode may be employed. In the case where a light-blocking layer or the like is provided additionally, a structure not provided with the backgate electrode can be employed as well.

A photodiode provided in a single crystal silicon substrate can be used as the photoelectric conversion element PD provided in the layer 1200. The photodiode has excellent photoelectric conversion characteristics. Moreover, it can be fabricated relatively easily because the single crystal silicon substrate, which is a base material, functions as a photoelectric conversion layer. If necessary, the single crystal silicon substrate may be polished to have a thickness of 3 to 30 μm, for example.

Note that FIG. 27 illustrates a p-n junction photodiode as an example, and as illustrated in the circuit diagram of FIG. 14, a region 510 can function as a cathode (an n-type region) and a region 520 can function as an anode (a p-type region). For example, a p-type single crystal silicon substrate is used, and the region 510 is made to be an n-type by addition of a dopant such as phosphorus to the region 510. Note that in the case where the direction of the photoelectric conversion element PD is opposite to that of FIG. 14 in the pixel 20 as illustrated in FIG. 15(B), the region 510 can be an anode (p-type region) and the region 520 can be a cathode (n-type region). For example, an n-type single crystal silicon substrate is used, and the region 510 is made to be p-type by addition of a dopant such as boron to the region 510.

In the photodiode provided in the layer 1200, as illustrated in FIG. 28(A), a region 530 having a conductivity opposite to that of the region 510 may be provided in part of a portion between the region 510 and the insulating layer 81d. Note that as illustrated in FIG. 28(B), the region 530 may be provided in the whole portion between the region 510 and the insulating layer 81d. In such a structure, the photodiode is a buried type photodiode; thus, noise generated at the interface between silicon and the insulating layer can be reduced.

In the photodiode provided in the layer 1200, as illustrated in FIG. 28(C), a partition may be provided between pixels. The partition can be formed by forming a groove between the pixels and forming the insulating layer 81e to fill the groove. With such a structure, entry of irradiation light from the oblique direction (stray light) can be prevented.

Note that a material that has a lower refractive index than silicon is preferably used for the partition. For example, the above-described material may be used for the insulating layer 81e. Alternatively, a material that easily absorbs light may be used to form the partition. For example, it is also possible to use a resin to which a material such as a carbon-based black pigment (e.g., carbon black), a titanium-based black pigment (e.g., titanium black), an oxide of iron, a composite oxide of copper and chromium, or a composite oxide of copper, chromium, and zinc is added, or the like.

In the photodiode provided in the layer 1200, as illustrated in FIG. 28(D), a region 540 having the same conductivity as the region 520 and having a higher dopant concentration than the region 520 may be provided between the region 520 and the insulating layer 81e. With such a structure, carriers can be collected efficiently.

Furthermore, in the photodiode provided in the layer 1200, the region 540 may be provided adjacent to the region 530 as illustrated in FIG. 28(E). With this structure, the wirings connected to the photodiodes can be concentrated on one side.

Note that in the structures of FIG. 27 and FIGS. 28(A), (B), (C), a structure in which the wiring 71 is electrically connected to the region 520 in every two or more pixels is employed. In the structure of FIG. 28(D), a structure in which the wiring 71 is electrically connected to the region 540 via a region 545 in every two or more pixels is employed. Like the region 540, the region 545 is a region having the same conductivity as the region 520 and having a higher dopant concentration than the region 520. In the structure of FIG. 28(E), a structure in which each region 540 is electrically connected to the wiring 71 is employed.

In the imaging device of one embodiment of the present invention, as illustrated in FIG. 27, the one of the source and the drain of the transistor 41 is electrically connected to the one electrode of the photoelectric conversion element PD via a conductor 82. The conductor 82 is provided to penetrate the insulating layer 81b, the conductive layer 340, the oxide semiconductor layer 330, the insulating layer 81c, and the insulating layer 81d.

With such a structure, the above-described electrical connection can be obtained without bridge connection using a plurality of conductors 82, a connection wiring, and the like; thus, the process can be simplified. Furthermore, since an opening does not need to be provided in the insulating layer 81c, the insulating layer 81d, and the like before the transistor 41 is formed, the occurrence of process failure due to a shape such as a step can be reduced.

Figure 29A:
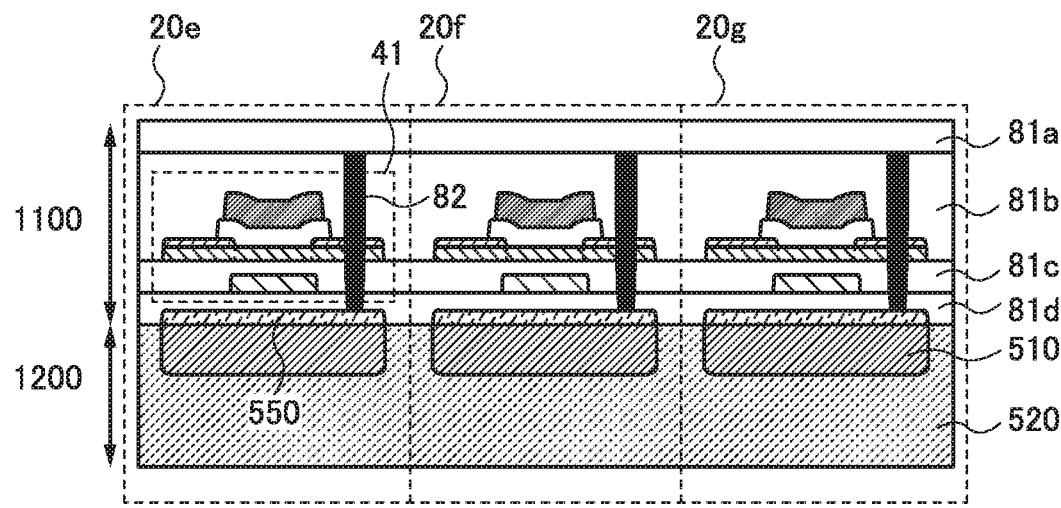
FIGS. 29A-29C Views illustrating connection structures of a photoelectric conversion element and a transistor.

Note that the conductor 82 and the one electrode of the photoelectric conversion element PD may be electrically connected to each other via a conductive layer 550 as illustrated in FIG. 29(A). For the conductive layer 550, for example, a metal layer of W, Ta, Al, Ti, Ni, stainless steel, Pd, or the like can be used. The conductive layer 550 serves as an electrode of the photoelectric conversion element PD and also serves as an etching stopper in forming an opening in which the conductor 82 is to be formed. In addition, the conductive layer 550 also serves as a light-blocking layer for the transistor and a reflective electrode of the photoelectric conversion element PD.

Figure 29B:
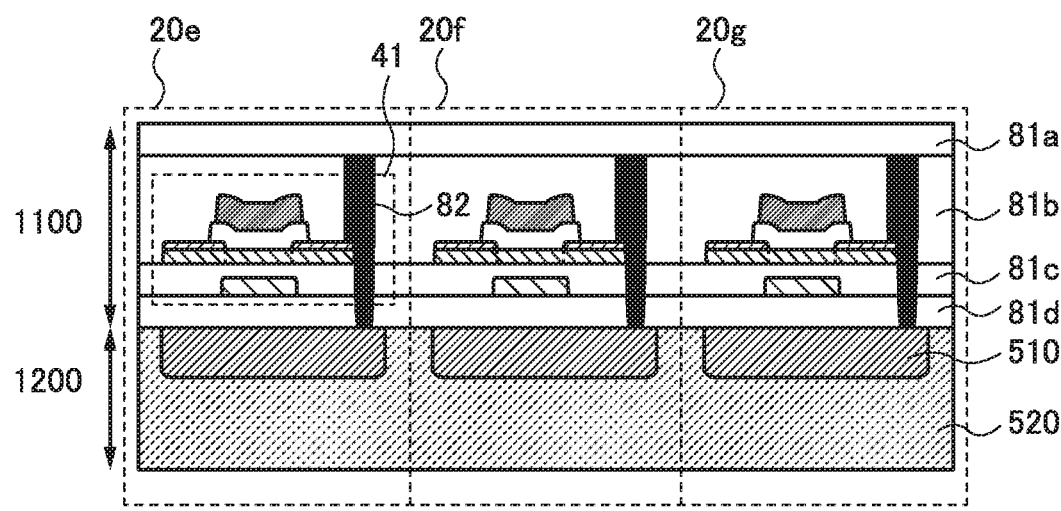

Furthermore, as illustrated in FIG. 29(B), the electrical connection may be obtained not by making the conductor 82 penetrate the conductive layer 340 and the oxide semiconductor layer 330 but by making the conductor 82 in contact with the top surface and the side surface of the conductive layer 340 and the side surface of the oxide semiconductor layer 330. With such a structure, a load of an etching step of forming the opening can be reduced because a metal layer formed of a hardly-etched material is mainly used for the conductive layer 340.

Figure 29C:
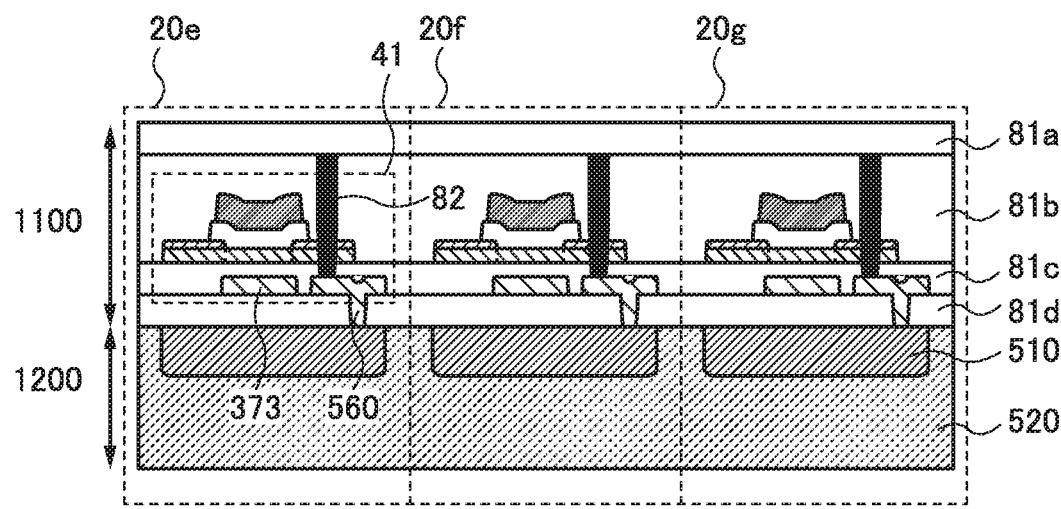

As illustrated in FIG. 29(C), a structure in which the conductor 82 is electrically connected to a conductive layer 560 that is electrically connected to the one electrode of the photoelectric conversion element PD may be employed. The conductive layer 560 may be formed in the same step as the conductive layer 373 after an opening is formed in the insulating layer 81d. The conductive layer 560 serves as an etching stopper used in forming an opening in which the conductor 82 is to be formed.

In the layer 1300, a light-blocking layer 1530, an optical conversion layer 1550a, a photoelectric conversion layer 1550b, a photoelectric conversion layer 1550c, a microlens array 1540, and the like can be provided.

The insulating layer 81e is formed in a region in contact with the layer 1200. As the insulating layer 81e, a silicon oxide film with a high visible-light transmitting property or the like can be used. In addition, a silicon nitride film may be stacked as a passivation film. In addition, a structure in which a dielectric film of hafnium oxide or the like is stacked as an anti-reflection film may be employed.

The light-blocking layer 1530 can be provided on the insulating layer 81. The light-blocking layer 1530 is placed between adjacent pixels and has a function of blocking stray light entering from the oblique direction. The light-blocking layer 1530 can be a metal layer of aluminum, tungsten, or the like, or can have a structure in which such a metal layer and a dielectric film having a function of an anti-reflection film are stacked.

The optical conversion layer 1550a, the photoelectric conversion layer 1550b, and the photoelectric conversion layer 1550c can be provided on the insulating layer 81 and the light-blocking layer 1530. For example, color filters of red (R), green (G), blue (B), yellow (Y), cyan (C), magenta (M), and the like are assigned to the optical conversion layer 1550a, the photoelectric conversion layer 1550b, and the photoelectric conversion layer 1550c, so that a color image can be obtained.

When filters that block light having a wavelength shorter than or equal to that of visible light are used for the optical conversion layers, an infrared imaging device can be obtained. Moreover, when filters that block light having a wavelength shorter than or equal to that of near infrared light are used as the optical conversion layers, a far infrared imaging device can be obtained. Furthermore, when filters that block light having a wavelength longer than or equal to that of visible light are used as the optical conversion layers, an ultraviolet imaging device can be obtained.

The microlens array 1540 can be provided on the optical conversion layer 1550a, the photoelectric conversion layer 1550b, and the photoelectric conversion layer 1550c. Light passing through individual lenses included in the microlens array 1540 passes through the optical conversion layer 1550a, the photoelectric conversion layer 1550b, and the photoelectric conversion layer 1550c, and the photoelectric conversion element PD is irradiated with the light.

The structures described in this embodiment can be used in appropriate combination with the structures described in the other embodiments.

Embodiment 2

In this embodiment, an OS transistor that can be used in one embodiment of the present invention will be described with reference to drawings. In the drawings in this embodiment, some components are enlarged, reduced in size, or omitted for clarity.

Figure 30A:
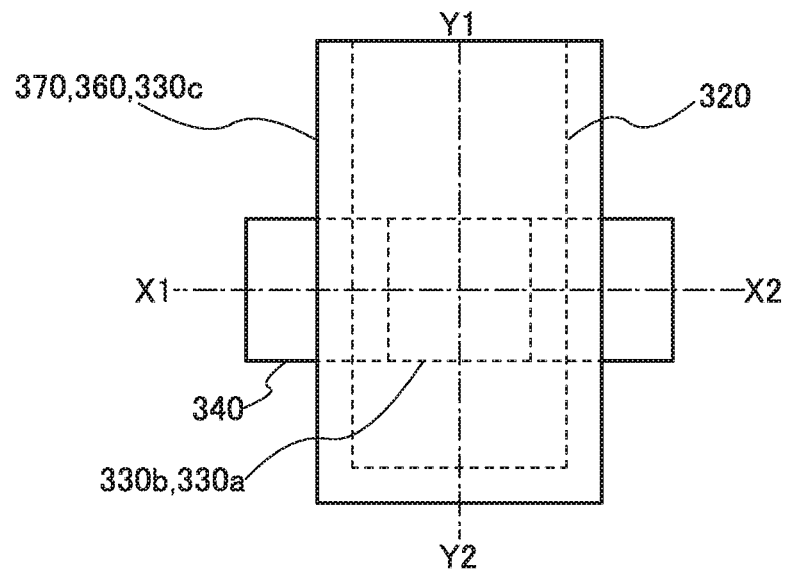
FIGS. 30A-30C A top view and cross-sectional views illustrating a transistor.
Figure 30B:
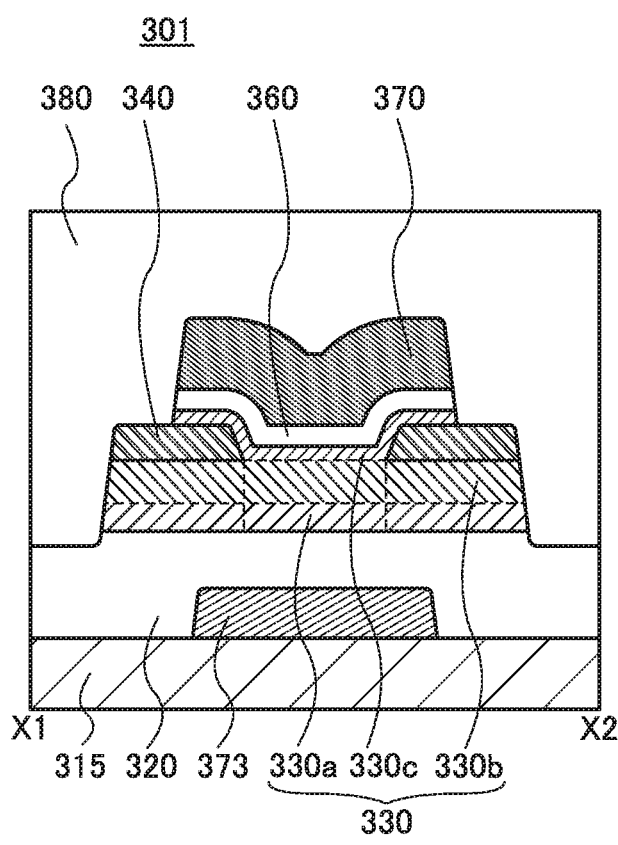
Figure 30C:
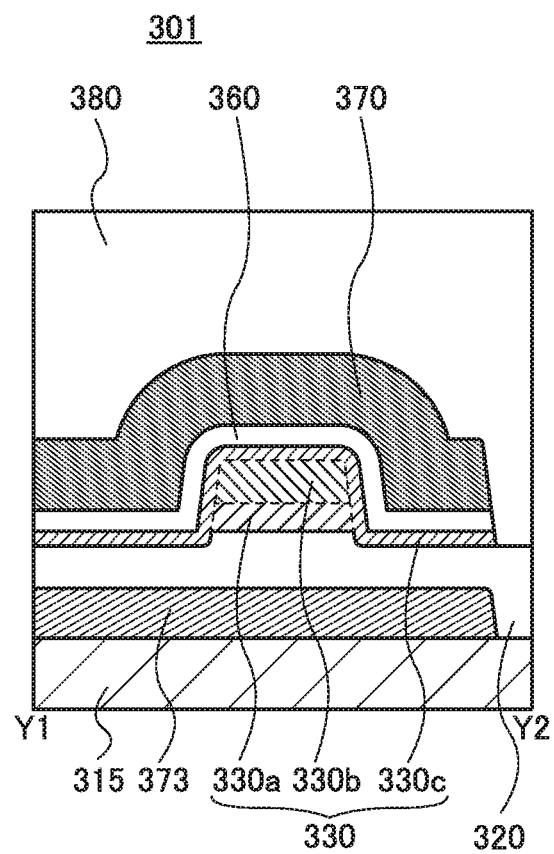

FIGS. 30(A), (B), (C) are a top view and cross-sectional views of a transistor 301 of one embodiment of the present invention. FIG. 30(A) is the top view, and a cross section along the direction of the dashed-dotted line X1-X2 in FIG. 30(A) corresponds to FIG. 30(B). A cross section along the direction of the dashed-dotted line Y1-Y2 in FIG. 30(A) corresponds to FIG. 30(C).

In the drawings explained in this embodiment, the direction of the dashed-dotted line X1-X2 is referred to as channel length direction, and the direction of the dashed-dotted line Y1-Y2 is referred to as channel width direction.

The transistor 301 includes an insulating layer 320 in contact with a substrate 315, the conductive layer 373 in contact with the insulating layer 320, the oxide semiconductor layer 330 in contact with the insulating layer 320, the conductive layer 340 electrically connected to the oxide semiconductor layer 330, the insulating layer 360 in contact with the oxide semiconductor layer 330 and the conductive layer 340, and the conductive layer 370 in contact with the insulating layer 360.

Over the transistor 301, an insulating layer 380 in contact with the oxide semiconductor layer 330, the conductive layer 340, the insulating layer 360, and the conductive layer 370 may be provided as necessary.

The oxide semiconductor layer 330 can have a three-layer structure of an oxide semiconductor layer 330a, an oxide semiconductor layer 330b, and an oxide semiconductor layer 330c, for example.

The conductive layer 340 can function as a source electrode layer or a drain electrode layer. The insulating layer 360 and the conductive layer 370 can function as a gate insulating film and a gate electrode layer, respectively.

Using the conductive layer 373 as a second gate electrode layer (backgate) enables the increase in on-state current and control of the threshold voltage. Note that the conductive layer 373 can also serve as a light-blocking layer.

In order to increase the on-state current, for example, the conductive layer 370 and the conductive layer 373 are made to have the same potential, and the transistor is driven as a double-gate transistor. Furthermore, in order to control the threshold voltage, a fixed potential that is different from the potential of the conductive layer 370 is supplied to the conductive layer 373.

In the oxide semiconductor layer 330, a region in contact with the conductive layer 340 can function as a source region or a drain region.

Since the oxide semiconductor layer 330 is in contact with the conductive layer 340, an oxygen vacancy is generated in the oxide semiconductor layer 330, and the region becomes an n-type low-resistance region owing to interaction between the oxygen vacancy and hydrogen that remains in the oxide semiconductor layer 330 or diffuses into the oxide semiconductor layer 330 from the outside.

Note that functions of a "source" and a "drain" of a transistor are sometimes replaced with each other when a transistor of opposite polarity is employed or when the direction of current flow is changed in a circuit operation, for example. Therefore, the terms "source" and "drain" can be interchanged with each other in this specification. In addition, the term "electrode layer" can be replaced with the term "wiring".

The conductive layer 340 is in contact with a top surface of the oxide semiconductor layer 330 and is not in contact with side surfaces of the oxide semiconductor layer 330.

This structure facilitates compensation for an oxygen vacancy in the oxide semiconductor layer 330 with oxygen included in the insulating layer 320.

Figure 31A:
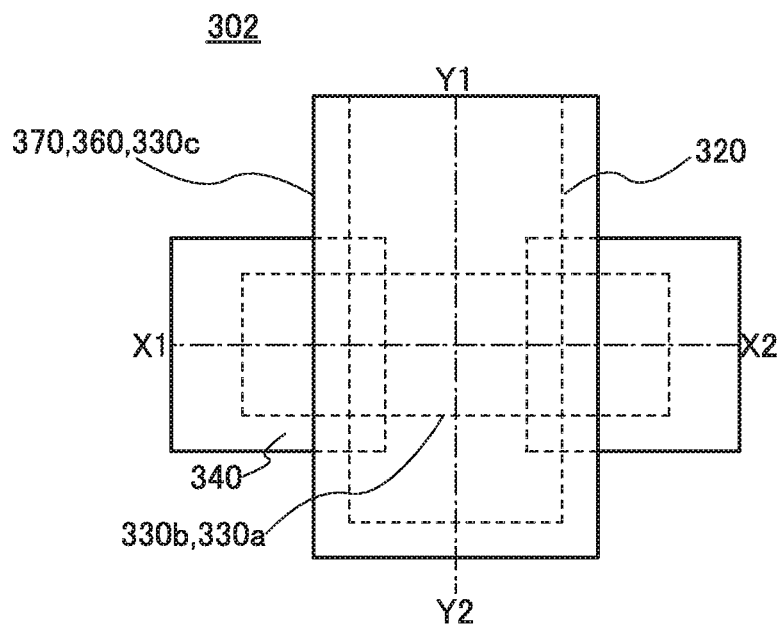
FIGS. 31A-31C A top view and cross-sectional views illustrating a transistor.
Figure 31B:
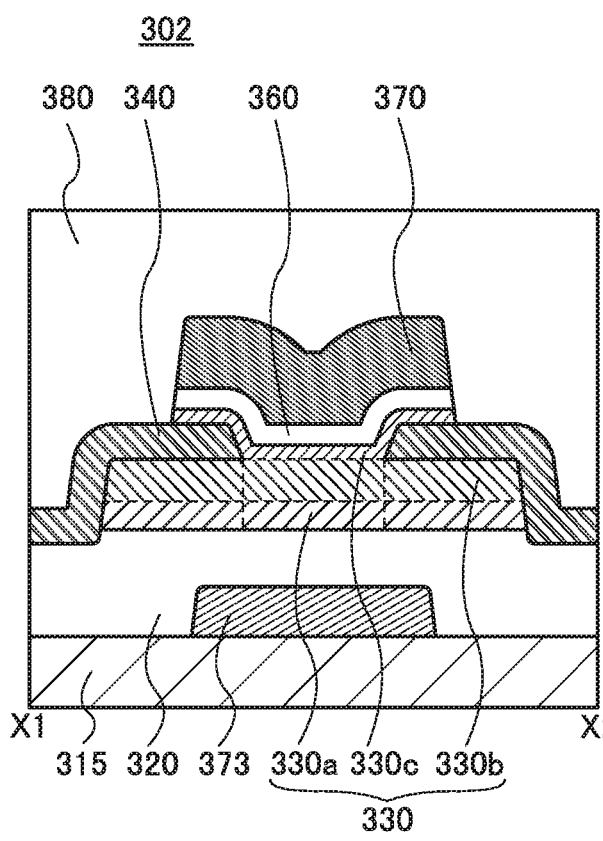
Figure 31C:
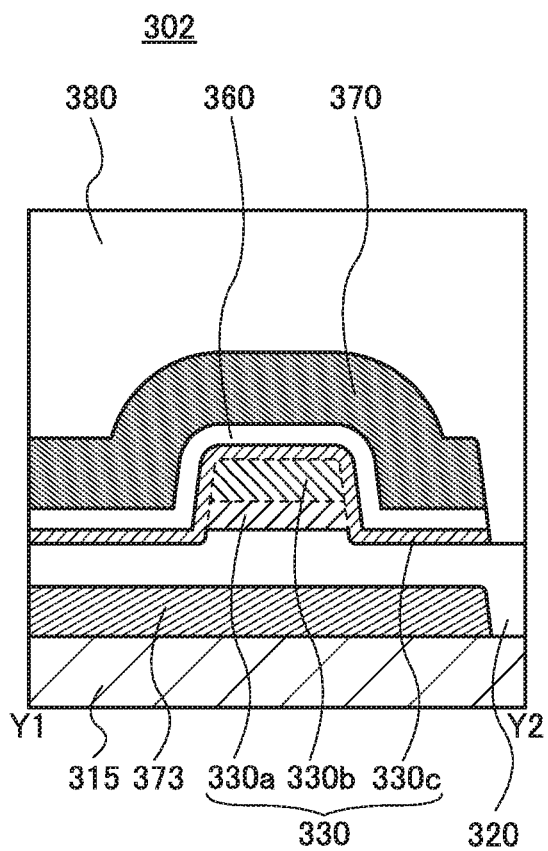

The transistor in one embodiment of the present invention may have a structure illustrated in FIGS. 31(A), (B), (C). FIG. 31(A) is a top view of a transistor 302, and a cross section along the direction of the dashed-dotted line X1-X2 in FIG. 31(A) corresponds to FIG. 31(B). A cross section along the direction of the dashed-dotted line Y1-Y2 in FIG. 31(A) corresponds to FIG. 31(C).

The transistor 302 has a structure similar to that of the transistor 301 except that the conductive layer 340 is in contact with the insulating layer 320, and that the conductive layer 340 is in contact with side surfaces of the oxide semiconductor layer 330.

Figure 32A:
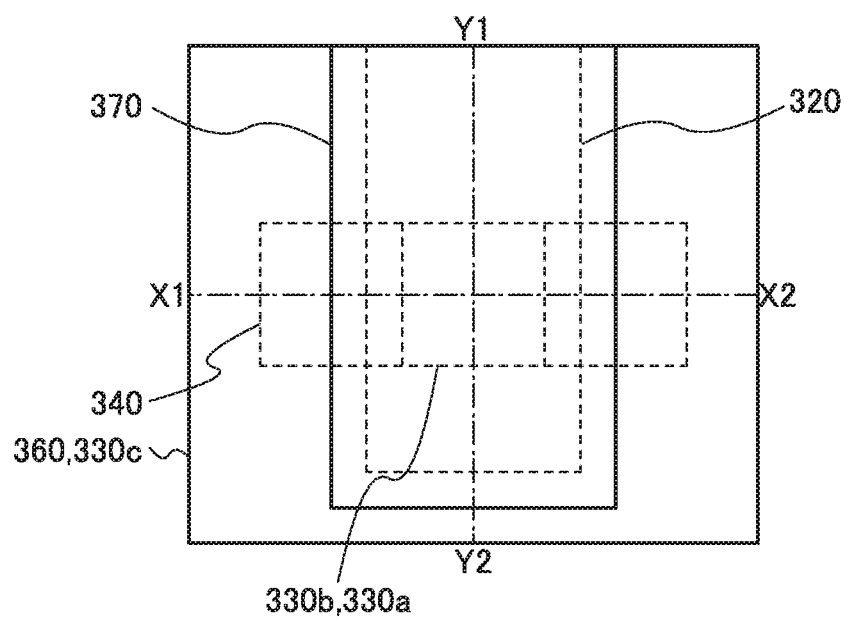
FIGS. 32A-32C A top view and cross-sectional views illustrating a transistor.
Figure 32B:
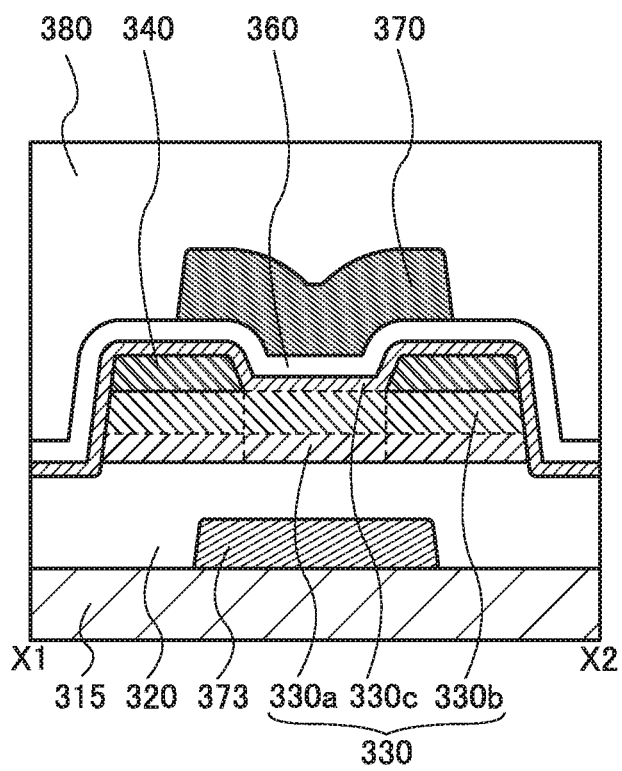
Figure 32C:
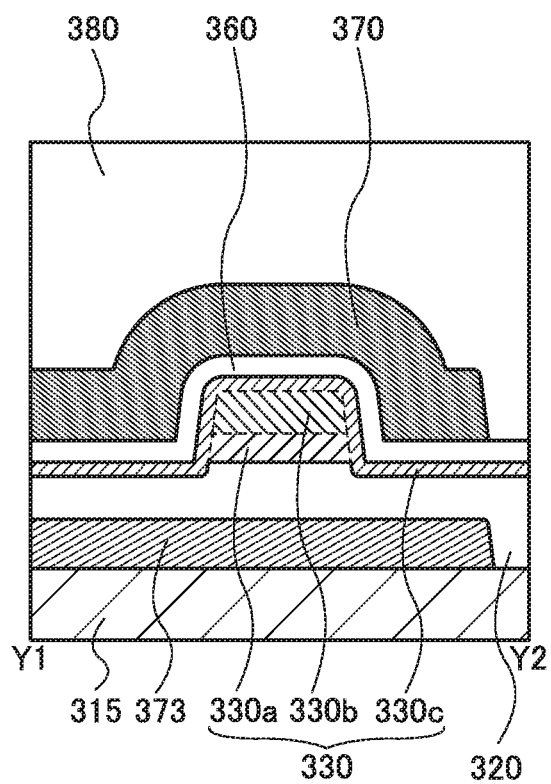

The transistor in one embodiment of the present invention may have a structure illustrated in FIGS. 32(A), (B), (C). FIG. 32(A) is a top view of a transistor 303, and a cross section along the direction of the dashed-dotted line X1-X2 in FIG. 32(A) corresponds to FIG. 32(B). A cross section along the direction of the dashed-dotted line Y1-Y2 in FIG. 32(A) corresponds to FIG. 32(C).

The transistor 303 has a structure similar to that of the transistor 301 except that the oxide semiconductor layer 330a, the oxide semiconductor layer 330b, and the conductive layer 340 are covered with the oxide semiconductor layer 330c and the insulating layer 360.

When the oxide semiconductor layer 330c covers the oxide semiconductor layer 330a and the oxide semiconductor layer 330b, the effect of compensating for oxygen in the oxide semiconductor layer 330a, the oxide semiconductor layer 330b, and the insulating layer 320 can be enhanced. Moreover, oxidation of the conductive layer 340 by the insulating layer 380 can be suppressed by the existence of the oxide semiconductor layer 330c therebetween.

Figure 33A:
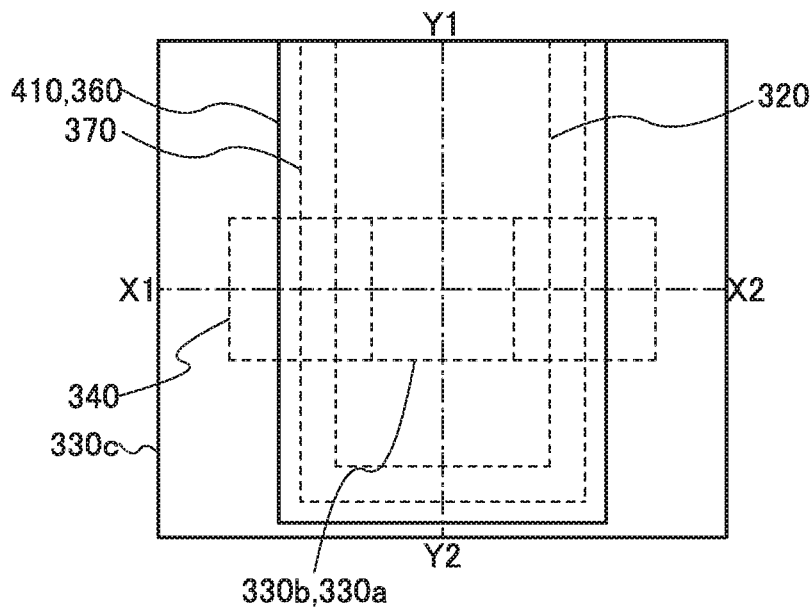
FIGS. 33A-33C A top view and cross-sectional views illustrating a transistor.
Figure 33B:
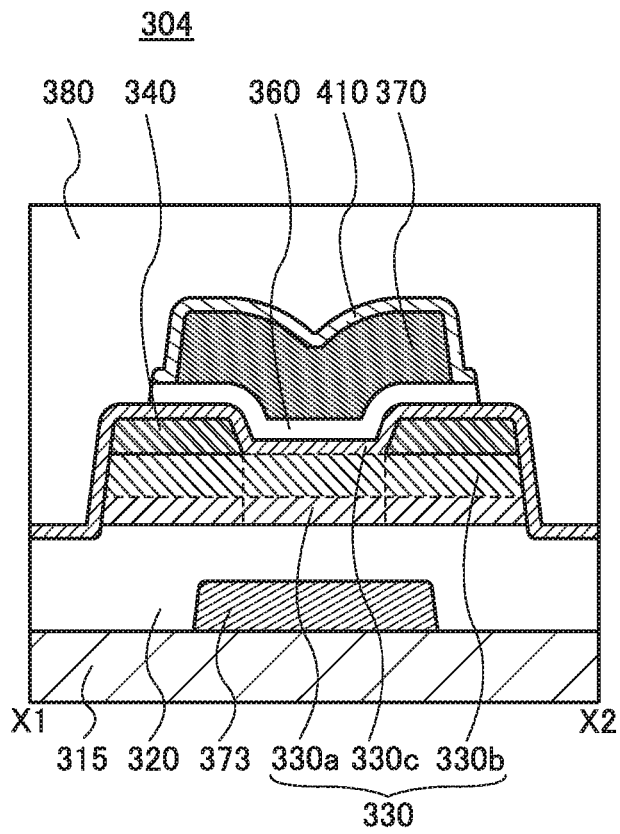
Figure 33C:
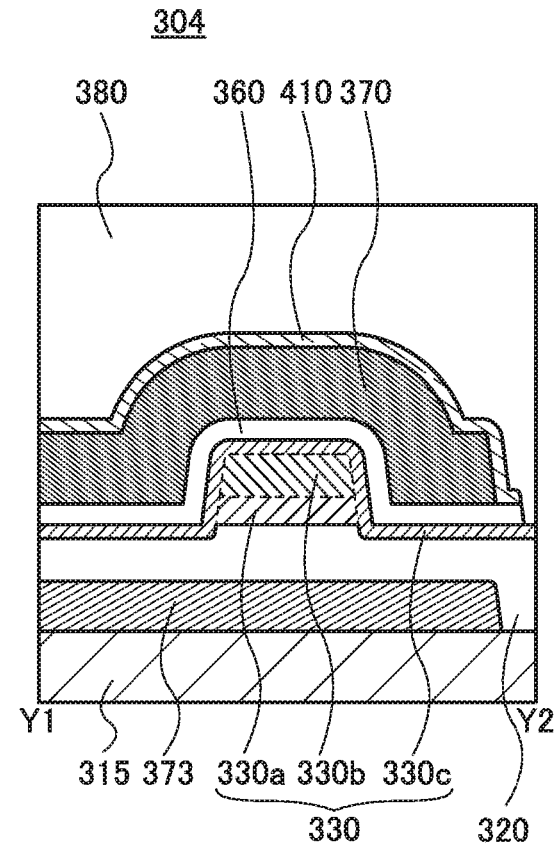

The transistor in one embodiment of the present invention may have a structure illustrated in FIGS. 33(A), (B), (C). FIG. 33(A) is a top view of a transistor 304, and a cross section along the direction of the dashed-dotted line X1-X2 in FIG. 33(A) corresponds to FIG. 33(B). A cross section along the direction of the dashed-dotted line Y1-Y2 in FIG. 33(A) corresponds to FIG. 33(C).

The transistor 304 has a structure similar to that of the transistor 301 except that the oxide semiconductor layer 330a, the oxide semiconductor layer 330b, and the conductive layer 340 are covered with the oxide semiconductor layer 330c, and that the conductive layer 370 is covered with an insulating layer 410.

The insulating layer 410 can be formed using a material with a blocking property against oxygen. For example, a metal oxide such as aluminum oxide can be used as the insulating layer 410. Oxidation of the conductive layer 370 by the insulating layer 380 can be suppressed by the existence of the insulating layer 410 therebetween.

The transistor 301 to the transistor 304 have a top-gate structure including a region where the conductive layer 370 overlaps the conductive layer 340. To reduce parasitic capacitance, the width of the region in the channel length direction is preferably greater than or equal to 3 nm and less than 300 nm. Since an offset region is not formed in the oxide semiconductor layer 330 in this structure, a transistor with a large on-state current can be easily formed.

Figure 34A:
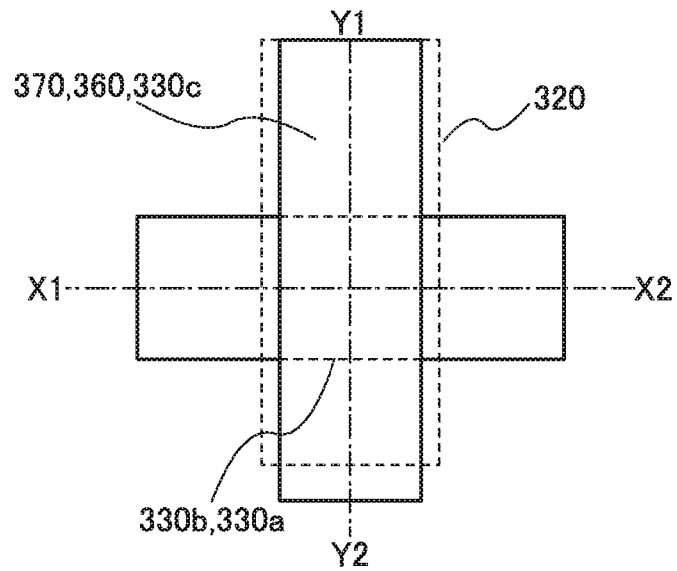
FIGS. 34A-34C A top view and cross-sectional views illustrating a transistor.
Figure 34B:
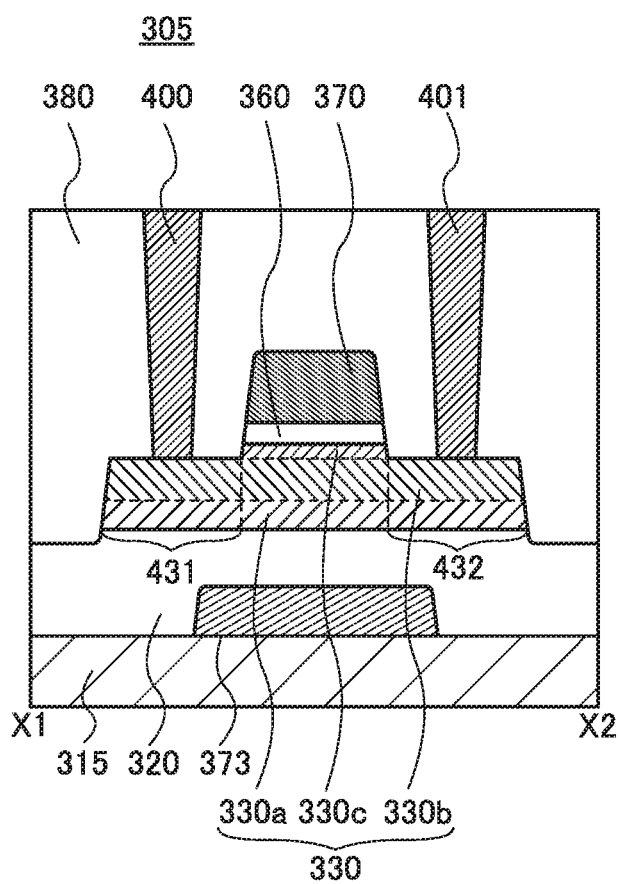
Figure 34C:
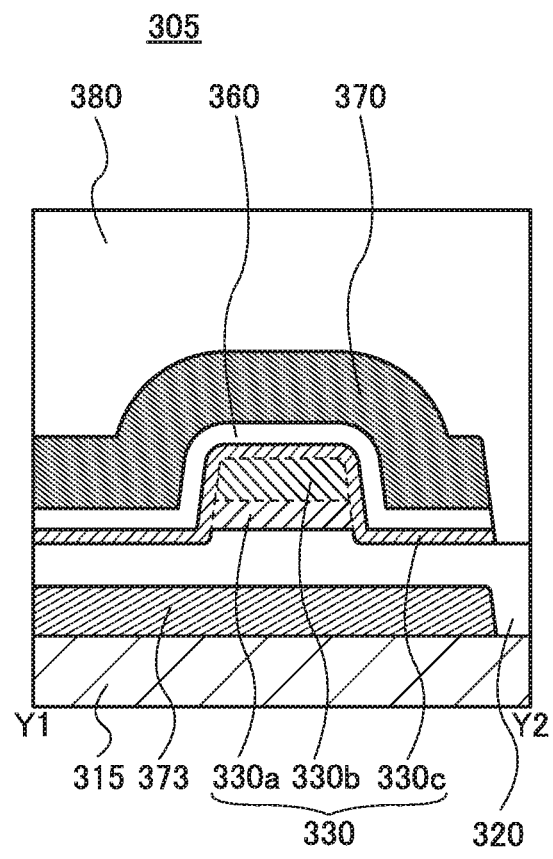

The transistor in one embodiment of the present invention may have a structure illustrated in FIGS. 34(A), (B), (C). FIG. 34(A) is a top view of a transistor 305, and a cross section along the direction of the dashed-dotted line X1-X2 in FIG. 34(A) corresponds to FIG. 34(B). A cross section along the direction of the dashed-dotted line Y1-Y2 in FIG. 34(A) corresponds to FIG. 34(C).

The transistor 305 includes the insulating layer 320 in contact with the substrate 315, the conductive layer 373 in contact with the insulating layer 320, the oxide semiconductor layer 330 in contact with the insulating layer 320, the insulating layer 360 in contact with the oxide semiconductor layer 330, and the conductive layer 370 in contact with the insulating layer 360.

In the insulating layer 380 serving as an interlayer insulating film, a conductor 400 in contact with a region 431 of the oxide semiconductor layer 330 and a conductor 401 in contact with a region 432 of the oxide semiconductor layer 330 are provided. The conductor 400 and the conductor 401 can function as part of the source electrode layer and part of the drain electrode layer.

An impurity for forming an oxygen vacancy to increase conductivity is preferably added to the region 431 and the region 432 in the transistor 305. As an impurity for forming an oxygen vacancy in an oxide semiconductor layer, one or more of the following can be used, for example: phosphorus, arsenic, antimony, boron, aluminum, silicon, nitrogen, helium, neon, argon, krypton, xenon, indium, fluorine, chlorine, titanium, zinc, and carbon. As a method for adding the impurity, a plasma treatment method, an ion implantation method, an ion doping method, a plasma immersion ion implantation method, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor that has become a conductor.

The transistor 305 has a self-aligned structure that does not include a region where the conductive layer 370 overlaps the conductive layer 340. A transistor with a self-aligned structure, which has extremely low parasitic capacitance between a gate electrode layer and source and drain electrode layers, is suitable for applications that require a high-speed operation.

Figure 35A:
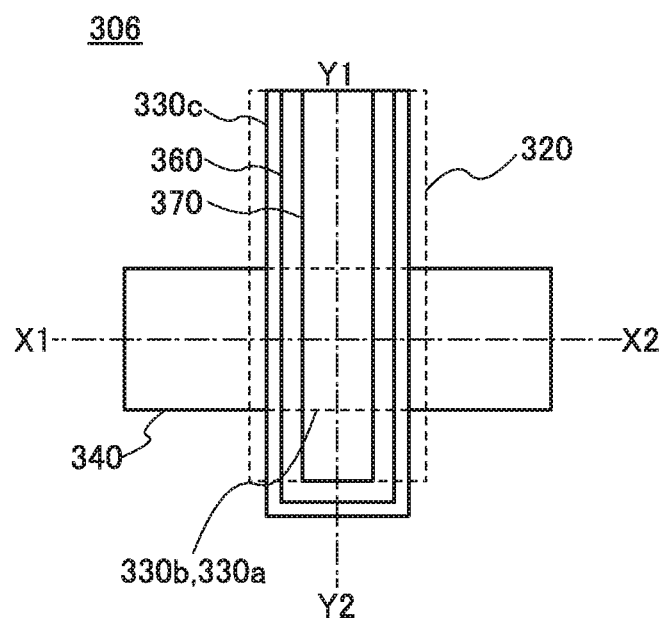
FIGS. 35A-35C A top view and cross-sectional views illustrating a transistor.
Figure 35B:
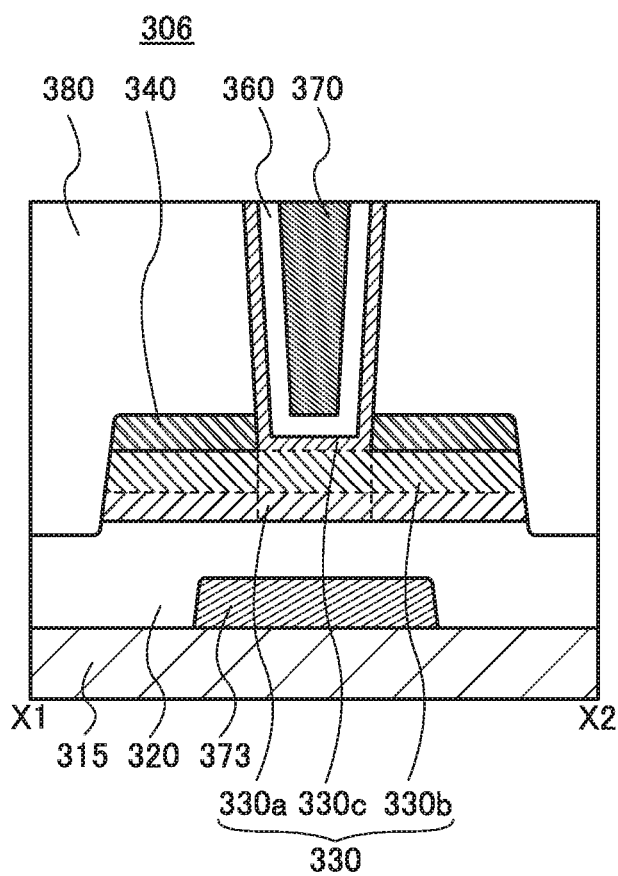
Figure 35C:
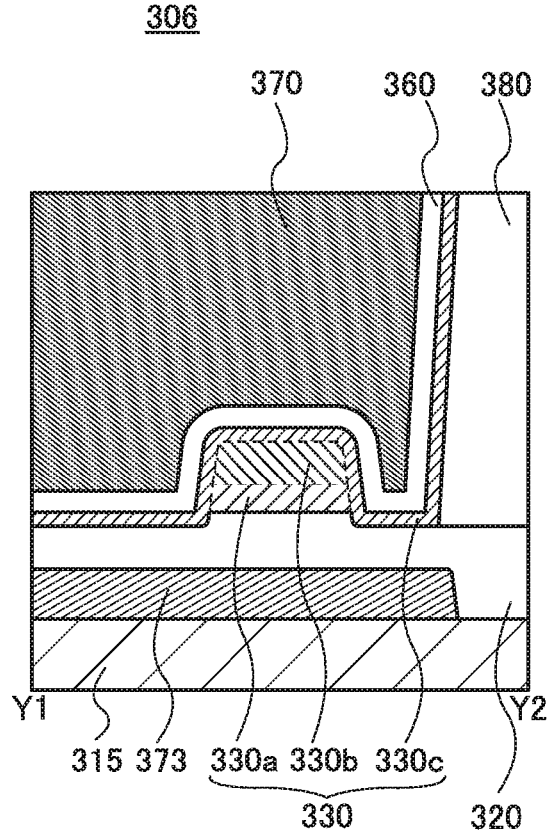

The transistor in one embodiment of the present invention may have a structure illustrated in FIGS. 35(A), (B), (C). FIG. 35(A) is a top view of a transistor 306, and a cross section along the direction of the dashed-dotted line X1-X2 in FIG. 35(A) corresponds to FIG. 35(B). A cross section along the direction of the dashed-dotted line Y1-Y2 in FIG. 35(A) corresponds to FIG. 35(C).

The transistor 306 includes the substrate 315, the insulating layer 320 over the substrate 315, the conductive layer 373 in contact with the insulating layer 320, the oxide semiconductor layer 330 (the oxide semiconductor layer 330a, the oxide semiconductor layer 330b, and the oxide semiconductor layer 330c) over the insulating layer 320, the conductive layer 340 that is in contact with the oxide semiconductor layer 330 and is positioned with a spacing, the insulating layer 360 in contact with the oxide semiconductor layer 330c, and the conductive layer 370 in contact with the insulating layer 360.

Note that the oxide semiconductor layer 330, the insulating layer 360, and the conductive layer 370 are provided in an opening that is provided in the insulating layer 380 over the transistor 306 and reaches the oxide semiconductor layer 330a, the oxide semiconductor layer 330b, and the insulating layer 320.

Figure 36A:
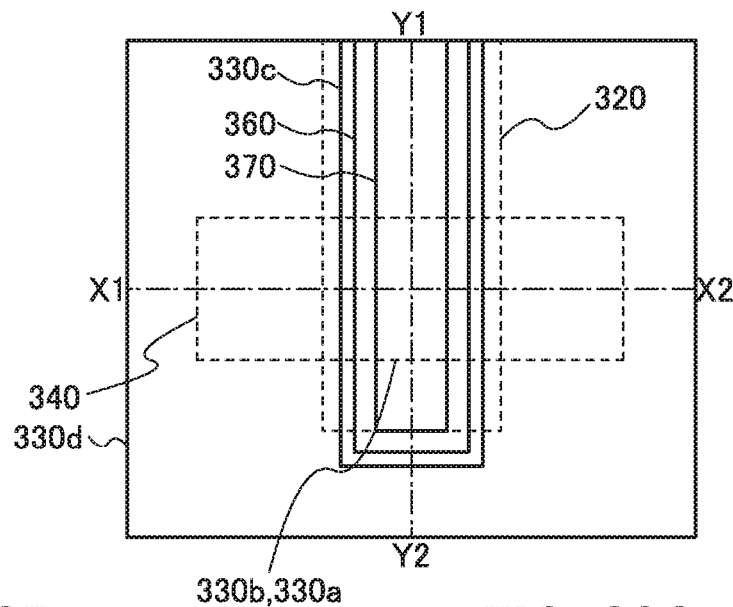
FIGS. 36A-36C A top view and cross-sectional views illustrating a transistor.
Figure 36B:
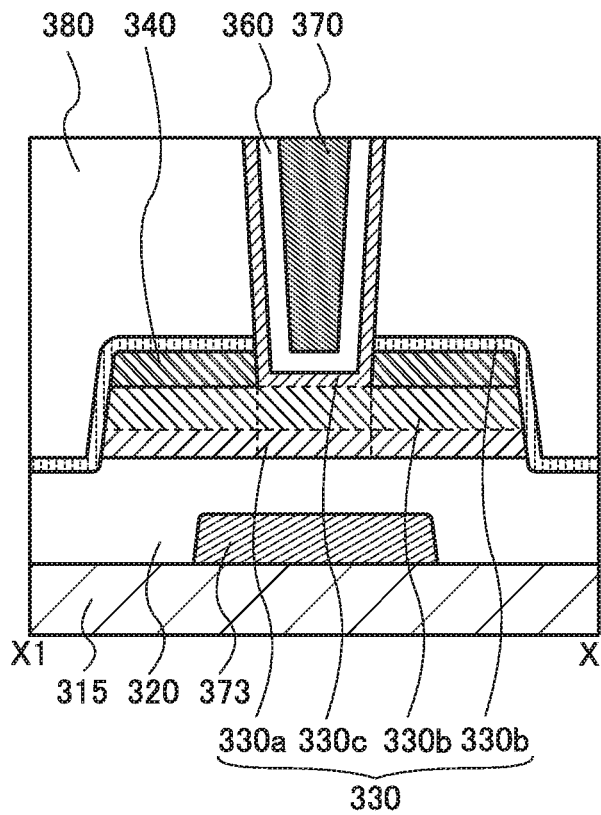
Figure 36C:
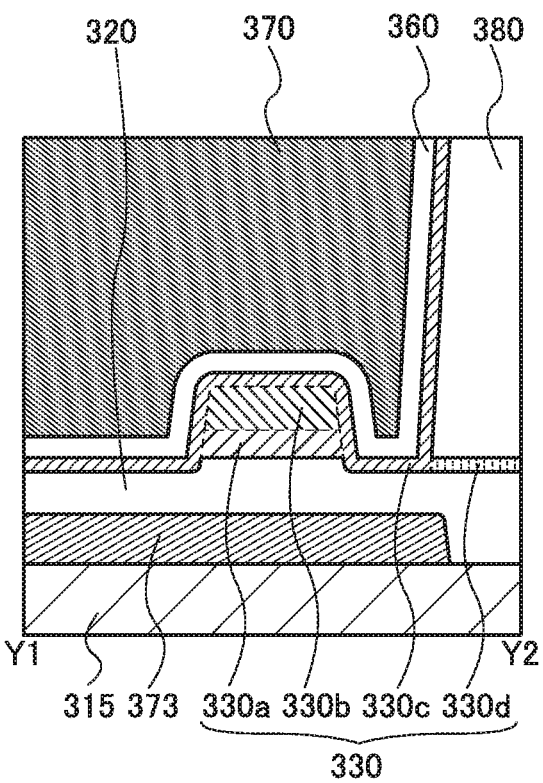

The transistor in one embodiment of the present invention may have a structure illustrated in FIGS. 36(A), (B), (C). FIG. 36(A) is a top view of a transistor 307, and a cross section along the direction of the dashed-dotted line X1-X2 in FIG. 36(A) corresponds to FIG. 36(B). A cross section along the dashed-dotted line Y1-Y2 in FIG. 36(A) corresponds to FIG. 36(C).

The transistor 307 has a structure similar to that of the transistor 306 except that the oxide semiconductor layer 330a, the oxide semiconductor layer 330b, and the conductive layer 340 are covered with the oxide semiconductor layer 330c and an oxide semiconductor layer 330d. The oxide semiconductor layer 330d can be formed using the same material as the oxide semiconductor layer 330c.

When the oxide semiconductor layer 330c and the oxide semiconductor layer 330d cover the oxide semiconductor layer 330a and the oxide semiconductor layer 330b, the effect of compensating for oxygen in the oxide semiconductor layer 330a, the oxide semiconductor layer 330b, and the insulating layer 320 can be enhanced. Moreover, oxidation of the conductive layer 340 by the insulating layer 380 can be suppressed by the existence of the oxide semiconductor layer 330d therebetween.

The transistor 306 and the transistor 307 have a structure in which a region where a conductor serving as a source or a drain overlaps with a conductor serving as a gate electrode is small; thus, parasitic capacitance can be reduced. Consequently, the transistor 306 and the transistor 307 are suitable for components of a circuit that requires a high-speed operation.

Figure 37A:
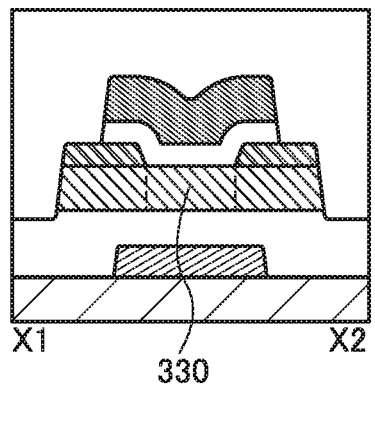
FIGS. 37A-37H Top views and cross-sectional views illustrating transistors.
Figure 37B:
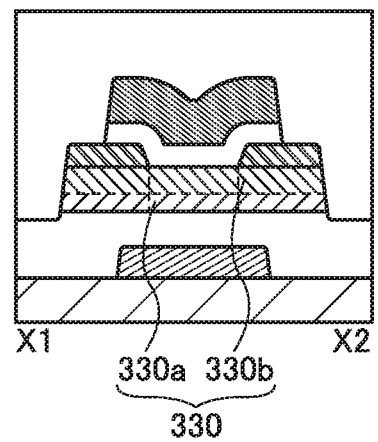

In the transistor of one embodiment of the present invention, the oxide semiconductor layer 330 may be a single layer as illustrated in FIG. 37(A). Furthermore, the oxide semiconductor layer 330 may be formed of two layers as illustrated in FIG. 37(B).

Figure 37C:
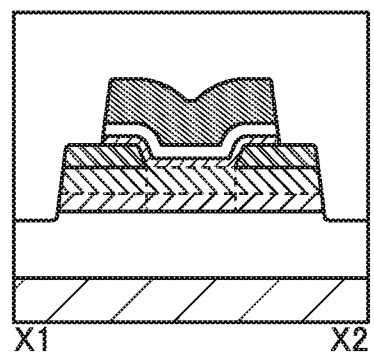

The transistor of one embodiment of the present invention may be configured not to include the conductive layer 373 as illustrated in FIG. 37(C).

Figure 37D:
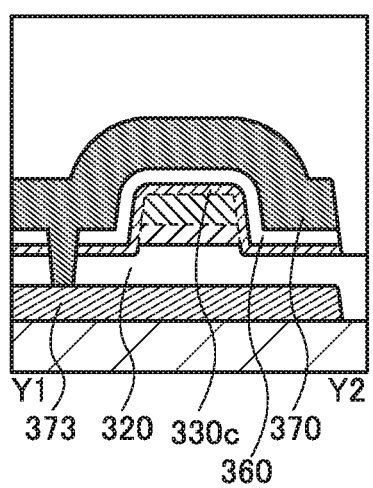

To electrically connect the conductive layer 370 to the conductive layer 373 in the transistor of one embodiment of the present invention, for example, an opening is formed in the insulating layer 320, the oxide semiconductor layer 330c, and the insulating layer 360 to reach the conductive layer 373, and the conductive layer 370 is formed to cover the opening as illustrated in FIG. 37(D).

Figure 37E:
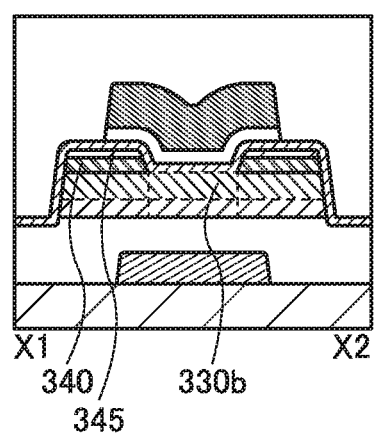

The transistor of one embodiment of the present invention may be provided with an insulating layer 345 that is in contact with the conductive layer 340 as illustrated in FIG. 37(E). The insulating layer 345 can prevent oxidation of the conductive layer 340.

As the insulating layer 345 and the insulating layer 355, a material with a blocking property against oxygen can be used. For example, as the insulating layer 345 and the insulating layer 355, a metal oxide such as aluminum oxide can be used.

Figure 37F:
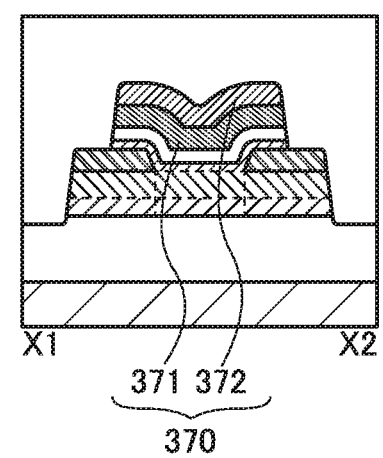

In the transistor of one embodiment of the present invention, the conductive layer 370 may be a stack including a conductive layer 371 and a conductive layer 372, as illustrated in FIG. 37(F).

Figure 37G:
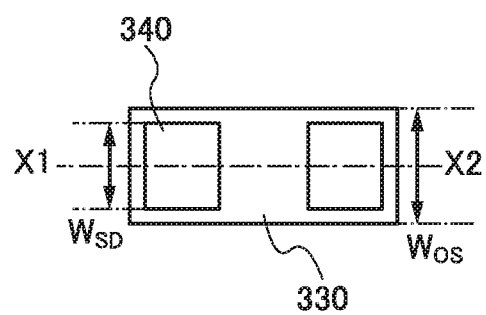
Figure 37H:
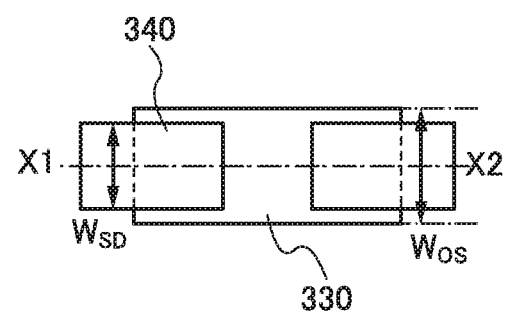

In the transistor of one embodiment of the present invention, in which the conductive layer 340 is provided over the oxide semiconductor layer 330, the width ($W_{SD}$) of the conductive layer 340 may be smaller than the width ($W_{OS}$) of the oxide semiconductor layer 330 as shown in top views of FIGS. 37(G), (H) (that only show the oxide semiconductor layer 330 and the conductive layer 340). When $W_{OS} \geq W_{SD}$ is satisfied ($W_{SD}$ is smaller than or equal to $W_{OS}$), a gate electric field is easily applied to the entire channel formation region, so that electrical characteristics of the transistor can be improved.

Note that FIGS. 37(A) to (F) illustrate variation examples of the transistor 301; these variation examples can also be applied to the other transistors described in this embodiment.

The transistor with any of the structures in one embodiment of the present invention has a structure in which the conductive layer 370 (and the conductive layer 373) serving as a gate electrode layer electrically surrounds the oxide semiconductor layer 330 in the channel width direction with the insulating layer therebetween. Such a structure can increase the on-state current and is referred to as a surrounded channel (s-channel) structure.

In the transistor including the oxide semiconductor layer 330a and the oxide semiconductor layer 330b and the transistor including the oxide semiconductor layer 330a, the oxide semiconductor layer 330b, and the oxide semiconductor layer 330c, selecting appropriate materials for the two or three layers forming the oxide semiconductor layer 330 allows a current to flow in the oxide semiconductor layer 330b. Since a current flows through the oxide semiconductor layer 330b, the current is hardly influenced by interface scattering, leading to a large on-state current.

By using the transistor with the above structure, a semiconductor device can have favorable electrical characteristics.

The structures described in this embodiment can be used in appropriate combination with the structures described in the other embodiments.

Embodiment 3

In this embodiment, components of the transistors shown in Embodiment 2 will be described in detail.

As the substrate 315, a glass substrate, a quartz substrate, a semiconductor substrate, a ceramic substrate, a metal substrate with an insulated surface, or the like can be used. Alternatively, a silicon substrate provided with a transistor or a photodiode; or the silicon substrate over which an insulating layer, a wiring, a conductor functioning as a contact plug, and the like are provided. When a p-channel transistor is formed on a silicon substrate, a silicon substrate with n⁻-type conductivity is preferably used. Alternatively, an SOI substrate including an n⁻-type or i-type silicon layer may be used. Moreover, when a p-channel transistor is formed on a silicon substrate, a silicon substrate whose surface where the transistor is formed has a (110) plane orientation is preferably used. In the case where a p-channel transistor is formed on the (110) plane, the mobility can be increased.

The insulating layer 320 can have a function of supplying oxygen to the oxide semiconductor layer 330 as well as a function of preventing diffusion of impurities from a component of the substrate 315. For this reason, the insulating layer 320 is preferably an insulating film containing oxygen, and further preferably an insulating film having an oxygen content higher than that in the stoichiometric composition. The insulating layer 320 is a film in which the amount of released oxygen when converted into oxygen atoms is greater than or equal to $1.0 \times 10^{19}$ atoms/cm$^3$ in TDS where heat treatment is performed such that the film surface temperature is, for example, higher than or equal to 100° C. and lower than or equal to 700° C., preferably higher than or equal to 100° C. and lower than or equal to 500° C. When the substrate 315 is a substrate provided with another device, the insulating layer 320 also has a function of an interlayer insulating film. In that case, the insulating layer 320 is preferably subjected to planarization treatment such as CMP treatment so as to have a flat surface.

As the conductive layer 373 functioning as a backgate electrode layer, a conductive film formed using Al, Ti, Cr, Co, Ni, Cu, Y, Zr, Mo, Ru, Ag, Mn, Nd, Sc, Ta, or W can be used, for example. It is also possible to use an alloy of the above material or a conductive nitride of the above material. Furthermore, a stack of a plurality of materials selected from the above materials, alloys of the above materials, and conductive nitrides of the above materials can also be used.

For example, the insulating layer 320 can be formed using an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film of silicon nitride, silicon nitride oxide, aluminum nitride, aluminum nitride oxide, or the like; or a mixed material of these. The insulating layer 320 may be a stack of any of the above materials.

The oxide semiconductor layer 330 can have a three-layer structure in which the oxide semiconductor layer 330a, the oxide semiconductor layer 330b, and the oxide semiconductor layer 330c are stacked in this order from the insulating layer 320 side.

Note that when the oxide semiconductor layer 330 is a single layer, a layer corresponding to the oxide semiconductor layer 330b described in this embodiment is used.

In the case of consisting of two layers, the oxide semiconductor layer 330 can be a stack in which a layer corresponding to the oxide semiconductor layer 330a and a layer corresponding to the oxide semiconductor layer 330b are stacked in this order from the insulating layer 320 side. In this structure, the positions of the oxide semiconductor layers 330a and 330b can be interchanged.

For the oxide semiconductor layer 330b, an oxide semiconductor whose electron affinity (energy from the vacuum level to the conduction band minimum) is higher than those of the oxide semiconductor layer 330a and the oxide semiconductor layer 330c is used, for example.

In such a structure, when a voltage is applied to the conductive layer 370, a channel is formed in the oxide semiconductor layer 330b whose energy at the conduction band minimum is the lowest in the oxide semiconductor layer 330. Therefore, the oxide semiconductor layer 330b can be regarded as having a region serving as a semiconductor, while the oxide semiconductor layer 330a and the oxide semiconductor layer 330c can be regarded as having a region serving as an insulator or a semi-insulator.

An oxide semiconductor that can be used for the oxide semiconductor layer 330a, the oxide semiconductor layer 330b, and the oxide semiconductor layer 330c preferably contains at least In or Zn. Moreover, both In and Zn are preferably contained. In addition to them, a stabilizer such as Al, Ga, Y, or Sn is preferably contained in order to reduce variations in electrical characteristics of the transistor using the oxide semiconductor.

For the oxide semiconductor layer 330a and the oxide semiconductor layer 330c, an In—Ga—Zn oxide with In:Ga:Zn=1:3:2, 1:3:3, 1:3:4, 1:3:6, 1:4:5, 1:6:4, or 1:9:6 (in an atomic ratio) or with an atomic ratio close to those ratios can be used, for example. For the oxide semiconductor layer 330b, an In—Ga—Zn oxide with an In:Ga:Zn=1:1:1, 2:1:3, 5:5:6, 3:1:2, 3:1:4, 5:1:6, or 4:2:3 (in an atomic ratio) or with an atomic ratio close to those ratios or the like can be used.

The oxide semiconductor layer 330a, the oxide semiconductor layer 330b, and the oxide semiconductor layer 330c may include crystal parts. For example, when crystals with c-axis alignment are used, the transistor can have stable electrical characteristics. Moreover, crystals with c-axis alignment are resistant to bending; thus, using such crystals can improve the reliability of a semiconductor device using a flexible substrate.

The conductive layer 340 functioning as a source electrode layer or a drain electrode layer can be formed with a single layer or a stacked layer of a material selected from Al, Cr, Cu, Ta, Ti, Mo, W, Ni, Mn, Nd, Sc, and alloys or conductive nitrides of these metal materials, for example. Using tantalum nitride, which is a conductive nitride, can prevent oxidation. It is also possible to use a stack of any of the above material and Cu or an alloy such as Cu—Mn, which has low resistance.

The above material is capable of extracting oxygen from an oxide semiconductor layer. Thus, in a region of the oxide semiconductor layer that is in contact with the above material, oxygen is released from the oxide semiconductor layer and an oxygen vacancy is formed. Hydrogen slightly contained in the layer and the oxygen vacancy are bonded to each other, so that the region is markedly changed to an n-type region. Accordingly, the n-type region can serve as a source or a drain of the transistor.

As the insulating layer 360 functioning as a gate insulating film, an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide can be used. The insulating layer 360 may be a stack of the above materials.

As the insulating layer 320 and the insulating layer 360 which are in contact with the oxide semiconductor layer 330, a film that releases a small amount of nitrogen oxide is preferably used. When the oxide semiconductor is in contact with an insulating layer that releases a large amount of nitrogen oxide, the density of states caused by nitrogen oxide becomes high in some cases.

By using the above insulating films as the insulating layer 320 and the insulating layer 360, a shift in the threshold voltage of the transistor can be reduced, which leads to reduced fluctuations in the electrical characteristics of the transistor.

As the conductive layer 370 functioning as a gate electrode layer, a conductive film of Al, Ti, Cr, Co, Ni, Cu, Y, Zr, Mo, Ru, Ag, Mn, Nd, Sc, Ta, W, or the like can be used, for example. Alloys of the above materials or conductive nitrides of the above materials can also be used. A stack containing a plurality of materials selected from the above materials, the alloys of the above materials, and the conductive nitrides of the above materials can also be used. Tungsten, a stack of tungsten and titanium nitride, or a stack of tungsten and tantalum nitride, or the like can be used typically. Alternatively, Cu or an alloy such as Cu—Mn, which has low resistance, or a stack of the above material and Cu or an alloy such as Cu—Mn may be used. For example, titanium nitride can be used for the conductive layer 371 and tungsten can be used for the conductive layer 372 to form the conductive layer 370.

As the conductive layer 370, an oxide conductive layer of In—Ga—Zn oxide, zinc oxide, indium oxide, tin oxide, indium tin oxide, or the like may be used. When the oxide conductive layer is provided in contact with the insulating layer 360, oxygen can be supplied from the oxide conductive layer to the oxide semiconductor layer 330.

As the insulating layer 380, an insulating film containing one or more kinds of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide can be used. The insulating layer may be a stack of the above materials.

Here, like the insulating layer 320, the insulating layer 380 preferably contains oxygen more than that in the stoichiometric composition. Oxygen released from the insulating layer 380 can be diffused into the channel formation region in the oxide semiconductor layer 330 through the insulating layer 360, so that oxygen vacancies formed in the channel formation region can be filled with oxygen. In this manner, stable electrical characteristics of the transistor can be achieved.

A film having an effect of blocking impurities is preferably provided over the transistor or the insulating layer 380. The blocking film can be a silicon nitride film, an aluminum nitride film, an aluminum oxide film, or the like.

A nitride insulating film has a function of blocking moisture and the like and can improve the reliability of the transistor. An aluminum oxide film has a high blocking effect of preventing penetration of both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 330, preventing release of oxygen from the oxide semiconductor layer, and preventing unnecessary release of oxygen from the insulating layer 320.

High integration of a semiconductor device requires transistor miniaturization. However, miniaturization of a transistor tends to cause deterioration of electrical characteristics of the transistor. For example, a decrease in channel width causes a reduction in on-state current.

The transistor of one embodiment of the present invention can have a structure in which the oxide semiconductor layer 330c covers the oxide semiconductor layer 330b in which the channel is formed. In this structure, the channel formation layer is not in contact with the gate insulating film; thus, scattering of carriers formed at the interface between the channel formation layer and the gate insulating film can be reduced, and the on-state current of the transistor can be increased.

In the transistor of one embodiment of the present invention, as described above, the gate electrode layer (the conductive layer 370) is formed to electrically surround the oxide semiconductor layer 330 in the channel width direction. Accordingly, a gate electric field is applied to the oxide semiconductor layer 330 from a direction perpendicular to its side surface in addition to a gate electric field from a direction perpendicular to its top surface. In other words, a gate electric field is applied to the entire channel formation layer and effective channel width is increased, leading to a further increase in the on-state current.

Although the variety of films such as the metal films, the semiconductor films, and the inorganic insulating films described in this embodiment can be formed typically by a sputtering method or a plasma-enhanced CVD method, such films may be formed by another method such as a thermal CVD method. Examples of a thermal CVD method include an MOCVD (metal organic chemical vapor deposition) method and an ALD (atomic layer deposition) method.

A thermal CVD method, which is a film deposition method that does not use plasma, has an advantage that no defect due to plasma damage is generated.

Film formation by a thermal CVD method may be performed in such a manner that a source gas and an oxidizer are supplied to a chamber at a time, the pressure in the chamber is set to an atmospheric pressure or a reduced pressure, and reaction is performed in the vicinity of the substrate or over the substrate to cause deposition over the substrate.

Film formation by an ALD method is performed in such a manner that the pressure in a chamber is set to an atmospheric pressure or a reduced pressure, source gases for reaction are introduced into the chamber and reacted, and then this sequence is repeated. An inert gas (e.g., argon or nitrogen) may be introduced as a carrier gas together with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of an inert gas, and then the second source gas may be introduced. The first source gas is adsorbed on the surface of the substrate and reacted to form a first layer, and then, the second source gas introduced later is adsorbed on the first layer and reacted. As a result, a second layer is stacked over the first layer, so that a thin film is formed. The sequence of the gas introduction is controlled and repeated a plurality of times until a desired thickness is obtained, whereby a thin film with excellent step coverage can be formed. The thickness of the thin film can be adjusted by the number of repetitions of the sequence of gas introduction; therefore, ALD makes it possible to accurately adjust a film thickness and thus is suitable for manufacturing a minute FET.

A facing-target-type sputtering apparatus can be used to form an oxide semiconductor layer. Deposition using a facing-target-type sputtering apparatus can be referred to as VDSP (vapor deposition SP).

When an oxide semiconductor layer is deposited using a facing-target-type sputtering apparatus, plasma damage to the oxide semiconductor layer at the time of deposition can be reduced. Thus, oxygen vacancies in the film can be reduced. In addition, the use of the facing-target-type sputtering apparatus enables low-pressure deposition. Accordingly, the concentration of impurities (e.g., hydrogen, a rare gas (e.g., argon), water, and the like) in a deposited oxide semiconductor layer can be lowered.

The structures described in this embodiment can be used in appropriate combination with the structures described in the other embodiments.

Embodiment 4

In this embodiment, the material of an oxide semiconductor that can be used for one embodiment of the present invention will be described.

An oxide semiconductor preferably contains at least indium or zinc. In particular, indium and zinc are preferably contained. In addition, aluminum, gallium, yttrium, tin, or the like is preferably contained. Furthermore, one kind or a plurality of kinds selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide semiconductor contains indium, an element M, and zinc is considered. The element M is aluminum, gallium, yttrium, tin, or the like. As the other elements that can be used as the element M, there are boron, silicon, titanium, iron, nickel, germanium, zirconium, molybdenum, lanthanum, cerium, neodymium, hafnium, tantalum, tungsten, magnesium, and the like. Note that a plurality of the above elements may be used in combination as the element M.

First, preferred ranges of the atomic ratio of indium, the element M, and zinc contained in an oxide semiconductor of the present invention are described with reference to FIG. 38(A), FIG. 38(B), and FIG. 38(C). Note that the atomic ratio of oxygen is not shown in FIG. 38. The terms of the atomic ratio of indium, the element M, and zinc contained in the oxide semiconductor are denoted by [In], [M], and [Zn], respectively.

Figure 38A:
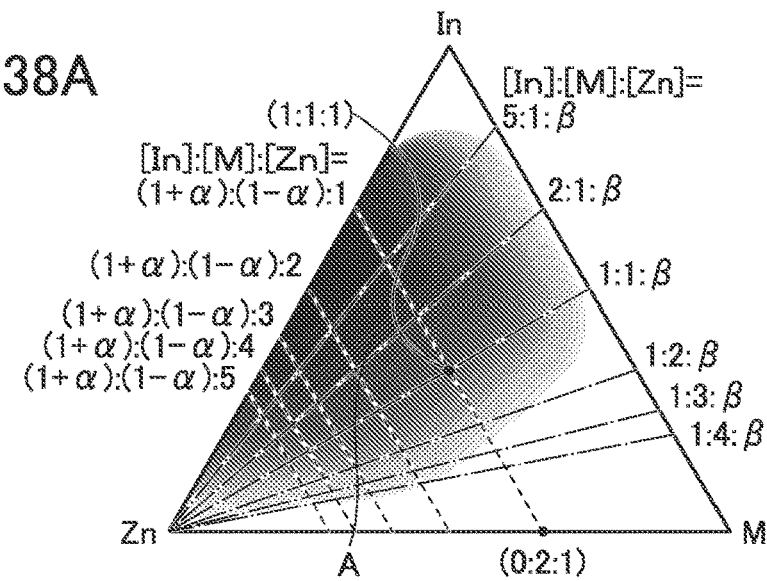
FIGS. 38A-38C Views illustrating ranges of the atomic ratio of oxide semiconductors.
Figure 38B:
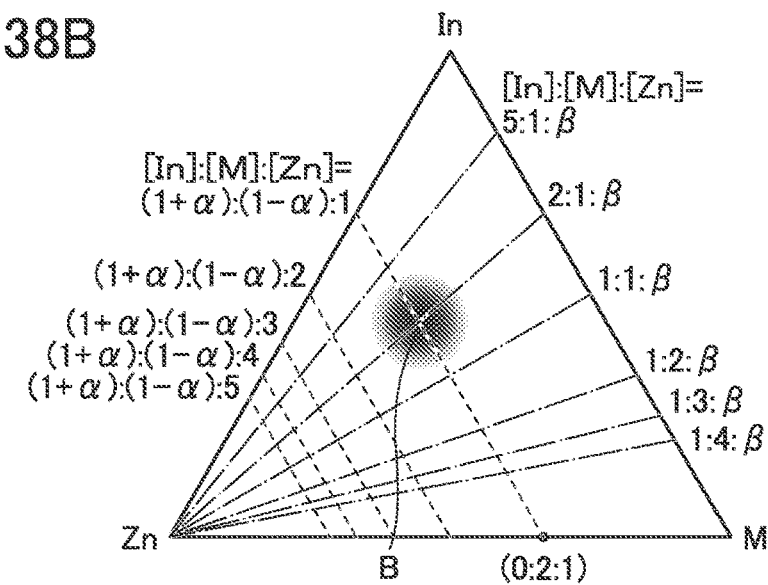
Figure 38C:
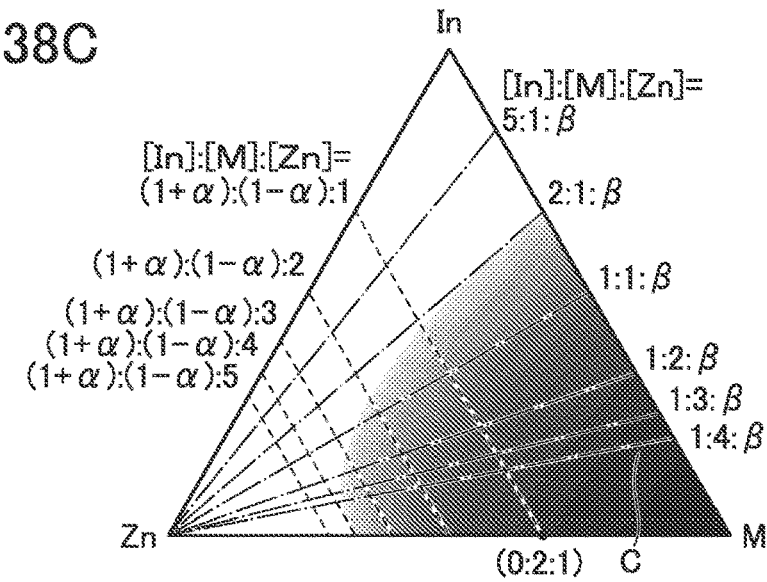

In FIG. 38(A), FIG. 38(B), and FIG. 38(C), broken lines indicate a line where the atomic ratio $[In]:[M]:[Zn]=(1+\alpha):(1-\alpha):1$ ($-1\leq\alpha\leq1$), a line where the atomic ratio $[In]:[M]:[Zn]=(1+\alpha):(1-\alpha):2$, a line where the atomic ratio $[In]:[M]:[Zn]=(1+\alpha):(1-\alpha):3$, a line where the atomic ratio $[In]:[M]:[Zn]=(1+\alpha):(1-\alpha):4$, and a line where the atomic ratio $[In]:[M]:[Zn]=(1+\alpha):(1-\alpha):5$.

Dashed-dotted lines indicate a line where the atomic ratio $[In]:[M]:[Zn]=1:1:\beta$ ($\beta\geq0$), a line where the atomic ratio $[In]:[M]:[Zn]=1:2:\beta$, a line where the atomic ratio $[In]:[M]:[Zn]=1:3:\beta$, a line where the atomic ratio $[In]:[M]:[Zn]$ is $1:4:\beta$, a line where the atomic ratio $[In]:[M]:[Zn]$ is $2:1:\beta$ and a line where the atomic ratio $[In]:[M]:[Zn]=5:1:\beta$.

A dashed double-dotted line indicates a line where the atomic ratio $[In]:[M]:[Zn]=(1+\gamma):2:(1-\gamma)$ ($-1\leq\gamma\leq1$). The oxide semiconductor illustrated in FIG. 38 with an atomic ratio of $[In]:[M]:[Zn]=0:2:1$ or an atomic ratio that is in the neighborhood is likely to have a spinel crystal structure.

FIG. 38(A) and FIG. 38(B) show examples of the preferred ranges of the atomic ratio of indium, the element M, and zinc contained in an oxide semiconductor of one embodiment of the present invention.

Figure 39:
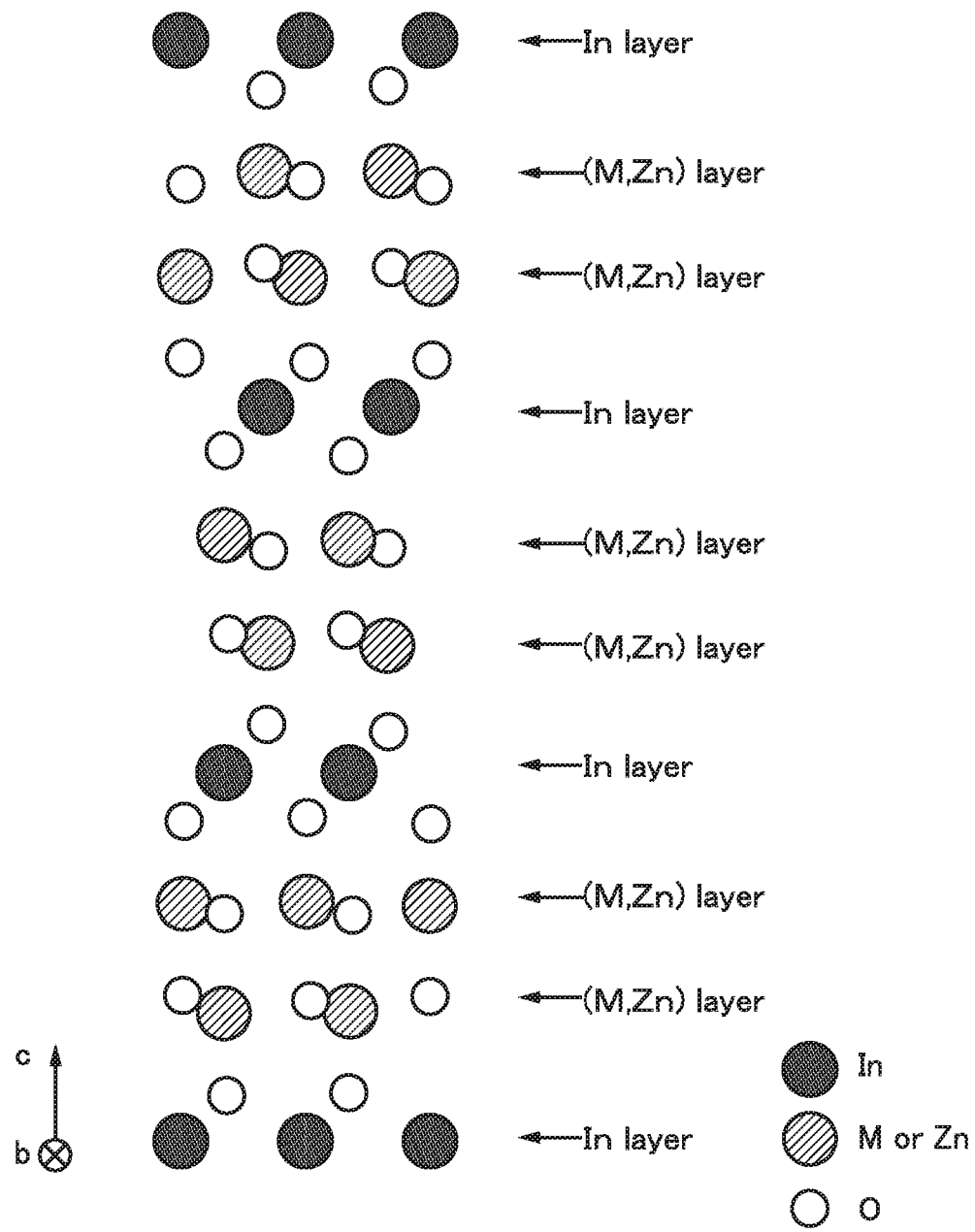
FIG. 39 A view illustrating an InMZnO$_4$ crystal.

FIG. 39 shows an example of the crystal structure of InMZnO$_4$ having $[In]:[M]:[Zn]=1:1:1$. Note that FIG. 39 illustrates the crystal structure of InMZnO$_4$ observed from a direction parallel to a b-axis. Note that a metal element in a layer that contains M, Zn, and oxygen (hereinafter, referred to as an "(M,Zn) layer") in FIG. 39 represents the element M or zinc. In that case, the proportion of the element M is the same as the proportion of zinc. The element M and zinc can be replaced with each other, and their arrangement is random.

InMZnO$_4$ has a layered crystal structure (also referred to as a layered structure) and includes two (M,Zn) layers that contain the element M, zinc, and oxygen for every single layer that contains indium and oxygen (hereinafter, referred to as an In layer), as illustrated in FIG. 39.

Indium and the element M can be replaced with each other. Therefore, when the element M in the (M,Zn) layer is replaced with indium, the layer can also be referred to as an (In,M,Zn) layer. In that case, a layered structure that contains two (In,M,Zn) layers for every single In layer is obtained.

An oxide semiconductor whose atomic ratio $[In]:[M]:[Zn]=1:1:2$ has a layered structure that contains three (M,Zn) layers for every single In layer. In other words, if [Zn] is higher than [In] and [M], the proportion of the (M,Zn) layer to the In layer becomes higher when the oxide semiconductor is crystallized.

Note that in the case where the number of (M,Zn) layers with respect to one In layer is not an integer in the oxide semiconductor, the oxide semiconductor might have a plurality of kinds of layered structures where the number of (M,Zn) layers with respect to one In layer is an integer. For example, in the case of $[In]:[M]:[Zn]=1:1:1.5$, the oxide semiconductor might have a layered structure in which a layered structure containing two (M,Zn) layers for every single In layer and a layered structure containing three (M,Zn) layers for every single In layer are mixed.

For example, in the case where the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide semiconductor in some cases. For example, with an atomic ratio that is close to an atomic ratio $[In]:[M]:[Zn]=0:2:1$, two phases, that is, a spinel crystal structure and a layered crystal structure are likely to exist. In addition, with an atomic ratio that is close to an atomic ratio $[In]:[M]:[Zn]=1:0:0$, two phases, that is, a bixbyite crystal structure and a layered crystal structure are likely to exist. In the case where a plurality of phases exist in the oxide semiconductor, a grain boundary might be formed between different crystal structures.

In addition, the oxide semiconductor containing a higher proportion of indium can have high carrier mobility (electron mobility). This is because in an oxide semiconductor containing indium, the element M, and zinc, the s orbital of heavy metal mainly contributes to carrier transfer, and when the proportion of indium is increased, an overlapping region of the s orbitals is increased; therefore, an oxide semiconductor containing a high proportion of indium has higher carrier mobility than an oxide semiconductor having a low proportion of indium.

In contrast, when the indium content and the zinc content in an oxide semiconductor become lower, carrier mobility becomes lower. Thus, with an atomic ratio of $[In]:[M]:[Zn]=0:1:0$ and an atomic ratio in the vicinity thereof (e.g., a region C in FIG. 38(C)), insulation performance becomes high.

Accordingly, an oxide semiconductor of one embodiment of the present invention preferably has an atomic ratio represented by a region A in FIG. 38(A), which facilitates a layered structure with high carrier mobility and a few grain boundaries.

A region B in FIG. 38(B) represents $[In]:[M]:[Zn]=4:2:3$ to 4.1 and the vicinity thereof. The vicinity includes an atomic ratio of $[In]:[M]:[Zn]=5:3:4$. An oxide semiconductor with an atomic ratio represented by the region B is an excellent oxide semiconductor that has particularly high crystallinity and high carrier mobility.

Note that conditions for forming a layered structure of an oxide semiconductor are not uniquely determined by the atomic ratio. There is a difference in the degree of difficulty in forming a layered structure among atomic ratios. Even with the same atomic ratio, whether a layered structure is formed or not depends on a formation condition. Therefore, the illustrated regions are regions representing atomic ratios with which an oxide semiconductor has a layered structure, and boundaries of the regions A to C are not clear.

Next, the case where the oxide semiconductor is used for a transistor is described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for the transistor. For example, an oxide semiconductor whose carrier density is lower than $8\times10^{11}/cm^3$, preferably lower than $1\times10^{11}/cm^3$, further preferably lower than $1\times10^{10}/cm^3$, and greater than or equal to $1\times10^{-9}/cm^3$ is used.

A highly purified intrinsic or substantially highly purified intrinsic oxide semiconductor has few carrier generation sources and thus can have a low carrier density. A highly purified intrinsic or substantially highly purified intrinsic oxide semiconductor has a low density of defect states and accordingly has a low density of trap states in some cases.

Charges trapped by the trap states in the oxide semiconductor take a long time to be released and may behave like fixed charges. Thus, the transistor whose channel region is formed in the oxide semiconductor having a high density of trap states has unstable electrical characteristics in some cases.

In order to obtain stable electrical characteristics of the transistor, it is effective to reduce the concentration of impurities in the oxide semiconductor. In order to reduce the concentration of impurities in the oxide semiconductor, the concentration of impurities in a film that is adjacent to the oxide semiconductor is preferably reduced. As examples of the impurities, hydrogen, nitrogen, alkali metal, alkaline earth metal, iron, nickel, silicon, and the like are given.

Here, the influence of impurities in the oxide semiconductor is described.

When silicon or carbon that is one of Group 14 elements is contained in the oxide semiconductor, defect states are formed in the oxide semiconductor. Thus, the concentration of silicon or carbon in the oxide semiconductor and around an interface with the oxide semiconductor (measured by secondary ion mass spectrometry (SIMS)) is set lower than or equal to $2\times10^{18}$ atoms/$cm^3$, and preferably lower than or equal to $2\times10^{17}$ atoms/$cm^3$.

When the oxide semiconductor contains alkali metal or alkaline earth metal, defect states are formed and carriers are generated, in some cases. Thus, a transistor including an oxide semiconductor that contains alkali metal or alkaline earth metal is likely to have normally-on characteristics. Therefore, it is preferable to reduce the concentration of alkali metal or alkaline earth metal in the oxide semiconductor. Specifically, the concentration of alkali metal or alkaline earth metal in the oxide semiconductor measured by SIMS is set lower than or equal to $1\times10^{18}$ atoms/$cm^3$, and preferably lower than or equal to $2\times10^{16}$ atoms/$cm^3$.

When the oxide semiconductor contains nitrogen, the oxide semiconductor easily becomes n-type by generation of electrons serving as carriers and an increase of carrier density. Thus, a transistor in which an oxide semiconductor containing nitrogen is used as the semiconductor is likely to have normally-on characteristics. For this reason, nitrogen in the oxide semiconductor is preferably reduced as much as possible; for example, the concentration of nitrogen in the oxide semiconductor, which is measured by SIMS, is lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in an oxide semiconductor reacts with oxygen bonded to a metal atom to be water, and thus forms an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor that contains hydrogen is likely to have normally-on characteristics. Accordingly, it is preferable that hydrogen in the oxide semiconductor be reduced as much as possible. Specifically, the hydrogen concentration of the oxide semiconductor measured by SIMS is set lower than $1\times10^{20}$ atoms/$cm^3$, preferably lower than $1\times10^{19}$ atoms/$cm^3$, further preferably lower than $5\times10^{18}$ atoms/$cm^3$, and still further preferably lower than $1\times10^{18}$ atoms/$cm^3$.

When an oxide semiconductor with sufficiently reduced impurities is used for a channel formation region in a transistor, the transistor can have stable electrical characteristics.

Next, the case where the oxide semiconductor has a two-layer structure or a three-layer structure is described. A band diagram of a stacked structure of an oxide semiconductor S1, an oxide semiconductor S2, and an oxide semiconductor S3 and insulators that are in contact with the stacked structure and a band diagram of a stacked structure of the oxide semiconductor S2 and the oxide semiconductor S3 and insulators that are in contact with the stacked structure are described with reference to FIG. 40.

Figure 40A:
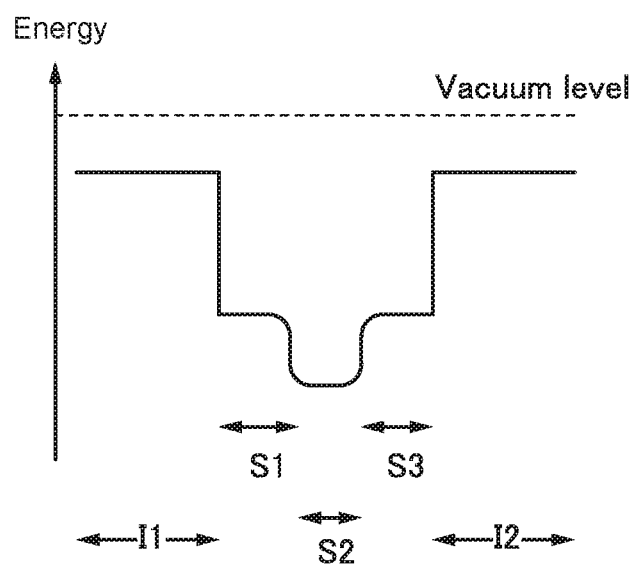
FIGS. 40A-40B Band diagrams of stacked structures of oxide semiconductors.
Figure 40B:
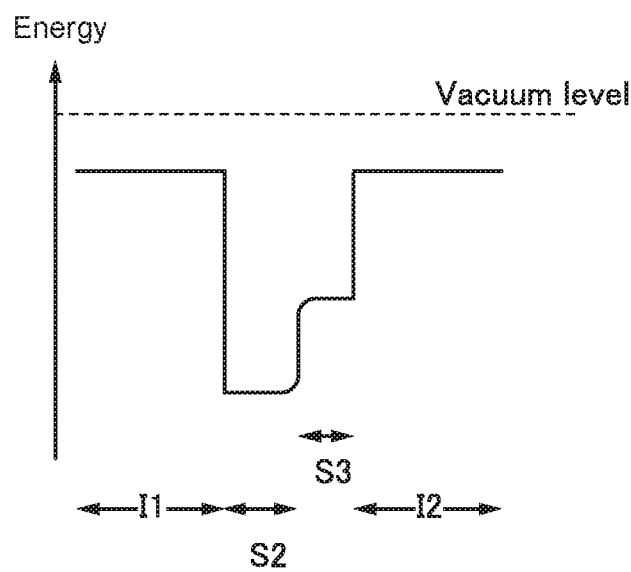

FIG. 40(A) is an example of a band diagram of a stacked structure including an insulator I1, the oxide semiconductor S1, the oxide semiconductor S2, the oxide semiconductor S3, and an insulator I2 in a film thickness direction. FIG. 40(B) is an example of a band diagram of a stacked structure including the insulator I1, the oxide semiconductor S2, the oxide semiconductor S3, and the insulator I2 in a film thickness direction. Note that for easy understanding, the band diagrams show the energy levels of the conduction band minimum (Ec) of the insulator I1, the oxide semiconductor S1, the oxide semiconductor S2, the oxide semiconductor S3, and the insulator I2.

The energy levels of the conduction band minimum of the oxide semiconductor S1 and the oxide semiconductor S3 are closer to the vacuum level than that of the oxide semiconductor S2. Typically, a difference in energy level between the conduction band minimum of the oxide semiconductor S2 and the conduction band minimums of the oxide semiconductors S1 and S3 is preferably greater than or equal to 0.15 eV or greater than or equal to 0.5 eV, and less than or equal to 2 eV or less than or equal to 1 eV. That is, it is preferable that the electron affinity of the oxide semiconductor S2 be higher than the electron affinities of the oxide semiconductors S1 and S3, and the difference between the electron affinities of the oxide semiconductors S1 and S3 and the electron affinity of the oxide semiconductor S2 be greater than or equal to 0.15 eV or greater than or equal to 0.5 eV, and less than or equal to 2 eV or less than or equal to 1 eV.

As illustrated in FIG. 40(A) and FIG. 40(B), the energy level of the conduction band minimum of the oxide semiconductor S1, the oxide semiconductor S2, and the oxide semiconductor S3 is gradually varied. In other words, it is continuously varied or continuously connected. In order to obtain such a band diagram, the density of defect states in a mixed layer formed at an interface between the oxide semiconductor S1 and the oxide semiconductor S2 or an interface between the oxide semiconductor S2 and the oxide semiconductor S3 is preferably made low.

Specifically, when the oxide semiconductors S1 and S2 or the oxide semiconductors S2 and S3 contain the same element (as a main component) in addition to oxygen, a mixed layer with a low density of defect states can be formed. For example, in the case where the oxide semiconductor S2 is an In—Ga—Zn oxide semiconductor, it is preferable to use an In—Ga—Zn oxide semiconductor, a Ga—Zn oxide semiconductor, gallium oxide, or the like as the oxide semiconductor S1 and the oxide semiconductor S3.

At this time, the oxide semiconductor S2 serves as a main carrier path. Since the density of defect states at the interface between the oxide semiconductors S1 and S2 and the interface between the oxide semiconductors S2 and S3 can be made low, the influence of interface scattering on carrier conduction is small, and a high on-state current can be obtained.

When an electron is trapped in a trap state, the trapped electron behaves like a fixed charge; thus, the threshold voltage of the transistor is shifted in a positive direction. The oxide semiconductor S1 and the oxide semiconductor S3 can make the trap state apart from the oxide semiconductor S2. This structure can prevent the positive shift of the threshold voltage of the transistor.

Materials whose conductivities are sufficiently lower than that of the oxide semiconductor S2 are used for the oxide semiconductor S1 and the oxide semiconductor S3. In that case, the oxide semiconductor S2, the interface between the oxide semiconductor S2 and the oxide semiconductor S1, and the interface between the oxide semiconductor S2 and the oxide semiconductor S3 mainly function as a channel region. For example, oxide semiconductors with the atomic ratios represented by the region C in FIG. 38(C), which enable high insulation performance, can be used as the oxide semiconductor S1 and the oxide semiconductor S3. Note that the region C in FIG. 38(C) represents the atomic ratio of [In]:[M]:[Zn]=0:1:0 or the vicinity thereof.

In the case where an oxide semiconductor with the atomic ratio represented by the region A is used as the oxide semiconductor S2, it is particularly preferable to use oxide semiconductors with atomic ratios where [M]/[In] is greater than or equal to 1, preferably greater than or equal to 2 as the oxide semiconductor S1 and the oxide semiconductor S3. In addition, an oxide semiconductor having [M]/([Zn]+[In]) greater than or equal to 1, which enables sufficiently high insulation performance, is suitably used as the oxide semiconductor S3.

The structures described in this embodiment can be used in appropriate combination with the structures described in the other embodiments.

Embodiment 5

In this embodiment, specific examples of the mobile unit or the like of one embodiment of the present invention will be described with reference to the drawings.

Figure 41A:
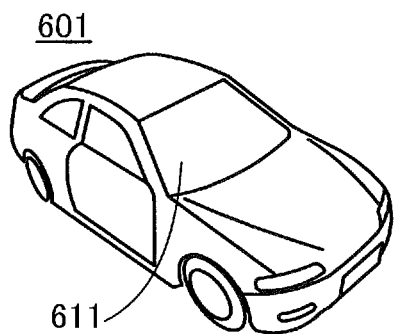
FIGS. 41A-41D Views illustrating examples of a mobile unit.

FIG. 41(A) illustrates an automobile 601. The automobile 601 includes a window portion 611. The mobile unit of one embodiment of the present invention can be used for the automobile 601 including the window portion 611. With this structure, the automobile 601 can be a novelty that can reduce the glare perceived by a driver of the automobile 601 even in the case where an oncoming car is emitting high beams.

Figure 41B:
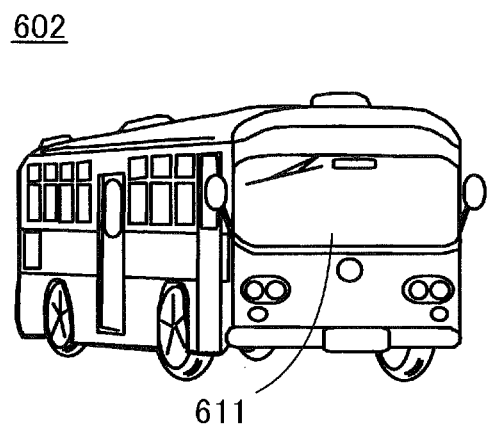

FIG. 41(B) illustrates a bus 602. The bus 602 includes the window portion 611. The mobile unit of one embodiment of the present invention can be used for the bus 602 including the window portion 611. With this structure, the bus 602 can be a novelty that can reduce the glare perceived by a driver of the bus 602 even in the case where an oncoming car is emitting high beams.

Figure 41C:
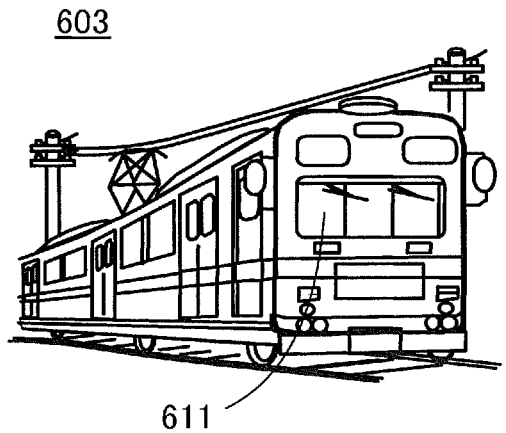

FIG. 41(C) illustrates a train 603. The train 603 includes the window portion 611. The mobile unit of one embodiment of the present invention can be used for the train 603 including the window portion 611. With this structure, the train 603 can be a novelty that can reduce the glare perceived by a driver of the train 603 even in the case where an oncoming train is emitting high beams.

Figure 41D:
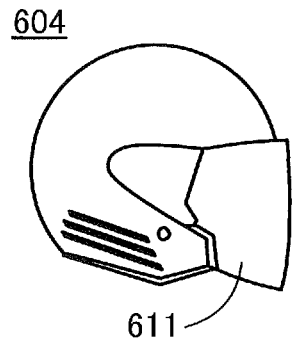

FIG. 41(D) illustrates a helmet 604. An occupant wears the helmet 604 for safety in driving a motorcycle or the like, which is a mobile unit. The helmet 604 includes the window portion 611. The mobile unit of one embodiment of the present invention can be used for the helmet 604 including the window portion 611. With this structure, the helmet 604 can be a novelty that can reduce the glare perceived by a driver of the motorcycle or the like who is wearing the helmet 604 even in the case where an oncoming car is emitting high beams. Note that the helmet may be replaced with other structures as long as they are glasses-type objects to wear.

The structures described in this embodiment can be used in appropriate combination with the structures described in the other embodiments.

REFERENCE NUMERALS 11 imaging element, 20 pixel, 20a pixel, 20b pixel, 20c pixel, 20d pixel, 20e pixel, 20f pixel, 20g pixel, 21 pixel array, 22 circuit, 23 circuit, 24 circuit, 25 circuit, 30 circuit, 41 transistor, 42 transistor, 43 transistor, 44 transistor, 45 transistor, 61 wiring, 61a wiring, 61d wiring, 62 wiring, 63 wiring, 64 wiring, 65 wiring, 71 wiring, 72 wiring, 73 wiring, 75 wiring, 76 wiring, 77 wiring, 78 wiring, 81 insulating layer, 81a insulating layer, 81b insulating layer, 81c insulating layer, 81d insulating layer, 81e insulating layer, 82 conductor, 91 wiring, 100 mobile unit, 101 control circuit, 102 window portion, 103 sensor, 103L sensor, 103R sensor, 104 sensor, 104L sensor, 104R sensor, 105 sensor, 111 sensor circuit, 112 memory circuit, 113 arithmetic circuit, 114 brake, 120 driver, 121 eye, 121L left eye, 121R right eye, 122 region, 123 sensor, 123L sensor, 123R sensor, 130 oncoming car, 131 headlight, 132 high beam, 133 low beam, 134 road surface, 135 pedestrian, 140 region, 150 seat, 151 sensor, 152 sun visor, 160 car behind, 161 headlight, 162 high beam, 164 sensor, 164L sensor, 164R sensor, 200 liquid crystal panel, 201A substrate, 201B substrate, 201C substrate, 202 liquid crystal, 202A liquid crystal, 202B liquid crystal, 203A polarizing plate, 203B polarizing plate, 211 windshield, 212 front door glass, 213 rear door glass, 213B rear door glass, 214 back glass, 214B back glass, 301 transistor, 302 transistor, 303 transistor, 304 transistor, 305 transistor, 306 transistor, 307 transistor, 315 substrate, 320 insulating layer, 330 oxide semiconductor layer, 330a oxide semiconductor layer, 330b oxide semiconductor layer, 330c oxide semiconductor layer, 330d oxide semiconductor layer, 340 conductive layer, 345 insulating layer, 355 insulating layer, 360 insulating layer, 370 conductive layer, 371 conductive layer, 372 conductive layer, 373 conductive layer, 380 insulating layer, 400 conductor, 401 conductor, 410 insulating layer, 431 region, 432 region, 510 region, 520 region, 530 region, 540 region, 545 region, 550 conductive layer, 560 conductive layer, 601 automobile, 602 bus, 603 train, 604 helmet, 611 window portion, 1100 layer, 1200 layer, 1300 layer, 1530 light-blocking layer, 1540 microlens array, 1550a optical conversion layer, 1550b photoelectric conversion layer, 1550c photoelectric conversion layer

What is claimed is:

1. A mobile unit comprising:
   a first sensor;
   a second sensor; and
   a window portion,
   wherein the first sensor is configured to sense a position of eyes of a driver,
   wherein the second sensor is configured to sense a region that is to be irradiated with a beam by an oncoming car, and
   wherein a light transmittance of the window portion is configured to be decreased on the basis of outputs of the first sensor and the second sensor.

2. The mobile unit according to claim 1,
   wherein the first sensor is positioned inside the mobile unit, and
   wherein the second sensor is positioned outside the mobile unit.

3. The mobile unit according to claim 1,
   wherein a dynamic range of the second sensor is higher than a dynamic range of the first sensor, and
   wherein a frame frequency of the second sensor is higher than a frame frequency of the first sensor.

4. The mobile unit according to claim 1,
   wherein the first sensor comprises a first imaging element,
   wherein the second sensor comprises a second imaging element,
   wherein the first imaging element is configured to be operated by a rolling shutter method, and
   wherein the second imaging element is configured to be operated by a global shutter method.

5. A mobile unit comprising:
   a first sensor;
   a second sensor;
   an arithmetic circuit; and
   a window portion,
   wherein the first sensor is configured to output a first signal to the arithmetic circuit,
   wherein the second sensor is configured to output a second signal to the arithmetic circuit,
   wherein the arithmetic circuit is configured to output a third signal to the window portion in accordance with the first signal and the second signal,
   wherein the first signal comprises data on a position of eyes of a driver,
   wherein the second signal comprises data on a region that is to be irradiated with a beam by an oncoming car,
   wherein the third signal comprises data on a light transmittance of the window portion, and
   wherein the light transmittance of the window portion is configured to be decreased on the basis of the third signal.

6. The mobile unit according to claim 5,
   wherein the first sensor is positioned inside the mobile unit, and
   wherein the second sensor is positioned outside the mobile unit.

7. The mobile unit according to claim 5,
   wherein a dynamic range of the second sensor is higher than a dynamic range of the first sensor, and
   wherein a frame frequency of the second sensor is higher than a frame frequency of the first sensor.

8. The mobile unit according to claim 5,
   wherein the first sensor comprises a first imaging element,
   wherein the second sensor comprises a second imaging element,
   wherein the first imaging element is configured to be operated by a rolling shutter method, and
   wherein the second imaging element is configured to be operated by a global shutter method.

* * * * *